United States Patent
Motoya et al.

(10) Patent No.: US 8,541,805 B2
(45) Date of Patent: Sep. 24, 2013

(54) MOUNTING SUBSTRATE AND MANUFACTURING METHOD THEREOF, LIGHT-EMITTING MODULE AND ILLUMINATION DEVICE

(75) Inventors: Atsushi Motoya, Shiga (JP); Kazuyuki Okano, Nara (JP); Minako Akai, Kyoto (JP); Yurika Goto, Aichi (JP); Naoki Tagami, Osaka (JP); Makoto Horiuchi, Nara (JP); Toshio Mori, Kyoto (JP); Takaari Uemoto, Osaka (JP); Masahiro Miki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/582,330

(22) PCT Filed: Apr. 27, 2011

(86) PCT No.: PCT/JP2011/002492
§ 371 (c)(1),
(2), (4) Date: Aug. 31, 2012

(87) PCT Pub. No.: WO2011/142097
PCT Pub. Date: Nov. 17, 2011

(65) Prior Publication Data
US 2012/0320601 A1    Dec. 20, 2012

(30) Foreign Application Priority Data

May 13, 2010 (JP) ................. 2010-111519
May 18, 2010 (JP) ................. 2010-114808
May 18, 2010 (JP) ................. 2010-114809
May 18, 2010 (JP) ................. 2010-114810

(51) Int. Cl.
*H01L 33/00*    (2010.01)

(52) U.S. Cl.
USPC ............................................... 257/98; 438/26

(58) Field of Classification Search
USPC ............................................... 257/98; 438/26
See application file for complete search history.

(56) References Cited

U.S. PATENT DOCUMENTS 8,115,228 B2  2/2012  Peeters et al.
8,173,043 B2  5/2012  Iwao et al.
(Continued)

FOREIGN PATENT DOCUMENTS

EP  1947378  7/2008
EP  2182783  5/2010
(Continued)

OTHER PUBLICATIONS

U.S. Appl. No. 13/502,662 to Tsugihiro Matsuda et al., filed Apr. 18, 2012.
(Continued)

*Primary Examiner* — Shaun Campbell
(74) *Attorney, Agent, or Firm* — Greenblum & Bernstein, P.L.C.

(57) ABSTRACT

An object of the present invention is to provide a mounting substrate, a manufacturing method, a light-emitting module and an illumination device that can sufficiently improve the luminous efficiency of an LED lamp. A mounting substrate according to the present invention includes a substrate and a reflective film that is formed on a front surface of the substrate and has a front surface on which LED chips are to be mounted, and the reflective film is made of metal oxide microparticles and a glass frit, and reflects light from the LED chips.

23 Claims, 36 Drawing Sheets

(56) References Cited

U.S. PATENT DOCUMENTS

| | | |
|---|---|---|
| 2006/0283546 A1* | 12/2006 | Tremel et al. ............... 156/291 |
| 2006/0284556 A1 | 12/2006 | Tremel et al. |
| 2007/0139936 A1 | 6/2007 | Schneider et al. |
| 2008/0121911 A1 | 5/2008 | Andrews et al. |
| 2009/0314989 A1 | 12/2009 | Iwao et al. |
| 2010/0059784 A1 | 3/2010 | Peeters et al. |
| 2010/0103680 A1 | 4/2010 | Oyaizu et al. |
| 2010/0258830 A1 | 10/2010 | Ide et al. |
| 2011/0198539 A1 | 8/2011 | Iwao et al. |

FOREIGN PATENT DOCUMENTS

| | | |
|---|---|---|
| JP | 10-032351 | 2/1998 |
| JP | 3-238326 | 12/2001 |
| JP | 2004-095941 | 3/2004 |
| JP | 2005-191135 | 7/2005 |
| JP | 3-807812 | 8/2006 |
| JP | 2008-166740 | 7/2008 |
| JP | 2009-206200 | 9/2009 |
| JP | 2010-135749 | 6/2010 |
| WO | 2006/120827 | 11/2006 |
| WO | 2008/075248 | 6/2008 |
| WO | 2009/066430 | 5/2009 |

OTHER PUBLICATIONS

International Search Report in PCT/JP2011/002492, dated Jul. 26, 2011.

Extended European Search Report from European Patent Office (EPO) in European Patent Application No. 11780357.7, dated Apr. 10, 2013.

\* cited by examiner

FIG. 27C
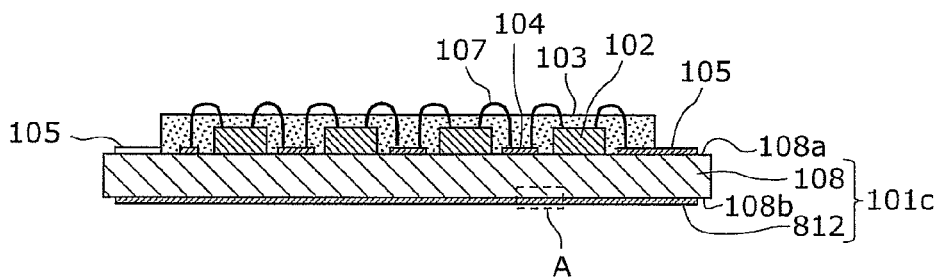
FIG. 28
| Glass frit volume concentration (vol%) | Reflective film state |
|---|---|
| 10 | × |
| 20 | ○ |
| 30 | ○ |
| 40 | ○ |
| 50 | ○ |
| 60 | ○ |
| 70 | ○ |
FIG. 29A
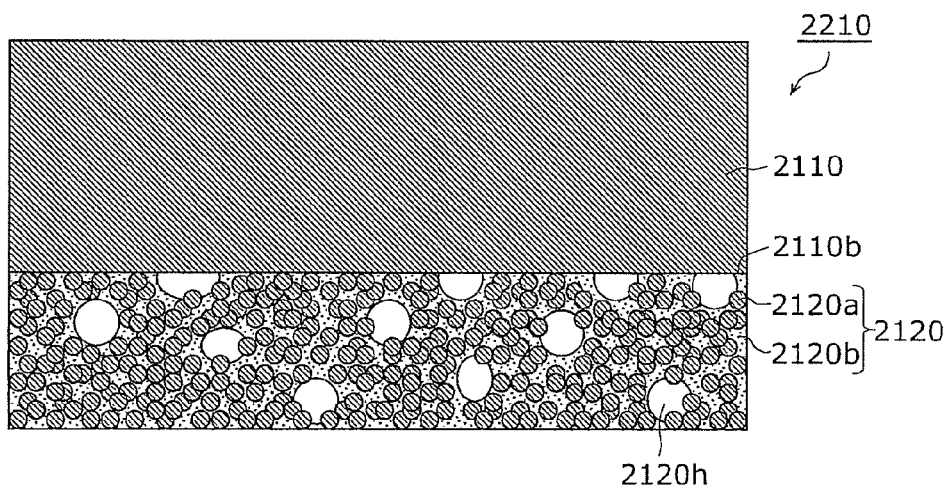

MOUNTING SUBSTRATE AND MANUFACTURING METHOD THEREOF, LIGHT-EMITTING MODULE AND ILLUMINATION DEVICE

TECHNICAL FIELD

The present invention relates to a mounting substrate on which a semiconductor light-emitting element is to be mounted and a method of manufacturing the mounting substrate, a light-emitting module using the semiconductor light-emitting element, and an illumination device provided with the light-emitting module.

BACKGROUND ART

In recent years, LED modules (light-emitting modules) formed by mounting a semiconductor light-emitting element such as an LED (light-emitting Diode) chip on a mounting substrate have been used for various illumination devices (lamps). Such LED lamps using the LED module require a configuration for efficiently extracting light from the semiconductor light-emitting element to the outside of the lamps. For example, PTLs 1 and 2 describe such techniques for improving the light extraction efficiency (luminous efficiency).

PTL 1 adopts a configuration in which no light-shielding object such as an electrode and a bonding wire exists in a light-emitting direction of light from the semiconductor light-emitting element.

PTL 2 adopts a configuration in which light from a semiconductor light-emitting element is transmitted into a mounting substrate without being reflected by a surface of the mounting substrate as little as possible.

PTL 3 discloses a light-emitting element mounting substrate in which an aluminum plate is bonded to a back surface of a ceramic substrate on the opposite side to an LED chip mounting surface. The light-emitting element mounting substrate thus configured can reflect light from an LED chip, which transmits through the ceramic substrate, on the aluminum plate bonded to the back surface of the ceramic substrate.

CITATION LIST

Patent Literature

[PTL 1] Japanese Patent Publication No. 3238326
[PTL 2] Japanese Patent Publication No. 3807812
[PTL 3] Unexamined Patent Publication No. 2009-206200

SUMMARY OF INVENTION

Technical Problem

A part of the light from the semiconductor light-emitting element is emitted downward, that is, toward the mounting substrate. However, the configurations described in PTLs 1 and 2 cannot efficiently extract the downward light from the semiconductor light-emitting element, resulting in that it is difficult to sufficiently improve the luminous efficiency of the LED lamp.

According to a possible method for efficiently extracting the downward light from the semiconductor light-emitting element to the outside of the lamp, the mounting substrate is made of ceramic having a small particle size to improve the reflectivity of the mounting substrate. In this case, however, the thermal conductivity of the mounting substrate is low due to the small particle size of ceramic. As a result, heat of the semiconductor light-emitting element cannot be discharged to the outside of the element and thus, the temperature of the semiconductor light-emitting element rises to shorten its life. Moreover, an optical output of the element decreases, thereby deteriorating the luminous efficiency of the LED lamp.

In the LED module, a plurality of semiconductor light-emitting elements are mounted on the mounting substrate. When the thermal conductivity of the mounting substrate is low, the temperature of the semiconductor light-emitting element mounted in the vicinity of the center of the mounting substrate is easy to rise and thus, its optical output is easy to decrease. Accordingly, the plurality of semiconductor light-emitting elements on the same mounting substrate differ from one another in their optical outputs, causing color irregularity in the LED lamp.

According to another possible method for efficiently extracting the downward light from the semiconductor light-emitting element to the outside of the lamp, a metal substrate such as an Ag (silver) substrate having a high thermal conductivity and a high reflectivity is used as the mounting substrate. However, the metal substrate is easy to discolor with time and its reflectivity tends to lower. Further, the metal substrate is warped with time to make a contact area with the semiconductor light-emitting element smaller and lower the heat radiation efficiency. Therefore, the metal substrate is unsuited for use in the LED module basically used for a long time.

In the light-emitting element mounting substrate disclosed in PTL 3, the aluminum plate is placed on the ceramic substrate, and they are heated to a first temperature (660° C. to 680° C.) that is equal to or higher than the melting point of aluminum and then, are cooled to a predetermined temperature, and after that, are heated to a second temperature (600° C. to 650° C.) that is lower than the first temperature, thereby bonding the aluminum plate to the ceramic substrate.

However, since the aluminum plate bonded to the ceramic substrate has a thickness of about 0.2 mm, the thickness of the whole light-emitting element mounting substrate becomes large as well as its entire weight also increases.

To put the ceramic substrate and the aluminum plate into a predetermined bonding state, it is needed to heat them to the temperature that is equal to or higher than the melting point of aluminum, and then, cool them once and then, heat them to the second temperature that is lower than the first temperature, and to correctly control these temperatures. For this reason, disadvantageously, it is difficult to efficiently manufacture the light-emitting element mounting substrate without any variation.

Further, the aluminum plate discolors with time due to natural oxidation and the like, and its reflectivity tends to lower. In the case of using the aluminum plate, the ceramic substrate may be warped by a bi-metal effect caused by a difference between the ceramic substrate in the aluminum plate in thermal expansion coefficient.

Moreover, since the aluminum plate is relatively expensive, use of the aluminum plate disadvantageously increases costs for the light-emitting element mounting substrate or the whole of the LED module.

Therefore, according to the art disclosed in PTL 3, various other problems occur in exchange for the improvement of the luminous efficiency of the LED lamp.

Thus, in consideration with these problems, an object of the present invention is to provide a mounting substrate, a manufacturing method thereof, a light-emitting module and an illumination device that can sufficiently improve the luminous efficiency of the LED lamp.

Solution to Problem

To attain the above-mentioned object, a mounting substrate from one aspect of the present invention is a mounting substrate on which a semiconductor light-emitting element is to be mounted, the mounting substrate comprising a substrate, and a first reflective film formed on a front surface or a back surface of the substrate, wherein the first reflective film is formed of metal oxide microparticles that reflects light from the semiconductor light-emitting element and a glass frit, and reflects the light from the semiconductor light-emitting element. Here, the metal oxide microparticles may be made of titanium oxide, aluminum oxide, zinc oxide, zirconium oxide, or magnesium oxide.

From this aspect, since the reflective film is formed on the front surface or the back surface of the substrate on which the semiconductor light-emitting element is to be mounted, the light emitted from the semiconductor light-emitting element toward the mounting substrate is reflected by the reflective film and is extracted to the outside of the lamp. Accordingly, the luminous efficiency of the LED lamp can be sufficiently improved.

Since the film formed of the metal oxide microparticles and the glass frit is used as the reflective film, it can be prevented that the reflective film discolors with time as in the case of using the reflective film made of metal or resin, thereby preventing lowering of its reflectivity. It can be also prevented that the reflective film is warped with time and is peeled from the substrate. Further, costs and weight of the LED lamp can be reduced.

The substrate does not need to have both a function of reflecting the light from the semiconductor light-emitting element and a function of releasing heat of the semiconductor light-emitting element, and needs to have only the function of releasing the heat of the semiconductor light-emitting element. Accordingly, since the substrate having a low reflectivity and a high heat radiating property can be used to improve its thermal conductivity, it is possible to prevent an increase in the temperature of the semiconductor light-emitting element, in turn, a decrease in the optical output of the element itself. As a result, the luminous efficiency of the LED lamp can be improved.

Further, since the thermal conductivity of the substrate can be improved, the heat of the semiconductor light-emitting element can be uniformly released to the entire substrate, thereby preventing a difference between the plurality of semiconductor light-emitting elements on the same substrate in optical output. Accordingly, color irregularity of the LED lamp can be prevented.

The first reflective film may be formed on the front surface of the substrate, and the semiconductor light-emitting element may be to be mounted on the front surface of the first reflective film. The substrate may be a resin substrate, a glass substrate, or a ceramic substrate.

From this aspect, since the reflective film is formed on the front surface of the substrate, on which the semiconductor light-emitting element is to be mounted, the light emitted from the semiconductor light-emitting element toward the mounting substrate is reflected by the reflective film and is extracted to the outside of the lamp. Accordingly, the luminous efficiency of the LED lamp can be sufficiently improved.

The thickness of the reflective film may be in the range of 10 μm to 100 μm.

From this aspect, the reflective film capable of reflecting the light from the semiconductor light-emitting element while improving the heat radiating property of the reflective film and preventing peeling of the reflective film from the substrate can be realized.

The reflective film may be formed in a region of the front surface of the substrate, except for a region where an electrode is formed.

From this aspect, since the electrode can be formed directly on the substrate, adhesiveness of the electrode to the substrate can be ensured.

The reflective film may be formed on the entire front surface of the substrate. The reflective film may be formed so as to coat the electrode formation region of the front surface of the substrate.

From this aspect, all of the light emitted toward the mounting substrate is reflected by the reflective film and is extracted to the outside of the lamp.

The substrate may include the front surface on which the semiconductor light-emitting element is to be mounted and transmit the light from the semiconductor light-emitting element, and the first reflective film may be formed on the back surface of the substrate and reflect the light, which is emitted from the semiconductor light-emitting element and is transmitted through the substrate, toward the front surface of the substrate. The substrate may be a resin substrate, a glass substrate, or a ceramic substrate From this aspect, since the substrate is translucent to the light from the semiconductor light-emitting element, the light emitted from the semiconductor light-emitting element toward the substrate is reflected by the reflective film and is extracted to the outside of the lamp. Accordingly, the luminous efficiency of the LED lamp can be further improved.

The first reflective film may have a thickness in a range of 10 μm to 100 μm.

From this aspect, the reflective film capable of reflecting light from the semiconductor light-emitting element while improving its heat radiating property and preventing peeling of the reflective film from the substrate can be realized.

The substrate may have a transmittance for light from the semiconductor light-emitting element of 1% or higher.

From this aspect, the light emitted from the semiconductor light-emitting element toward the substrate can be efficiently guided to the reflective film.

The mounting substrate may further include a second reflective film formed on an end surface of the substrate, the second reflective film reflecting the light, which is emitted from the semiconductor light-emitting element and is transmitted through the substrate, toward the front surface of the substrate, and the second reflective film may be formed of the metal oxide microparticles and the glass frit.

From this aspect, the light that is guided in the substrate and emitted from the end surface of the substrate is also reflected by the reflective film and is extracted to the outside of the lamp.

The substrate may include an inclined surface inclined so as to extend from the back surface toward the front surface, on the end surface.

From this aspect, light emitted from the end surface of the substrate is reflected toward the globe more easily, and is efficiently extracted to the outside of the lamp.

The substrate may have irregularities on the front surface except for regions where the semiconductor light-emitting element is formed and where the electrode is formed.

From this aspect, the light that is reflected by the reflective film and travels toward the front surface of the substrate through the substrate can be prevented from being reflected by the front surface of the substrate again.

The first reflective film may be formed on the entire back surface of the substrate.

From this aspect, all of light emitted from the back surface of the substrate is reflected by the reflective film and is extracted to the outside of the lamp.

The reflective film may be formed of a multilayer film formed on the back surface of the substrate, the multilayer film may include a first film and a second film, the first film reflecting light, which is emitted from the semiconductor light-emitting element and is transmitted through the substrate, toward the front surface of the substrate, and the second film being formed on the first film on the opposite side of to the substrate, the first film may include the metal oxide microparticles and the glass frit, the second film may include a glass frit, and a volume concentration of the glass frit in the second film may be larger than a volume concentration of the glass frit in the first film.

The second film may include metal oxide microparticles reflecting light from the semiconductor light-emitting element, and the volume concentration of the glass frit in the second film may be 20% or higher.

From this aspect, since the second film includes the metal oxide microparticles, the second film can be configured as the reflective film, and the light transmitted through the first film can be reflected by the second film toward the substrate. Further, by setting the volume concentration of the glass frit in the second film to 20% or higher, the number of holes generated in the second film can be reduced. Accordingly, even when the glass frit in the second film is damaged by an acid solution or the like at plating, the metal oxide microparticles in the second film are not peeled. Further, since the number of holes generated in the second reflective film can be reduced, adhesiveness between the first film and the second film can be improved.

The volume concentration of the glass frit in the first film may be lower than 20%.

From this aspect, the reflectivity of the first film for visible light can be set to 90% or higher to realize a highly reflective film equivalent to a reflective film made of elemental metals.

The second film may be formed of only the glass frit.

From this aspect, the first film can be protected by the second film. Since the second film is formed of only the glass frit and does not include the metal oxide microparticles, even when plating is made, peeling of the metal oxide microparticles never occurs.

The multilayer film may include a third film formed of only the glass frit, and the third film may be formed between the substrate and the first film.

From this aspect, the third film formed of only the glass frit can improve the adhesiveness between the substrate and the first film.

The multilayer film may include a third film formed of only the glass frit, and the third film may be formed on the second film on the opposite side to the first film.

From this aspect, the second film can be protected by the third film. Further, since the third film is formed of only the glass frit and does not include the metal oxide microparticles, even when plating is made, peeling of the metal oxide microparticles never occurs.

The volume concentration of the glass frit in the first reflective film may be 20% or higher.

From this aspect, since the reflective film can be formed of the glass frit and the metal oxide microparticles, a thin reflective film can be obtained. Accordingly, the mounting substrate having a high thermal conductivity and an excellent heat radiating property can be configured. Further, since the volume concentration of the glass frit in the reflective film is 20% or higher, the number of holes generated in the reflective film can be reduced. As a result, even when the glass frit is damaged by the acid solution or the like at plating, peeling of the metal oxide microparticles in the reflective film never occurs. Furthermore, since the number of holes generated in the reflective film can be reduced, adhesiveness between the reflective film and the substrate can be improved.

The volume concentration of the glass frit in the reflective film may be 60% or lower.

From this aspect, the reflectivity of the reflective film for the visible light can be set to 90% or higher to realize a highly reflective film equivalent to the reflective film made of elemental metals.

The thickness of the reflective film may be 20 µm or larger.

From this aspect, the reflectivity of the reflective film for visible light can be set to 90% or higher to realize a highly reflective film equivalent to the reflective film made of elemental metals.

The principal surface of the substrate may includes a plated electrode.

From this aspect, even when the electrode on the substrate is plated and the glass frit in the reflective film is corroded by the acid solution at plating, peeling of the metal oxide microparticles never occurs.

The glass frit may be made of $SiO_2$—$B_2O_3$—$R_2O$ (where, $R_2O$ is $Li_2O$, $Na_2O$, or $K_2O$).

From this aspect, the glass frit having an excellent acid resistance can be configured.

The substrate may be a ceramic substrate.

From this aspect, the mounting substrate having a high thermal conductivity and an excellent heat radiating property can be configured.

To attain the above-mentioned object, a mounting substrate manufacturing method from one aspect of the present invention is a manufacturing method of a mounting substrate on which a semiconductor light-emitting element is to be mounted, the manufacturing method including a step of forming a reflective film on a front surface or a back surface of the substrate, wherein the reflective film is formed of metal oxide microparticles and a glass frit, and reflects light from the semiconductor light-emitting element.

From this aspect, the mounting substrate manufacturing method capable of sufficiently improving the luminous efficiency of the LED lamp can be realized.

Here, the semiconductor light-emitting element may be to be mounted on a front surface of the reflective film, and in the step of forming the reflective film, the reflective film may be formed on the front surface of the substrate.

From this aspect, the mounting substrate manufacturing method capable of sufficiently improving the luminous efficiency of the LED lamp can be realized.

The substrate may include the front surface on which the semiconductor light-emitting element is to be mounted, and transmit light from the semiconductor light-emitting element, and in the step of forming the reflective film, the reflective film reflecting light, which is emitted from the semiconductor light-emitting element and is transmitted through the substrate, toward the surface of the substrate may be formed on the back surface of the substrate.

From this aspect, the mounting substrate manufacturing method capable of preventing color irregularity of the LED lamp and improving the luminous efficiency can be realized.

The mounting substrate manufacturing method may further include a step of forming on an electrode on the front surface of the substrate, the step of forming the reflective film may include steps of forming a first film including the metal oxide microparticles and the glass frit by applying a paste obtained by kneading materials containing the metal oxide microparticles and glass powders to the back surface of the substrate and then, heating the paste, and forming a second film including the glass frit by applying a paste obtained by kneading materials containing the glass powders to a surface of the first film on the opposite side to the substrate and then, heating the paste, and a volume concentration of the glass frit in the second film may be larger than a volume concentration of the glass frit in the first film.

From this aspect, a multilayer reflective film formed of the first film as the reflective film and the second film protecting the first film can be formed.

The mounting substrate manufacturing method may further comprise a step of forming an electrode on the front surface of the substrate, in the step of forming the reflective film, the reflective film including the metal oxide microparticles and the glass frit may be formed by applying a paste obtained by kneading materials containing the metal oxide microparticles and glass powders to the back surface of the substrate and then, heating the paste, and the volume concentration of the glass frit in the reflective film may be 20% or higher.

From this aspect, since the thin reflective film formed of the metal oxide microparticles and the glass frit can be easily manufactured, the mounting substrate having a high thermal conductivity and an excellent heat radiating property can be obtained. Further, since the volume concentration of the glass frit in the reflective film is 20% or higher, the number of holes generated in the reflective film can be reduced. As a result, even when the glass frit is damaged by the acid solution or the like at plating, peeling of the metal oxide microparticles in the reflective film never occurs. Furthermore, the number of holes generated in the reflective film can be reduced, thereby improving adhesiveness between the reflective film and the substrate.

The mounting substrate manufacturing method may further include a plating step of plating the electrode.

From this aspect, even when the electrode on the substrate is plated and the glass frit in the reflective film is corroded by the acid solution at plating, peeling of the metal oxide microparticles never occurs.

To attain the above-mentioned object, a light-emitting module from one aspect of the present invention includes a mounting substrate having a substrate and a reflective film formed on a front surface or a back surface of the substrate, and a semiconductor light-emitting element mounted on the mounting substrate, and the reflective film is formed of metal oxide microparticles and a glass frit, and reflects light from the semiconductor light-emitting element.

From this aspect, the light-emitting module capable of sufficiently improving the luminous efficiency of the LED lamp can be realized.

The reflective film may be formed on the front surface of the substrate, and the semiconductor light-emitting element may be formed on a front surface of the reflective film.

From this aspect, the light-emitting module capable of sufficiently improving the luminous efficiency of the LED lamp can be realized.

The light-emitting module may include a bonding member provided between the reflective film and the semiconductor light-emitting element, the bonding member bonding the reflective film to the semiconductor light-emitting element, and the bonding member may transmit light from the semiconductor light-emitting element.

From this aspect, light emitted from the semiconductor light-emitting element toward the mounting substrate can be guided to the reflective film as much as possible.

The light-emitting module may further include a sealing member formed on the front surface of the reflective film, the sealing member sealing the semiconductor light-emitting element, and the sealing member and the reflective film may have the substantially same refraction index.

From this aspect, the light emitted from the semiconductor light-emitting element toward the mounting substrate can be prevented from being reflected by an interface between the sealing member and the reflective film.

The substrate may have the front surface on which the semiconductor light-emitting element is to be mounted, and transmit the light from the semiconductor light-emitting element, and the reflective film may be formed on the back surface of the substrate, and reflect the light, which is emitted from the semiconductor light-emitting element and is transmitted through the substrate, toward the front surface of the substrate.

From this aspect, the light-emitting module capable of preventing color irregularity of the LED lamp as well as improving the luminous efficiency can be realized.

The light-emitting module may further include a sealing member, the sealing member sealing the semiconductor light-emitting element, and the sealing member and the substrate may have the substantially same refraction index.

From this aspect, the light that is reflected by the reflective film and travels toward the front surface of the substrate through the substrate can be prevented from being reflected by an interface between the substrate and the sealing member due to a difference between the substrate and the sealing member in refraction index.

The light-emitting module may further include an electrode formed on the front surface of the substrate, the electrode being electrically connected to the semiconductor light-emitting element, and the electrode may be formed of a transparent conductive film.

From this aspect, the light from the semiconductor light-emitting element toward the substrate can be prevented from being reflected by the front surface of the electrode.

The reflective film may be formed of a multilayer film formed on the back surface of the substrate, the multilayer film may include a first film reflecting light, which is emitted from the semiconductor light-emitting element and is transmitted through the substrate, toward the front surface of the substrate, and a second film formed on the opposite side of the first film to the substrate, the first film may include the metal oxide microparticles and the glass frit, the second film may include the glass frit, and a volume concentration of the glass frit in the second film may be larger than a volume concentration of the glass frit in the first film.

From this aspect, since the first film as the reflective film can be protected by the second film, peeling of the metal oxide microparticles in the first film can be prevented.

The volume concentration of the glass frit in the reflective film may be 20% or higher.

From this aspect, the number of holes generated in the reflective film can be reduced, thereby preventing peeling of the metal oxide microparticles in the reflective film.

An illumination device from one aspect of the present invention includes the light-emitting module.

From this aspect, the LED lamp capable of sufficiently improving the luminous efficiency can be realized.

Effects of the Invention

According to one aspect of the present invention, the mounting substrate, the manufacturing method, the light-emitting module and the illumination device that can sufficiently improve the luminous efficiency of the LED lamp can be realized.

Further, the mounting substrate, the manufacturing method, the light-emitting module and the illumination device that can prevent color irregularity of the LED lamp, and improve the luminous efficiency of the LED lamp can be realized.

The mounting substrate according to the present invention can prevent peeling of the metal oxide microparticles in the first film as the reflective film. Accordingly, the light-emitting module and the illumination device that have a high light extraction efficiency can be provided.

The mounting substrate according to the present invention can prevent peeling of the metal oxide microparticles in the reflective film. Further, adhesiveness between the reflective film and the substrate can be improved. Accordingly, the light-emitting module and the illumination device that have a high light extraction efficiency can be provided.

BRIEF DESCRIPTION OF DRAWINGS

FIG. 27C is a sectional view of the LED module in accordance with Embodiment 4.

FIG. 28 is table showing relationship between volume concentration of a glass frit in the reflective film and peeling of light reflecting microparticles.

FIG. 29A is a partial enlarged sectional view of a mounting substrate in accordance with Comparative example before plating.

DESCRIPTION OF EMBODIMENTS

A mounting substrate, a manufacturing method thereof, a light-emitting module and an illumination device in accordance with embodiments of the present invention will be described below. Figures are schematic views and do not necessarily drawn with accuracy.

Embodiment 1

First, an overall configuration of an LED lamp 10 in accordance with Embodiment 1 of the present invention will be described.

Figure 1:
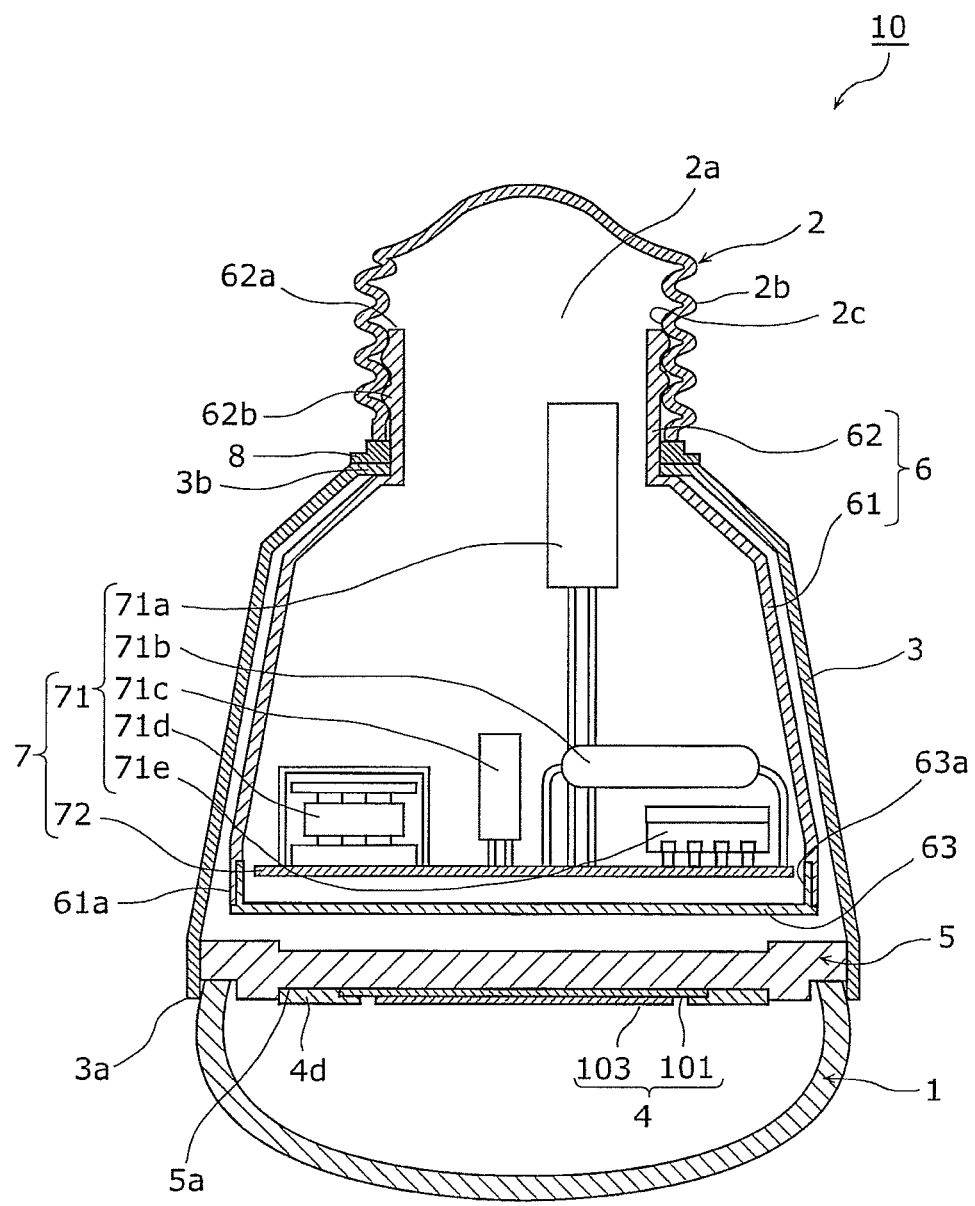
FIG. 1 is a sectional view of an LED lamp in accordance with Embodiment 1 of the present invention.
Figure 2:
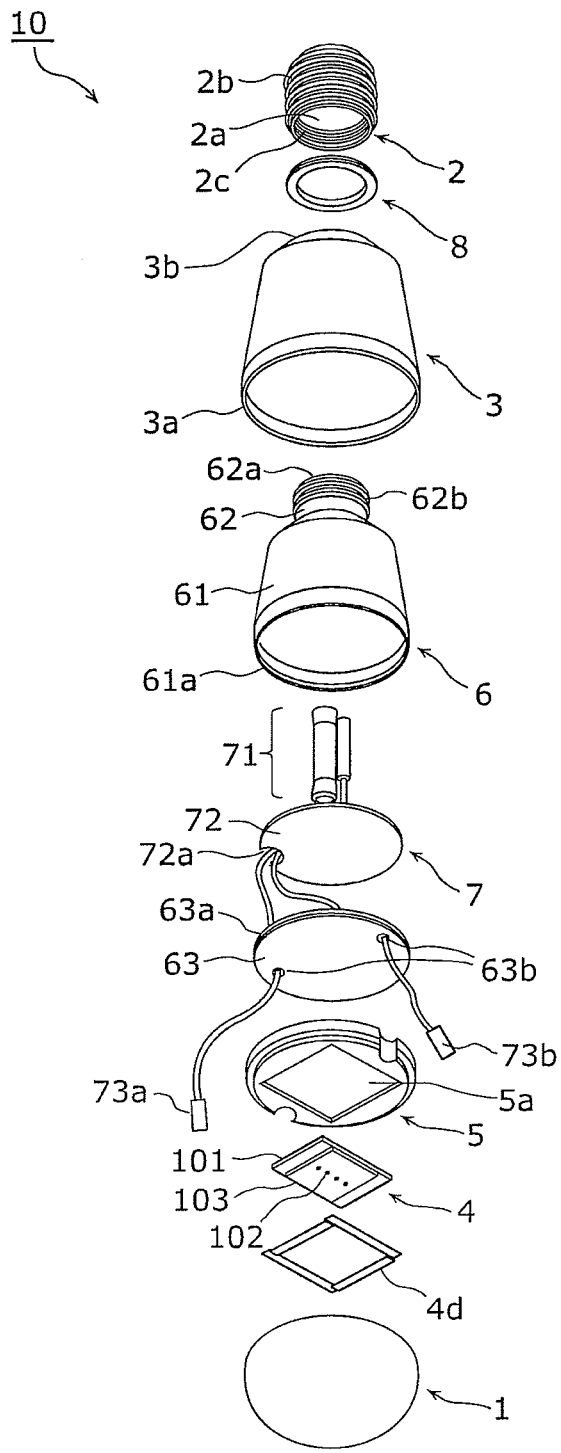
FIG. 2 is an exploded perspective view of the LED lamp in accordance with Embodiment 1.

FIG. 1 is a sectional view of the LED lamp 10 in accordance with Embodiment 1. FIG. 2 is an exploded perspective view of the LED lamp 10 in accordance with Embodiment 1.

The LED lamp 10 is an example of an illumination device. The LED lamp 10 is a bulb-type lamp, and includes a globe 1, a base 2, a heat sink 3, an LED module 4, a light source attaching member 5, a resin case 6, a power source circuit 7 and an insulating ring 8.

The globe 1, the base 2, and the heat sink 3 arranged between the globe 1 and the base 2 configure a lamp envelope.

The globe 1 is a translucent cover that radiates light emitted from the LED module 4 to the outside of the LED lamp 10. An opened end of the globe 1 is in contact with an upper surface of the light source attaching member 5. The globe 1 is fixedly attached to the heat sink 3 with a silicon adhesive having a heat-resisting property. The LED module 4 is covered with the globe 1.

The base 2 is a power receiving unit for receiving AC power at two contacts: a top contact and a side contact. The power received by the base 2 is inputted to a power input part of a circuit substrate 72 of the power source circuit 7 via a lead wire (not shown). The base 2 is a metal cylindrical body having a closed end, and has a hollow part 2a therein.

The base 2 is a threaded base such as E26 or E17. A threaded part 2b to be threadedly engaged with a socket of an illumination fixture is formed on an outer surface of the base 2. A threaded part 2c to be threadedly engaged with a second case 62 of the resin case 6 is formed on an inner circumferential surface of the base 2.

The heat sink 3 is a housing formed of a metal cylindrical heat radiating body having two openings in the vertical direction: a first opening 3a configuring an opening on the side of the globe 1 and a second opening 3b configuring an opening on the side of the base 2. A diameter of the first opening 3a is larger than a diameter of the second opening 3b, and the heat sink 3 is shaped like a circular truncated cone as a whole. The heat sink 3 is made of an aluminum alloy material and has an anodized surface subjected to improve the thermal emissivity.

The light source attaching member 5 is a holder (module plate) formed of a metal substrate on which the LED module 4 is to be mounted, and is shaped into a disc by aluminum die-casting. The light source attaching member 5 is a heat radiating body that transmits heat generated from the LED module 4 to the heat sink 3. The light source attaching member 5 is attached to the heat sink 3 on the side of the first opening 3a, and a side section of the light source attaching member 5 is in contact with an inner surface of the heat sink 3 above the first opening 3a. That is, the light source attaching member 5 is fitted into the heat sink 3 on the side of the first opening 3a.

The light source attaching member 5 is provided with a recess 5a that disposes the LED module 4 therein, and the recess 5a is formed to have the same rectangular shape as a mounting substrate 101 of the LED module 4. The LED module 4 disposed in the recess 5a is held by a fastener 4d.

The resin case 6 is an insulating case that stores the power source circuit 7 therein, and consists of a cylindrical first case 61 having the almost same shape as the heat sink 3 and the cylindrical second case 62 having the almost same shape as the base 2.

The first case 61 has an opening 61a on the side of the LED module 4 (on the opposite side to the second case 62), and is arranged in the heat sink 3 with a predetermined gap from the heat sink 3. The second case 62 has an opening 62a on the side of the base 2 (on the opposite side to the first case 61). An outer circumferential surface of the second case 62 is in contact with an inner circumferential surface of the base 2. A threaded part 62b to be threadedly engaged with the base 2 is formed on the second case 62, and the threaded part 62b of the second case 62 is in contact with the base 2.

A resin cap 63 is attached to the opening 61a of the first case 61 on the side of the light source attaching member 5. The resin case 6 on the side of the light source attaching member 5 is sealed with the resin cap 63.

The resin cap 63 is substantially disc-like, and has an annular protrusion 63a on its outer edge on the side of its inner surface. A plurality of locking claws (not shown) for locking the circuit substrate 72 are formed on an inner circumferential surface of the protrusion 63a. The protrusion 63a can be fitted into an end of the opening 61a of the first case 61 of the resin case 6. The resin cap 63 is provided with a through hole 63b for passing the lead wire supplying power to the LED module 4 therethrough.

The power source circuit 7 includes a circuit element group 71 constituting a circuit (lighting circuit) for causing LED chips (semiconductor light-emitting element) 102 sealed with a sealing member 103 of the LED module 4 to emit light, and the circuit substrate 72 on which each circuit element of the circuit element group 71 is to be mounted.

The circuit element group 71 is formed of a plurality of circuit elements, converts AC power received from the base 2 into DC power, and supplies the DC power to the LED chip 102 via electrodes 73a, 73b.

The circuit element group 71 includes a first capacitative element 71a as an electrolytic capacitor (vertical capacitor), a second capacitative element 71a as a ceramic capacitor (horizontal capacitor), a resistive element 71c, a voltage converting element 71d formed of a coil, and a semiconductor element 71e as an integrated circuit of an IPD (Intelligent Power Device).

The circuit substrate 72 is a disc-like print substrate, and each circuit element of the circuit element group 71 is mounted on one surface of the circuit substrate 72. The circuit substrate 72 has a notch 72a. The notch 72a is provided to install the lead wire supplying DC power to the LED module 4 from the surface on which the circuit element group 71 is mounted to a surface opposite to the circuit element mounting surface.

The insulating ring 8 ensures insulation between the base 2 and the heat sink 3 and is arranged between the base 2 and the heat sink 3. An inner circumferential surface of the insulating ring 8 is in contact with an outer circumferential surface of the second case 62 of the resin case 6. The insulating ring 8 is supported between an opened end of the base 2 and an opened end of the heat sink 3 by threadedly attaching the second case 62 of the resin case 6 to the base 2.

Next, a characteristic configuration of the LED lamp 10 in accordance with Embodiment 1 of the present invention.

Figure 3:
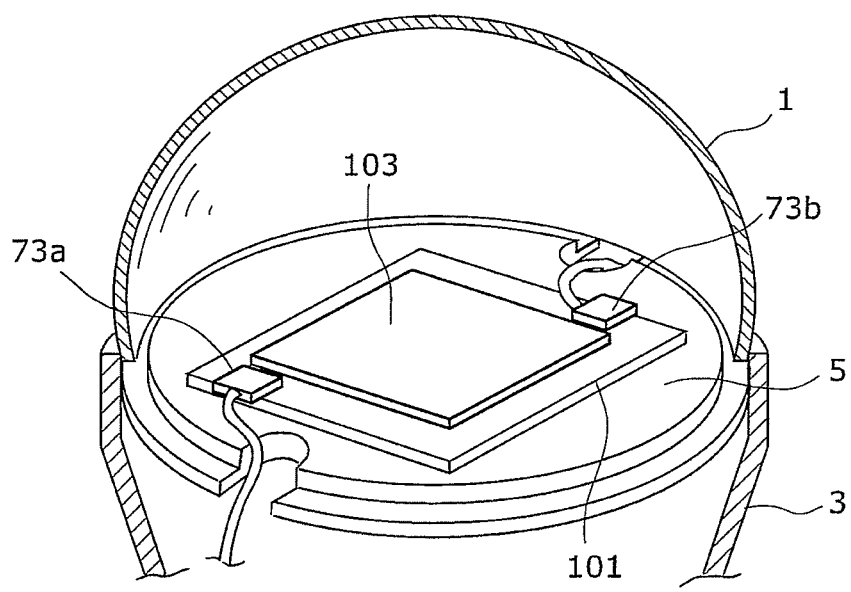
FIG. 3 is a partial cutaway perspective view of the LED lamp in accordance with Embodiment 1.
Figure 4A:
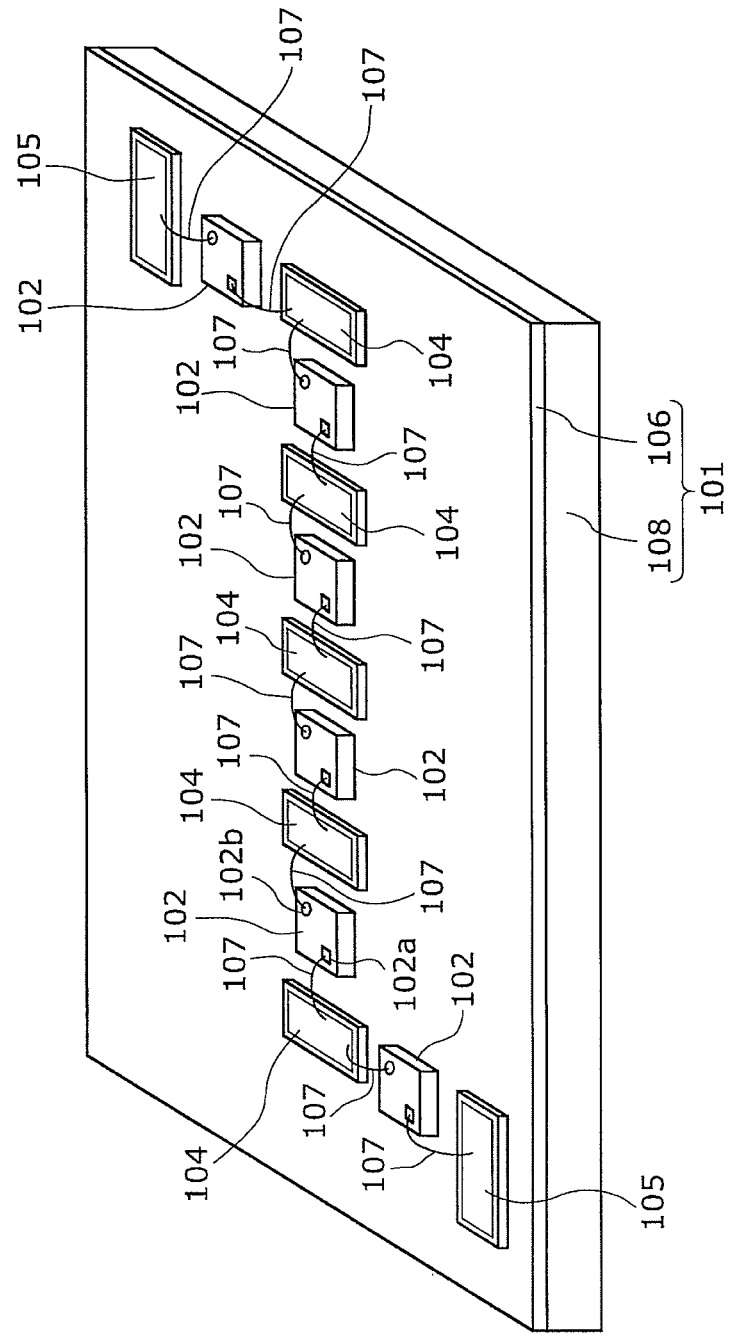
FIG. 4A is a perspective view of an LED module in accordance with Embodiment 1.
Figure 4B:
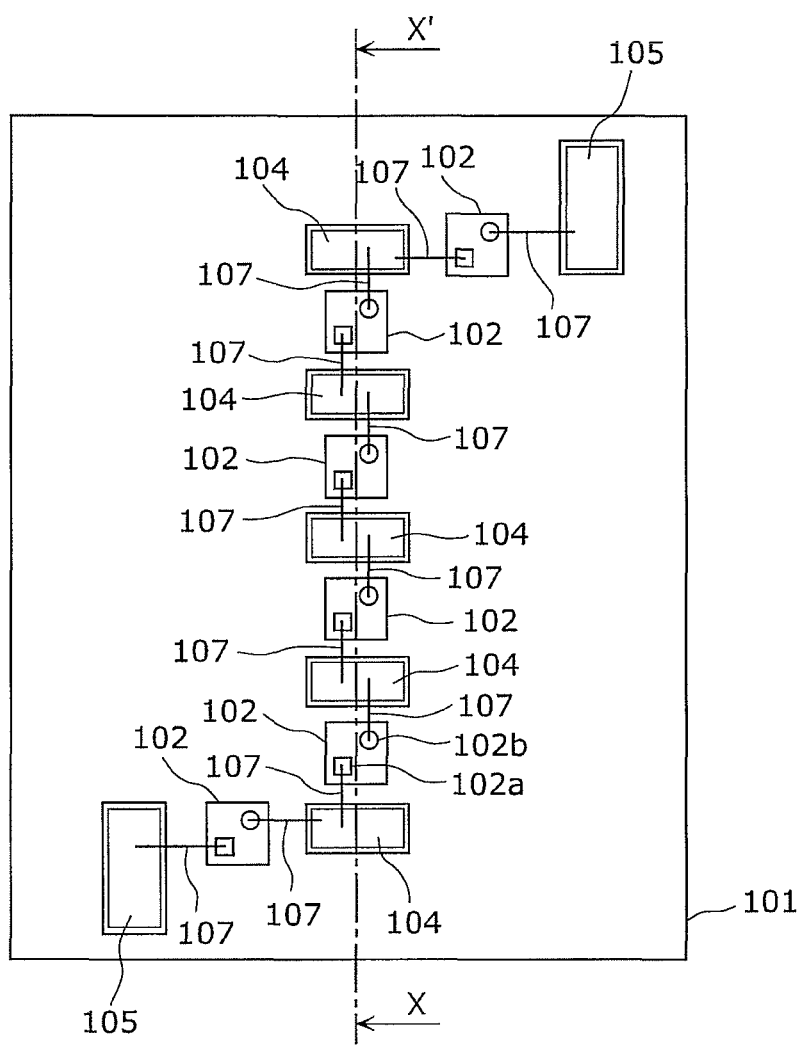
FIG. 4B is a top view of the LED module in accordance with Embodiment 1.
Figure 4C:
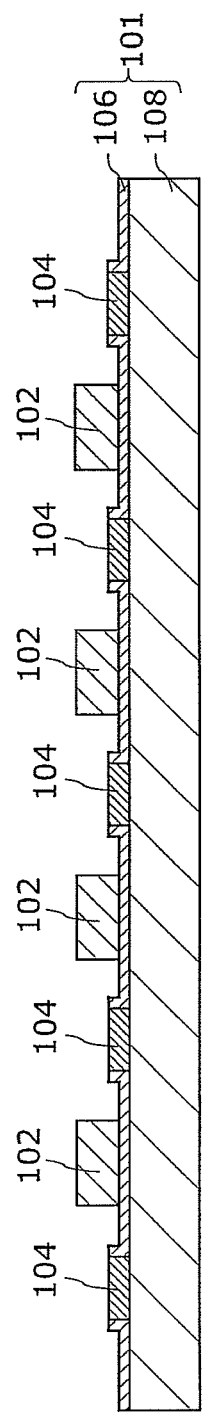
FIG. 4C is a sectional view of the LED module in accordance with Embodiment 1.

FIG. 3 is a partial cutaway perspective view of the LED lamp 10 to show the state where the LED module 4 is arranged in the light source attaching member 5. FIG. 4A is a perspective view of the LED module 4. FIG. 4B is a top view of the LED module 4. FIG. 4C is a sectional view (sectional view taken along a line X-X' in FIG. 4B) of the LED module 4. FIG. 4A to FIG. 4C are views showing a state before sealing with the sealing member 103.

The LED module 4 is a light-emitting module (luminous unit) that emits predetermined light, and is formed of the rectangular mounting substrate 101, the plurality of LED chips 102, the sealing member 103, a plurality of electrodes 104, terminals 105, and wires 107.

The two electrodes 73a, 73b connected to lead wires extending from a power output unit of the circuit substrate 72 are arranged on the LED module 4. The two electrodes 73a, 73b supply DC power to the LED module 4, thereby causing the LED chips 102 to emit light.

The mounting substrate 101 is formed of a substrate 108 and a reflective film (first reflective film) 106.

The substrate 108 is a ceramic substrate made of, for example, aluminum nitride, a resin substrate, a glass substrate, a flexible substrate, an alumina substrate or the like. Alternatively, a PCA (Printed Circuit Assembly) substrate or an LTCC (Low Temperature Co-fired Ceramics) multilayer wiring circuit substrate, which are obtained by forming a predetermined wiring pattern on any of the above-mentioned substrates, can be used as the substrate 108. The shape of the substrate 108 is not limited to a rectangle. For example, it may take various shapes such as regular polygons including a square, a regular pentagon, a regular hexagon and a regular octagon, and a cross.

The reflective film 106 is formed on a front surface as one principal surface of the substrate 108, and the LED chips 102 are mounted on the front surface. The reflective film 106 reflects light emitted from the LED chips 102 to the front surface of the substrate 108 toward the upside of the substrate 108 (in the direction away from the substrate 108) to guide the light to the globe 1. The reflective film 106 is formed on a region of the front surface of the substrate 108, except for regions where the electrodes 104 and the terminals 105 are formed.

A film formed of metal oxide microparticles, and a glass frit, which contains oxide silicon ($SiO_2$) as a main ingredient and is formed by melting glass powders for binding the metal oxide microparticles to the substrate 108, is used as the reflective film 106. The glass frit functions as an inorganic binder. Examples of the metal oxide microparticles include microparticles made of rutile-type and anatase-type titanium oxide, magnesium oxide, zirconium oxide, aluminum oxide and zinc oxide. Since the glass frit has a high transmittance for visible light and the metal oxide microparticles have a high reflectivity for visible light, the reflective film 106 can efficiently reflect light from the LED chips 102. It is noted that the microparticles refer to particles having a particle size of a few μm or smaller.

When the thickness of the reflective film 106 becomes larger than 100 μm, the heat radiating property for heat from the LED chips 102 becomes poor and the reflective film 106 tends to be peeled from the substrate 108. Accordingly, the thickness of the reflective film 106 is preferably 100 μm or smaller. For example, when the thickness of the reflective film 106 including the metal oxide microparticles of titanium oxide exceeds 100 μm, the heat radiating efficiency of the mounting substrate having this reflective film 106 becomes lower than that of the mounting substrate having no reflective film 106.

To reflect light from the LED chips 102 as much as possible, it is preferred that the reflective film 106 includes the metal oxide microparticles having a high refraction index, which has a higher reflectivity for light (visible light) from the LED chips 102 than the substrate 108.

Further, since the reflective film 106 is in contact with both the LED chips 102 and the electrodes 104, the reflective film 106 is preferably, an insulating film to prevent electrical connection between the LED chips 102 and the electrodes 104 via the reflective film 106.

Furthermore, to obtain a reflectivity for light from the LED chips 102, which is higher than the reflectivity of the substrate 108 and is almost the same as the reflectivity of a metal plate, the reflective film 106 has preferably a reflectivity of 90% or higher. Accordingly, to obtain the reflectivity of 90% or higher, it is preferred that the reflective film 106 includes the metal oxide microparticles with a volume concentration of 40% or higher, and has a thickness of 10 μm or larger.

The LED chips 102 each are a bare chip emitting monochromatic visible light, and are mounted (die-bonded) on a mounting surface (front surface) of the mounting substrate 101, specifically, the front surface of the reflective film 106, with a bonding member. Examples of the bonding member include a thermal conductive adhesive or thermal conductive sheet of silicon resin. A first electrode 102a and a second electrode 102b are provided on the front surface (light-emitting surface) of each LED chip 102 on the light-emitting side.

The LED chips 102 each are a light-emitting diode constituted, for example, by forming a GaN compound semiconductor layer on a translucent substrate to emit blue light. The LED chips 102 emit light to all directions, that is, sideways, upward and downward, and for example, emit 20% of light sideways, 60% of light upward and 20% of light downward in light amount. For example, the six LED chips 102 are mounted on the mounting substrate 101, and are serially connected to one another.

The bonding member provided between the reflective film 106 (mounting substrate 101) and the LED chips 102 to bond and fix the LED chips 102 to the mounting substrate 101 has translucency to light emitted from the LED chips 102 and transmits the light from the LED chips 102. Thereby, most of light from the LED chip 102 is guided to the reflective film 106, and most of light reflected by the reflective film 106 is guided to the globe 1. It is desired that the bonding member has a transmittance for light emitted from the LED chips 102 of 1% or larger.

It is preferred that the bonding member has a thermal conductivity of 0.1 W/mK of higher to release heat of the LED chips 102 to the outside of the LED module 4, the reflective film 106 and the substrate 108.

The sealing member (phosphor-containing resin) 103 is formed on the mounting surface of the mounting substrate 101, specifically, the front surface of the reflective film 106, and seals the LED chips 102, the wires 107 and the electrodes 104. The sealing member 103 is configured by dispersing predetermined phosphor particles converting color of light from the LED chips 102 in a translucent material such as silicone resin, and the phosphor particles convert the light emitted from the LED chips 102 into illumination light of desired color.

For example, blue LEDs that emit blue light are used as the LED chips 102, and yellow phosphor particles are used as the phosphor particles of the sealing member 103. As a result, the yellow phosphor is excited by blue light emitted from the blue LEDs to radiate yellow light, and the yellow light and the blue light from the blue LEDs are combined to radiate white light from the LED module 4.

Here, in the case where the sealing member 103 greatly differs from the reflective film 106 in refraction index, light reflected by the reflective film 106 is easily reflected by an interface between the sealing member 103 and the reflective film 106. Accordingly, it is preferred that the sealing member 103 has a substantially same refraction index as the reflective film 106. For example, it is preferred that resin that includes dispersed silicon nanoparticles having a high refraction index and has the same refraction index as the reflective film 106 is used as the sealing member 103.

Each electrode 104 is a wiring pattern formed on the front surface of the substrate 108, and is electrically connected to the LED chip 102 and the terminal 105. The electrode 104 is provided to connect the plurality of LED chips 102 to each other, and to electrically connect the LED chip 102 to the terminal 105. The electrodes 104 are made of Ag—Pt, for example.

For connection to the wire 107, the upper surface of the electrode 104 needs to be exposed on the front surface prior to sealing with the sealing member 103. Accordingly, the reflective film 106 is provided on side surfaces of the electrode 104, but is not provided on the upper surface of the electrode 104.

The terminals 105 are wiring patterns provided in an outer edge of the front surface of the substrate 108 to receive DC power from the power source circuit 7 by the LED module 4. The electrode 73a is bonded to one of the two terminals 105 and the electrode 73b is bonded to the other of the terminals 105. Thereby, the power source circuit 7 is electrically connected to the LED module 4.

Each of the wires 107 is, for example, a gold wire, to electrically connect the electrode 104 to the LED chip 102 and electrically connect the LED chip 102 to the terminal 105. The electrode 104 is connected to the LED chip 102 by bonding one end of the wire 107 to the first electrode 102a or the second electrode 102b of the LED chip 102 and bonding the other end to the electrode 104.

In the LED module 4 having the above-mentioned configuration, most of light emitted from each of the LED chips 102 is radiated toward the globe 1 so as to be away from the substrate 108, while a part of the light (for example, light from the lower surface and the side surfaces of each LED chip 102) is radiated to the mounting surface of the mounting substrate 101. The light radiated to the mounting surface of the mounting substrate 101 is reflected by the reflective film 106 toward the upside of the mounting substrate 101 (in the direction away from the mounting substrate 101) and is guided to the globe 1.

Therefore, since the light radiated to the mounting surface of the mounting substrate 101, in addition to light directly radiated to the globe 1, can be extracted from the LED module 4 by the reflective film 106, the amount of the light extracted from the LED module 4 can be increased without increasing the amount of electricity supplied to the LED chips 102.

Next, a manufacturing method of the mounting substrate 101 in accordance with Embodiment 1 of the present invention will be described.

Figure 5:
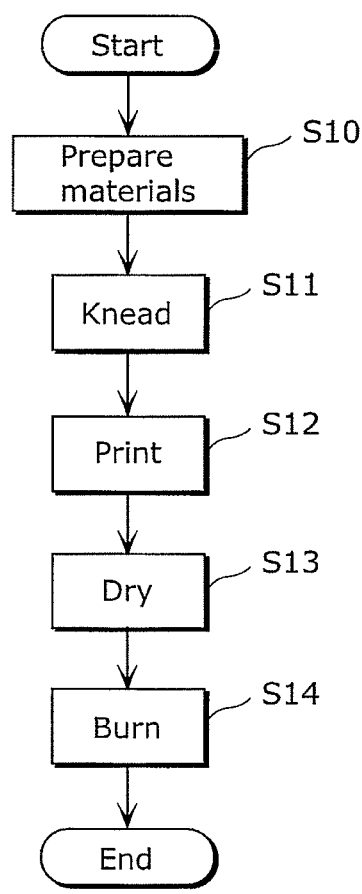
FIG. 5 is a flow chart for describing a manufacturing method of the LED module in accordance with Embodiment 1.

FIG. 5 is a flow chart for describing the manufacturing method of the LED module 4 (manufacturing method of the mounting substrate 101).

First, a wiring paste is screen-printed in a predetermined region of the front surface of the substrate 108 and then, the substrate 108 is dried and burnt to form the electrodes 104 and the terminals 105.

Next, materials for the reflective film 106 are prepared. Specifically, a solvent, a binder, glass powders, a powder material for the metal oxide microparticles and a dispersant are prepared (Step S10).

Next, the prepared materials are kneaded (mixed) into a paste, for example, by means of a three-roll kneader to create a reflective paste (Step S11).

Next, the reflective paste is screen-printed (applied) in a region of the front surface of the substrate 108, except for the regions where the electrodes 104 and the terminals 105 are formed (Step S12).

Next, the screen-printed substrate 108 is dried at temperature of 150° C. for 30 minutes to evaporate the solvent of the reflective paste (Step S13).

Next, the dried substrate 108 is burnt in a heating furnace, resulting in that the glass powders are softened, binding (bonding) between powders of the metal oxide microparticles, and between the powders and the substrate 108 is made with the glass frit, and the glass frit and the metal oxide microparticles, that is, the reflective film 106 is baked to the substrate 108 (Step S14). For example, the dried substrate 108 is heated for one hour in a belt furnace set so as to hold the substrate at the highest temperature of 700° C. for 15 minutes.

Through Step S10 to S14, the reflective film 106 is formed on the front surface of the substrate 108 to form the mounting substrate 101.

Next, after the LED chips 102 are mounted on the predetermined region of the mounting surface of the mounting substrate 101, the LED chips 102, the electrodes 104 and the terminals 105 are wire-bonded with the wires 107.

Finally, all of the LED chips 102, the wires 107 and the electrodes 104 on the mounting surface of the mounting substrate 101 are sealed with the sealing member 103.

As described above, in the LED module 4 in this embodiment, the reflective film 106 is formed on the front surface of the substrate 108. Accordingly, the light radiated from the LED chips 102 to the mounting surface of the mounting substrate 101 can be reflected by the reflective film 106 toward the globe 1. As a result, since the light from the LED chips 102 can be efficiently extracted to the outside of the LED lamp 10, the luminous efficiency of the LED lamp 10 can be improved.

In the LED module 4 in this embodiment, the substrate 108 do not need to be excellent in both the reflectivity for the light from the LED chips 102 and the heat radiating property, and only needs to be excellent in the heat radiating property. Accordingly, a substrate having a high thermal conductivity, such as a substrate made of a ceramic having a large particles size, can be used as the substrate 108. As a result, since heat of the LED chips 102 at light emission can be efficiently released to the mounting substrate 101 to prevent a decrease in the optical output caused by an increase in the temperature of the LED chip 102s, the luminous efficiency of the LED lamp 10a can be improved. At the same time, since heat of the LED chip 102 can be uniformly released to the entire substrate 108 to prevent a difference in the optical output between the plurality of LED chips 102 on the substrate 108, the color irregularity of the LED lamp 10a can be prevented.

In the LED module 4 in this embodiment, the reflective film 106 includes the metal oxide microparticles and the glass frit. Accordingly, it can be prevented that the reflective film 106 discolors with time to lower its reflectivity as in the case of using the reflective film 106 including a metal film and resin. It can be also prevented that the reflective film 106 is warped and thus, is peeled from the substrate 108. Furthermore, costs and weight of the LED lamp 10 can be reduced.

In the LED module 4 in this embodiment, the reflective film 106 is made of an inorganic material having a higher thermal conductivity than resin, that is, rutile-type titanium oxide having a thermal conductivity of 9 W/mK, anatase-type titanium oxide having a thermal conductivity of 9 W/mK, aluminum oxide having a thermal conductivity of 20 W/mK or zinc oxide having a thermal conductivity of 50 W/mK. Therefore, the luminous efficiency of the LED lamp 10 can be further improved.

Although the plurality of LED chips 102 are connected to each other with the wire 107 via the electrodes 104 in this embodiment, the LED chips 102 may be directly connected to each other with the wire 107.

Figure 6A:
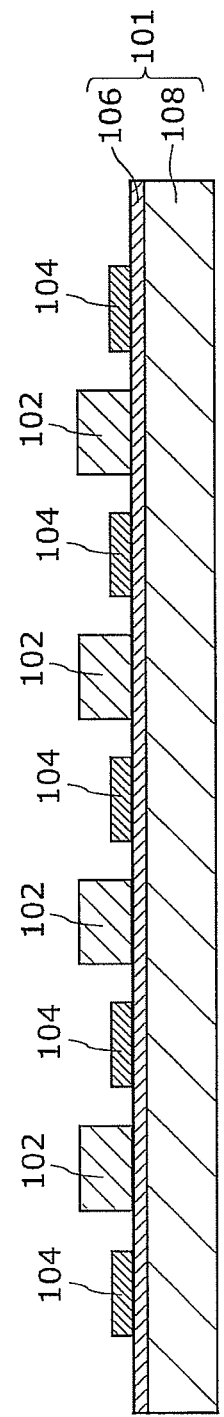
FIG. 6A is a sectional view of a modification example of the LED module in accordance with Embodiment 1.

Although the reflective film 106 is formed after formation of the electrodes 104 and the terminals 105 in this embodiment, the electrodes 104 and the terminals 105 may be formed after formation of the reflective film 106. In this case, as shown in FIG. 6A, the reflective film 106 is formed on the entire front surface of the substrate 108, and the electrodes 104 and the terminals 105 are formed on the reflective film 106. That is, the reflective film 106 is formed so as to coat regions (electrode parts) of the front surface of the substrate 108, in which the electrodes 104 and the terminals 105 are to be formed.

In this embodiment, the electrodes 104, the terminals 105 and the reflective film 106 are individually burnt. However, in formation of the electrodes 104 and the terminals 105, they may be merely dried without being burnt and, in formation of the reflective film 106, the electrodes 104, the terminals 105 and the reflective film 106 may be burnt together at the same time. In this case, the reflective film 106, the electrodes 104 and the terminal 105 are burnt using the same temperature profile.

Figure 6B:
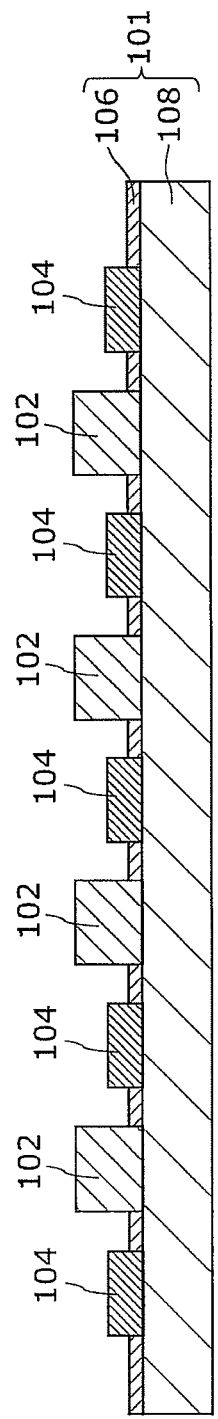
FIG. 6B is a sectional view of a modification example of the LED module in accordance with Embodiment 1.

Although the reflective film 106 is formed on the entire back surface of the substrate 108 in this embodiment, it is no need to provide the reflective film 106 on the entire back surface. For example, the reflective film 106 may be selectively provided on a part of the back surface of the substrate 108, in which the light from the LED chips 102 is intensively radiated, or the reflective film 106 does not need to be provided on a part of the back surface of the substrate 108, in which the amount of light radiated from the LED chips 102 is small. Further, as shown in FIG. 6B, it is no need to provide the reflective film 106 in a region of the front surface of the substrate 108, in which the LED chips 102 are mounted. In this case, since the LED chips 102 can be formed directly on the substrate 108, adhesiveness of the LED chip 102 to the substrate 108 can be ensured.

Figure 7:
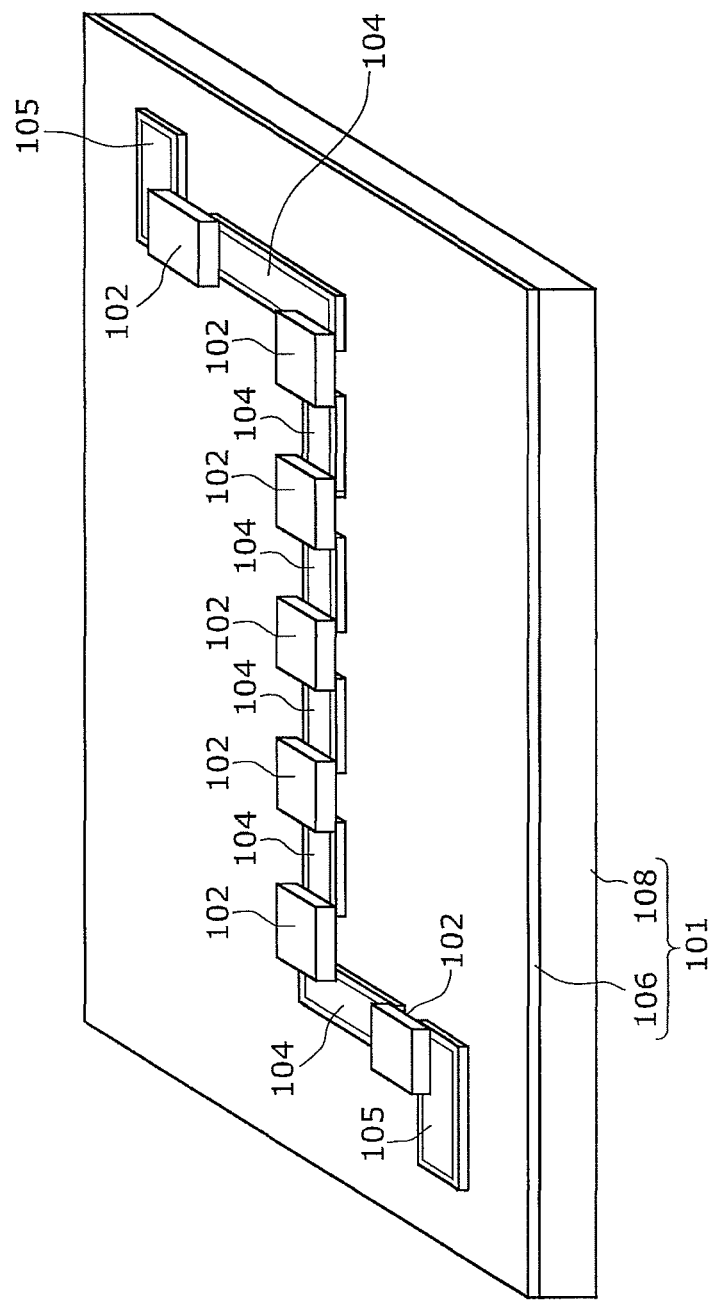
FIG. 7 is a perspective view of the modification example of the LED module in accordance with Embodiment 1.

Although each of the plurality of LED chip 102 is connected to the electrode 104 or the terminal 105 by wire bonding in this embodiment, as shown in FIG. 7, each LED chip 102 may be flip-chip mounted on the mounting substrate 101 and directly connected to the electrode 104 or the terminal 105.

Although the reflective film 106 is formed only on the front surface of the substrate 108 in this embodiment, the reflective film 106 may be formed on the entire back surface of the substrate 108. In this case, light that is not reflected by the front surface of the substrate 108 is reflected by the reflective film 106 formed on the back surface of the substrate 108, is guided into the substrate 108 and is emitted from the end surface of the substrate 108. As a result, the luminous efficiency of the LED lamp 10 can be further improved. Here, to prevent absorption of light in the substrate 108, it is desired that the substrate 108 has a transmittance for light emitted from the LED chips 102 of 1% or higher. That is, it is desired that the substrate 108 has a thickness of 1.5 mm or smaller. Further, it is preferred that the substrate has an inclined surface on the outer circumferential end surface, which is inclined so as to expand from the back surface toward the front surface, so that light emitted to the outer circumferential end surface is emitted toward the globe 1.

In this embodiment, the reflective film 106 is formed of the metal oxide microparticles and the glass frit. However, the reflective film 106 may be made of any material as long as it is formed of glass and metal oxide microparticles bound to glass, and may be formed of metal oxide microparticles and glass manufactured by a sol-gel process. In this case, a metal alkoxide in place of the glass powders is added to the reflective paste.

Embodiment 2

Next, an overall configuration of an LED lamp 10a in accordance with Embodiment 2 of the present invention will be described.

Figure 8:
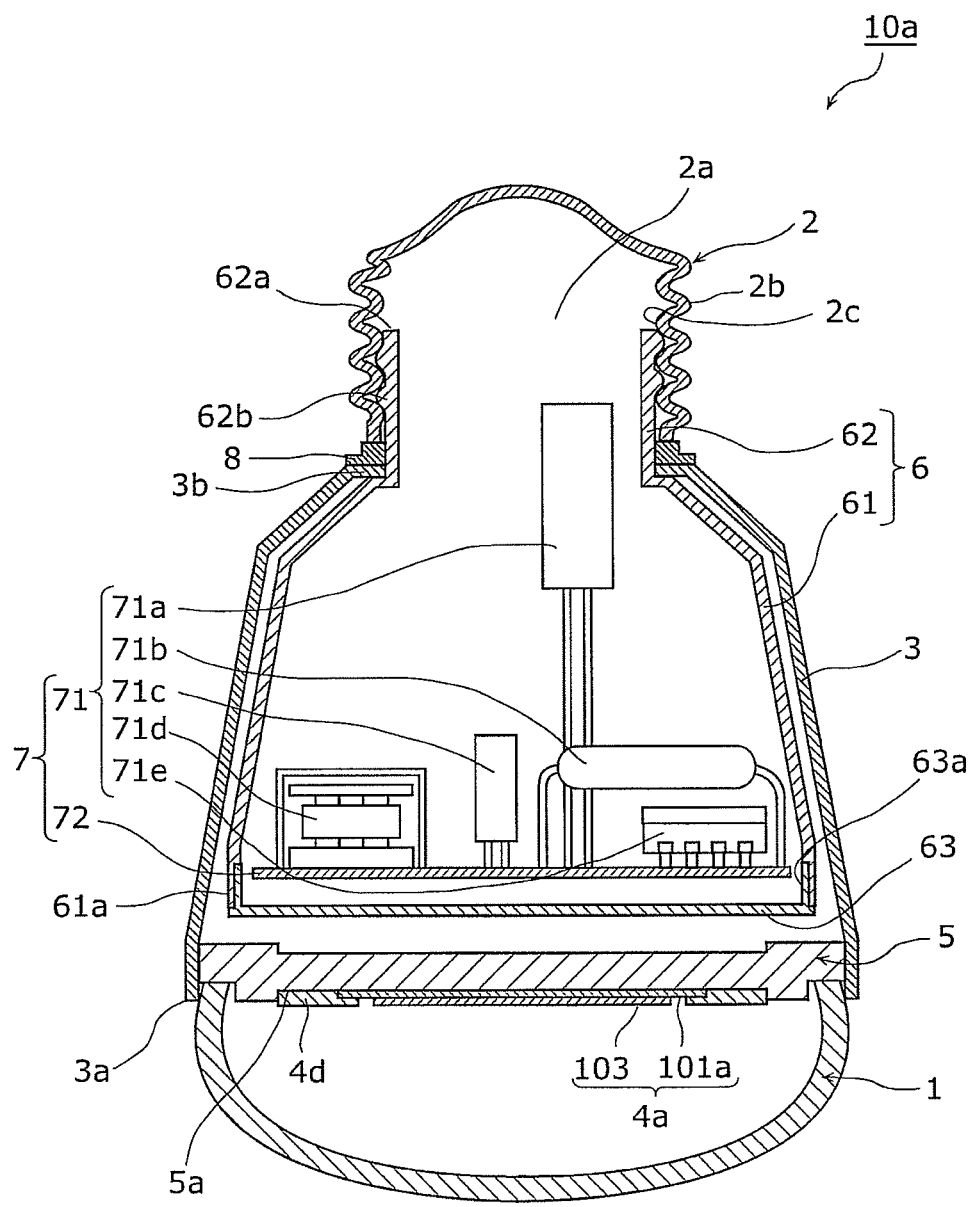
FIG. 8 is a sectional view of an LED lamp in accordance with Embodiment 2 of the present invention.
Figure 9:
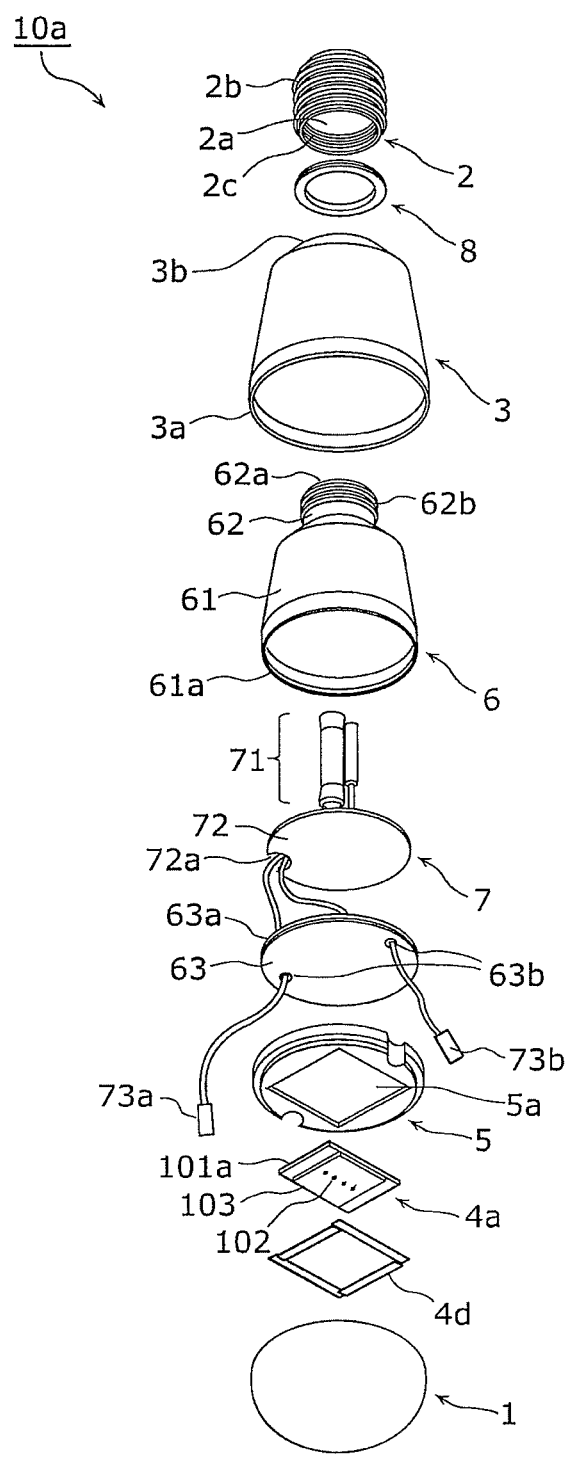
FIG. 9 is an exploded perspective view of the LED lamp in accordance with Embodiment 2.

FIG. 8 is a sectional view of the LED lamp 10a in accordance with this embodiment. FIG. 9 is an exploded perspective view of the LED lamp 10a in accordance with this embodiment.

The LED lamp 10a includes the globe 1, the base 2, the heat sink 3, an LED module 4a, the light source attaching member 5, the resin case 6, the power source circuit 7 and the insulating ring 8. The LED lamp 10a is different from the LED lamp 10 in accordance with Embodiment 1 shown in FIG. 1 and FIG. 2 in that the LED module 4 is replaced with the LED module 4a having a mounting substrate 101a. Specifically, the LED lamp 10a is different from the LED lamp 10 in accordance with Embodiment 1 in that the mounting substrate 101a has the reflective film 106 on the back surface, not on the front surface.

Next, a characteristic configuration of the LED lamp 10a in accordance with Embodiment 2 of the present invention will be described.

Figure 10:
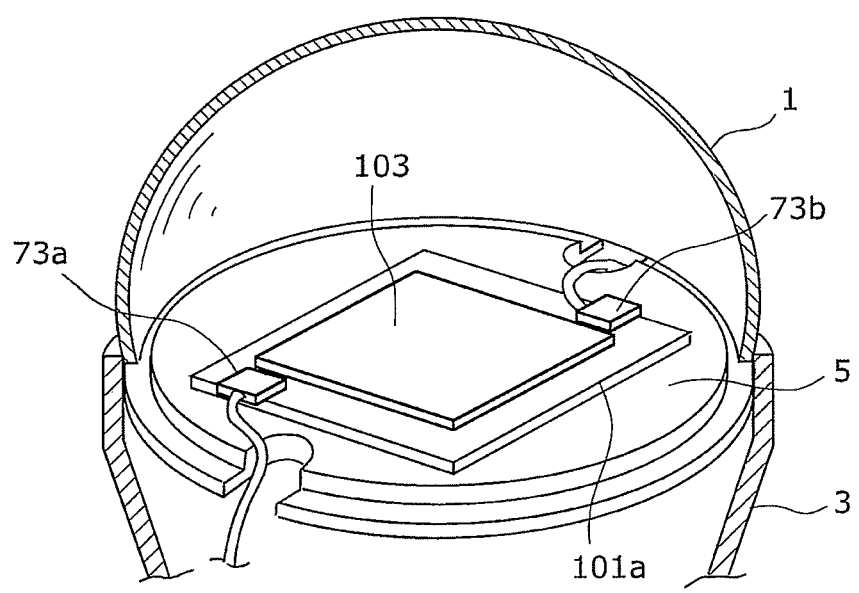
FIG. 10 is a partial cutaway perspective view of the LED lamp in accordance with Embodiment 2.
Figure 11A:
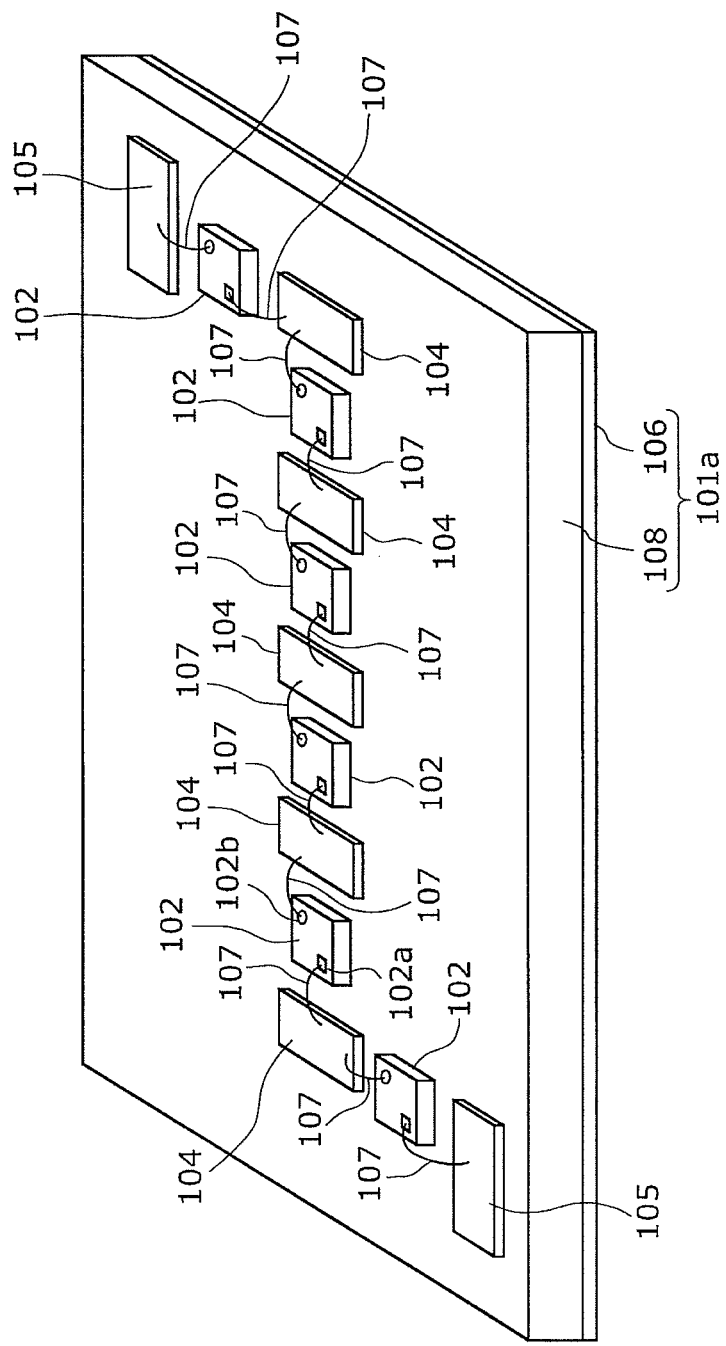
FIG. 11A is a perspective view of the LED lamp in accordance with Embodiment 2.
Figure 11B:
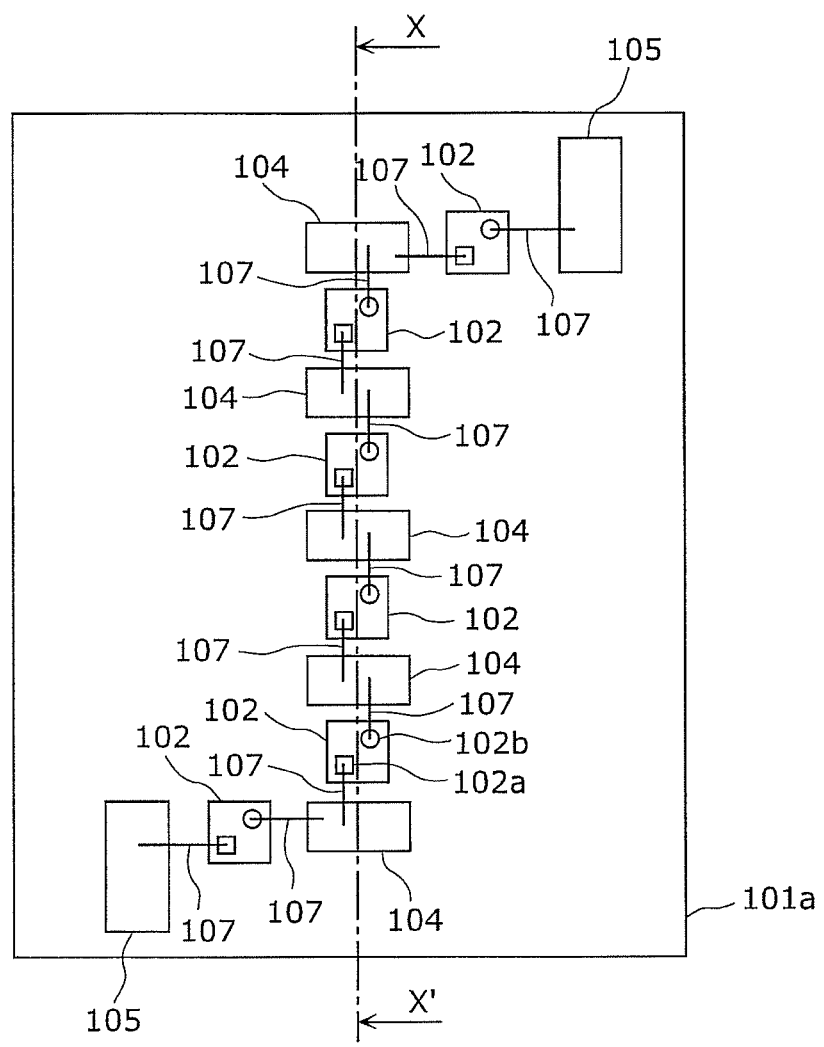
FIG. 11B is a top view of the LED lamp in accordance with Embodiment 2.
Figure 11C:
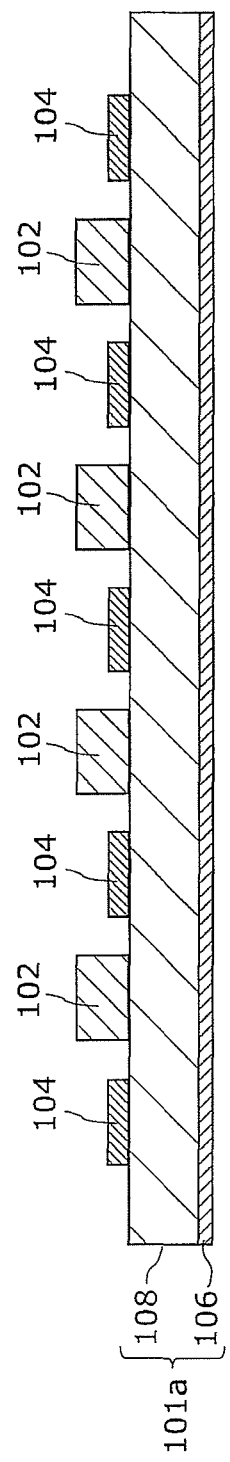
FIG. 11C is a sectional view of the LED lamp in accordance with Embodiment 2.

FIG. 10 is a partial cutaway perspective view of the LED lamp 10a, which shows a state in which the LED module 4a is arranged on the light source attaching member 5. FIG. 11A is a perspective view of the LED module 4a. FIG. 11B is a top view of the LED module 4a. FIG. 11C is a sectional view of the LED module 4a (sectional view taken along a line X-X' in FIG. 11B). It is noted that FIG. 11A to FIG. 11C are views showing a state prior to sealing with the sealing member 103.

The LED module 4a is a light-emitting module (luminous unit) that emits predetermined light, and includes the rectangular mounting substrate 101a, the plurality of LED chips 102, the sealing member 103, the plurality of electrodes 104, the terminals 105 and the wires 107.

The two electrodes 73a, 73b connected to the lead wires extending from the power output unit of the circuit substrate 72 are arranged in the LED module 4a. The two electrodes 73a, 73b supply DC power to the LED module 4a, thereby causing the LED chips 102 of the LED module 4a to emit light.

The LED chips 102 each are a bare chip that emits monochromic visible light, and are mounted (die-bonded) on the front surface (the mounting surface of the mounting substrate 101a) as one principal surface of the substrate 108 with a die-attachment agent or the like. The first electrode 102a and the second electrode 102b are provided on the front surface (light-emitting surface) of each LED chip 102 on the light-emitting side.

The LED chips 102 each are a light-emitting diode configured to form a GaN compound semiconductor layer on a translucent substrate to emit blue light. The LED chips 102 each are a chip that emits light to all directions, that is, sideways, upward and downward, and for example, emit 20% of light sideways, 60% of light upward and 20% of light downward in light amount. For example, the six LED chips 102 are mounted on the front surface of the substrate 108, and are serially connected to one another.

The mounting substrate 101a is formed of the substrate 108 and the reflective film (first reflective film) 106.

The substrate 108 has the front surface on which the LED chips 102 are mounted, and has translucency to the light emitted from the LED chips 102 to transmit the light from the LED chips 102. The substrate 108 is a translucent substrate such as a ceramic substrate made of, for example, aluminum nitride, a resin substrate, a glass substrate, a flexible substrate, an alumina substrate or the like. When the thickness of the substrate 108 becomes smaller than 0.3 mm, its strength lowers, thereby decreasing mass productivity and thermal conductivity.

It is preferred that the front surface of the substrate 108 is treated to have irregularities or is subjected to non-reflective coating in the region except for the regions in which the LED chips 102 are mounted, and where the electrodes 104 and the terminals 105 are formed. Due to the irregularities or non-reflective coating on the front surface, light travelling from the inside of the substrate 108 toward the front surface of the substrate 108 becomes hard to be reflected by the front surface of the substrate 108, and the light reflected by the reflective film 106 becomes easy to be emitted from the front surface of the substrate 108.

The reflective film 106 is formed on the entire back surface as the other principal surface of the substrate 108, and reflects light, which is emitted from the LED chips 102, is transmitted through the substrate 108 and reaches the back surface of the substrate 108, toward the front surface of the substrate 108. An example of the reflective film 106 is a film formed of the metal oxide microparticles and the glass frit, which contains oxide silicon ($SiO_2$) as a main ingredient and is formed by melting the glass powders to be bound to the metal oxide microparticles and the substrate 108. Examples of metal oxide microparticles include microparticles formed of rutile-type and anatase-type titanium oxide, magnesium oxide, zirconium oxide, aluminum oxide, zinc oxide and the like. Since the glass frit has a high transmittance for visible light, and the metal oxide microparticles have a high reflectivity for visible light, the reflective film 106 can efficiently reflect the light from the LED chips 102. It is noted that the microparticles refer to particles having a particle size of a few μm or smaller.

When the thickness of the reflective film 106 becomes larger than 100 μm, the heat radiating property for heat from the LED chips 102 becomes poor and the reflective film 106 tends to be peeled from the substrate 108. Accordingly, the thickness of the reflective film 106 is preferably 100 μm or smaller. For example, when the thickness of the reflective film 106 including the metal oxide microparticles of titanium oxide exceeds 100 μm, the heat radiating efficiency of the mounting substrate having this reflective film 106 becomes lower than that of the mounting substrate having no reflective film 106.

To reflect the light from the LED chips 102 as much as possible, it is preferred that the reflective film 106 includes the metal oxide microparticles having a high refraction index, which has a higher reflectivity for light (visible light) from the LED chips 102 than the substrate 108.

Furthermore, to obtain the same reflectivity for the light from the LED chips 102 as the reflectivity of a metal plate, the reflective film 106 has preferably a reflectivity of 90% or higher. Accordingly, to obtain the reflectivity of 90% or higher, it is preferred that the reflective film 106 includes the metal oxide microparticles with a volume concentration of 40% or higher, and has a thickness of 10 μm or larger.

The sealing member 103 is formed on the front surface of the mounting substrate 101, and seals the LED chips 102, the wires 107 and the electrodes 104. The sealing member 103 is configured by dispersing predetermined phosphor particles in a translucent material such as silicone resin, and the phosphor particles convert the light emitted from the LED chips 102 into illumination light of desired color.

For example, blue LEDs that emit blue light are used as the LED chips 102, and yellow phosphor particles are used as the phosphor particles of the sealing member 103. As a result, the yellow phosphor is excited by blue light emitted from the blue LEDs to radiate yellow light, and the yellow light and the blue light from the blue LEDs are combined to radiate white light from the LED module 4.

Here, in the case where the sealing member 103 greatly differs from the substrate 108 in refraction index, light travelling from the inside of the substrate 108 toward the front surface of the substrate 108 is easily reflected by an interface between the sealing member 103 and the substrate 108. Accordingly, it is preferred that the sealing member 103 has a substantially same refraction index as the substrate 108. For example, in the case where the substrate 108 such as the alumina substrate having a refraction index of about 1.7 is used, it is preferred to use glass or phenyl resin having a refraction index of about 1.6 or resin that includes dispersed silicon nanoparticles having a high refraction index and has a refraction index of about 1.7.

The electrode 104 is a wiring pattern formed on the front surface of the substrate 108 (the mounting surface of the mounting substrate 101a), and is electrically connected to the LED chip 102 and the terminal 105. The electrode 104 is provided to connect the plurality of LED chips 102 to each other and to electrically connect the LED chip 102 to the terminal 105. The electrode 104 is made of Ag—Pt, for example.

The terminals 105 are wiring patterns provided in an outer edge of the front surface of the substrate 108 (in an outer edge of the front surface of the mounting substrate 101a), and receive DC power from the power source circuit 7 by the LED module 4a. The electrode 73a is bonded to one of the two terminals 105, and the electrode 73b is bonded to the other of the terminals 105. Thereby, the power source circuit 7 is electrically connected to the LED module 4a.

Here, a part of light travelling from the LED chips 102 toward the substrate 108 is reflected by front surfaces of the electrodes 104 and the terminals 105. Accordingly, to guide the light travelling from the LED chips 102 toward the substrate 108 to the reflective film 106 formed on the back surface of the substrate 108 as much as possible, it is preferred that the electrodes 104 and the terminal 105 have translucency for the light from the LED chips 102. For example, it is preferred that the electrodes 104 and the terminal 105 each are formed of a transparent conductive film of ITO (Indium Tin Oxide), for example.

Each of the wires 107 is, for example, a gold wire, to electrically connect the electrode 104 to the LED chip 102 and electrically connect the LED chip 102 to the terminal 105. The electrode 104 is connected to the LED chip 102 by bonding one end of the wire 107 to the first electrode 102a or the second electrode 102b of the LED chip 102 and bonding the other end to the electrode 104.

In the LED module 4a having the above-mentioned configuration, most of the light emitted from each of the LED chips 102 is radiated toward the globe 1 so as to be away from the substrate 108, while a part of the light (for example, light from the lower surface and the side surfaces of each LED chip 102) is radiated to the front surface of the substrate 108. The light radiated to the front surface of the substrate 108 is partially reflected by the front surface, but remaining light is incident into the substrate 108 through the front surface. The light passing through the substrate 108 is reflected by the reflective film 106, and is emitted from a region of the front surface of the substrate 108, in which the LED chips 102, the electrodes 104 and the terminals 105 are not formed.

Therefore, the light radiated to the front surface of the substrate 108, in addition to light directly radiated to the globe 1, can be extracted from the LED module 4a by the reflective film 106, and the amount of light extracted from the LED module 4a can be increased without increasing the amount of electricity supplied to the LED chips 102.

A following Table 1 is a table representing the transmittance of an alumina substrate as an example of the substrate 108 for each thickness and alumina purity.

The transmittance is measured by radiating visible light having a wavelength domain of 350 to 750 nm to the substrate 108 by means of JASCO: FP-6200 manufactured by JASCO Corporation. The transmittance shown in this table shows the transmittance for light having a wavelength of 550 nm. Materials A, B, C, and D represent respective different sample substrates made of alumina.

ing metal oxide microparticles of aluminum oxide, and "♦" represents the reflectivity of the mounting substrate 101a with the reflective film 106 including metal oxide microparticles of zinc oxide.

Figure 11D:
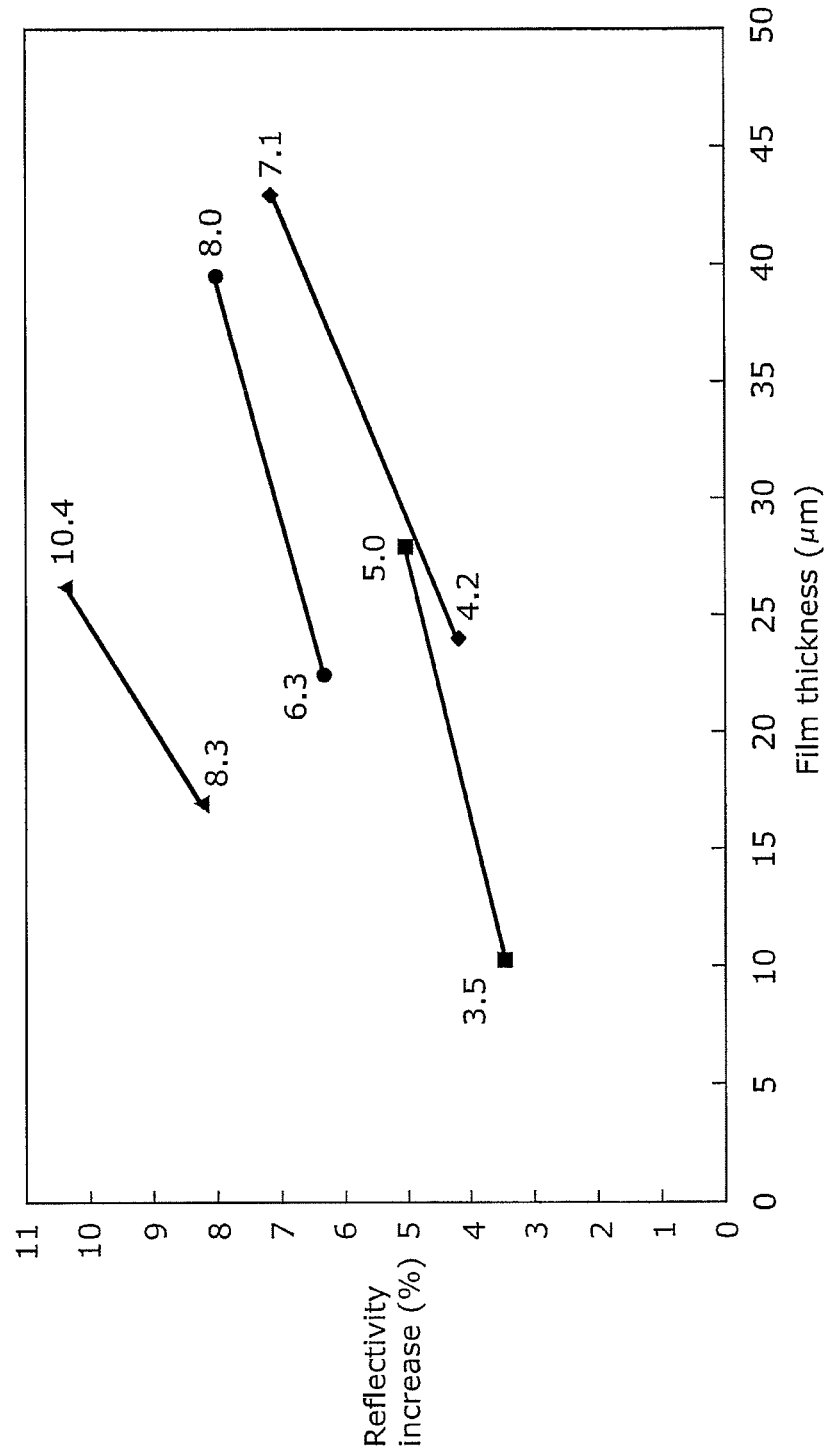
FIG. 11D is a graph showing an increase of reflectivity of a mounting substrate due to a reflective film on a substrate for each thickness of the reflective film.

As shown in FIG. 11D, when the thickness of the reflective film 106 is set to be 10 μm or larger, the reflectivity of the mounting substrate 101a is improved. For example, the reflectivity of about 75% increases to the reflectivity of about 90%. Accordingly, to reflect the light radiated from the LED chips 102 to the mounting surface of the mounting substrate 101a toward the globe 1, the reflective film 106 has desirably, a thickness of 10 μm or larger.

Next, a manufacturing method of the mounting substrate 101a in accordance with Embodiment 2 of the present invention will be described.

Figure 12:
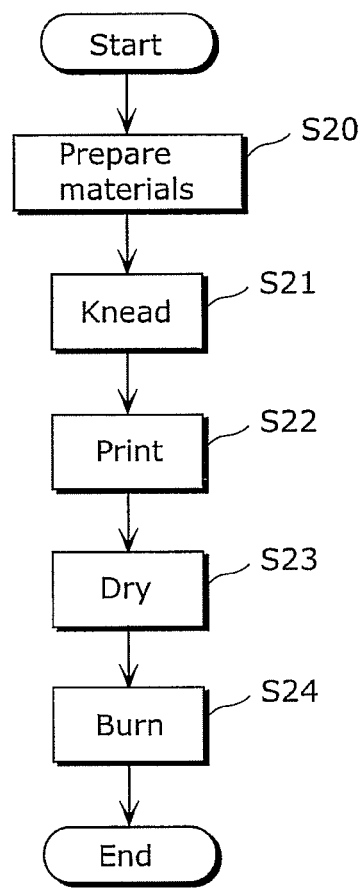
FIG. 12 is a flow chart for describing a manufacturing method of the LED module in accordance with Embodiment 2.

FIG. 12 is a flow chart for describing the manufacturing method of the LED module 4a (manufacturing method of the mounting substrate 101a).

First, materials for the reflective film 106 are prepared. Specifically, a solvent, a binder, glass powders, a powder material for the metal oxide microparticles and a dispersant are prepared (Step S20).

TABLE 1

| | Material | | | | | | | | | | | |
|---|---|---|---|---|---|---|---|---|---|---|---|---|
| | A | | | B | | | C | | | D | | |
| Alumina purity (%) | 92 | 92 | 92 | 96 | 96 | 96 | 96 | 96 | 96 | 96 | 96 | 96 |
| Thickness (mm) | 0.8 | 1 | 1.5 | 0.8 | 1 | 1.5 | 0.8 | 1 | 1.5 | 0.8 | 1 | 1.5 |
| Transmittance (%) | 4 | 2 | 1 | 4 | 2 | 1 | 6 | 5 | 3 | 10 | 8 | 7 |

As shown in Table 1, when the thickness of the substrate 108 is larger than 1.5 mm, the reflectivity of the front surface does not change, but the absorptance increases resulting in that the transmittance of 1% or higher cannot be achieved. To guide the light radiated from the LED chip 102 toward the front surface of the substrate 108 to the reflective film 106 formed on the back surface of the substrate 108, it is preferred that the substrate 108 has a transmittance for the light emitted from the LED chips 102 of 1% or higher. Accordingly, it is desired that the substrate 108 has a thickness of 1.5 mm or smaller.

FIG. 11D is a graph showing an increase in the reflectivity of the mounting substrate 101a due to the reflective film 106 on the substrate 108 (100×reflectivity with only the substrate 108/reflectivity with the substrate having the reflective film 106-100) for each thickness of the reflective film 106.

In the measurement shown in FIG. 11D, samples in which the reflective film 106 including the metal oxide microparticles with a volume concentration of 40% or higher is formed on the substrate 108 having an alumina purity of 96% and a thickness of 1 mm are used. The transmittance is measured by radiating visible light having a wavelength domain of 350 to 750 nm to the mounting substrate 101a by means of JASCO: FP-6200 manufactured by JASCO Corporation, and the increase in the reflectivity in FIG. 11D is derived using the transmittance of light having a wavelength of 550 nm. In FIG. 11D, "▲" represents the reflectivity of the mounting substrate 101a with the reflective film 106 including metal oxide microparticles of rutile-type titanium oxide, "●" represents the reflectivity of the mounting substrate 101a with the reflective film 106 including metal oxide microparticles of anatase-type titanium oxide, "■" represents the reflectivity of the mounting substrate 101a with the reflective film 106 includ- Next, the prepared materials are kneaded (mixed) by use of a three-roll kneader, for example, into a paste to create a reflective paste (Step S21).

Next, the reflective paste is screen-printed (applied) on the whole of the back surface opposite to the front surface of the substrate 108 (Step S22).

Next, the screen-printed substrate 108 is dried at temperature of 150° C. for 30 minutes to evaporate the solvent of the reflective paste (Step S23).

Next, the dried substrate 108 is burnt in a heating furnace, resulting in that the glass powders are softened, binding (bonding) between powders of the metal oxide microparticles, and between the powders and the substrate 108 is made with the glass frit, and the glass frit and the metal oxide microparticles, that is, the reflective film 106 is baked to the substrate 108 (Step S24). For example, the dried substrate 108 is heated in a belt furnace set to hold the substrate at the highest temperature of 700° C. for 15 minutes for one hour.

In Step S20 to S24, the reflective film 106 is formed on the back surface of the substrate 108 to form the mounting substrate 101a.

Next, a wiring paste is screen-printed in a predetermined region of the mounting surface of the mounting substrate 101a and then, the mounting substrate 101a is dried and burnt to form the electrodes 104 and the terminals 105.

Next, after the LED chips 102 are mounted in the predetermined region of the mounting surface of the mounting substrate 101a, the LED chips 102, the electrodes 104 and the terminals 105 are wire-bonded by use of the wires 107.

Finally, all of the LED chips 102, the wires 107 and the electrodes 104 on the mounting surface of the mounting substrate 101a are sealed with the sealing member 103.

As described above, in the LED module 4a in this embodiment, the substrate 108 is translucent to light from the LED chips 102, and the reflective film 106 is formed on the back surface of the substrate 108. Accordingly, the light radiated from the LED chips 102 to the mounting surface of the mounting substrate 101a can be reflected by the reflective film 106 toward the globe 1. As a result, the light from the LED chip 102 can be efficiently extracted to the outside of the LED lamp 10a, thereby improving the luminous efficiency of the LED lamp 10a.

In the LED module 4a in this embodiment, the substrate 108 do not need to be excellent in both the reflectivity for light from the LED chips 102 and the heat radiating property, and only needs to be excellent in the heat radiating property. Accordingly, a substrate having a high thermal conductivity, such as a substrate made of a ceramic having a large particles size, can be used as the substrate 108. As a result, since heat of the LED chips 102 at light emission can be efficiently released to the mounting substrate 101a to prevent a decrease in the optical output caused by an increase in the temperature of the LED chip 102s, the luminous efficiency of the LED lamp 10a can be improved. At the same time, since heat of the LED chip 102 can be uniformly released to the entire substrate 108 to prevent a difference in the optical output between the plurality of LED chips 102 on the substrate 108, the color irregularity of the LED lamp 10a can be prevented.

In the LED module 4a in this embodiment, the reflective film 106 includes the metal oxide microparticles and the glass frit. Accordingly, it can be prevented that the reflective film 106 discolors with time to lower its reflectivity as in the case of using the reflective film 106 including a metal film and resin. Further, it can be also prevented that the reflective film 106 is warped and thus, is peeled from the substrate 108. Moreover, costs and weight of the LED lamp 10a can be reduced.

In the LED module 4a in this embodiment, the reflective film 106 is made of an inorganic material having a higher thermal conductivity than resin, that is, rutile-type titanium oxide having a thermal conductivity of 9 W/mK, anatase-type titanium oxide having a thermal conductivity of 9 W/mK, aluminum oxide having a thermal conductivity of 20 W/mK or zinc oxide having a thermal conductivity of 50 W/mK. Therefore, the luminous efficiency of the LED lamp 10a can be further improved.

Although the plurality of LED chips 102 are connected to each other with the wire 107 via the electrodes 104 in this embodiment, the LED chips 102 may be directly connected to each other with the wire 107.

Although the electrodes 104 and the terminals 105 are formed after formation of the reflective film 106 in this embodiment, the reflective film 106 may be formed after formation of the electrodes 104 and the terminals 105. Alternatively, in formation of the reflective film 106, the reflective film 106 may be merely dried without being burnt and, in formation of the electrodes 104 and the terminals 105, the electrodes 104, the terminals 105 and the reflective film 106 may be burnt together at the same time. In this case, the reflective film 106, the electrodes 104 and the terminal 105 are burnt using the same temperature profile.

Although the reflective film 106 is formed on the entire back surface of the substrate 108 in this embodiment, it is no need to provide the reflective film 106 on the entire back surface. For example, the reflective film 106 may be selectively provided on a part of the back surface of the substrate 108, in which light from the LED chips 102 is intensively radiated, or the reflective film 106 does not need to be provided on a part of the back surface of the substrate 108, in which the amount of light radiated from the LED chips 102 is small.

Figure 13:
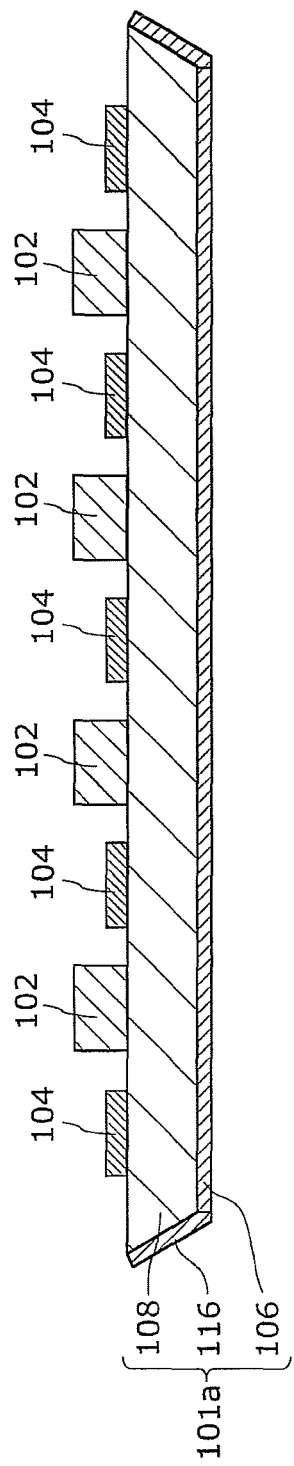
FIG. 13 is a sectional view of a modification example of the LED module in accordance with Embodiment 2.

Although the reflective film 106 is formed on the back surface of the substrate 108 in this embodiment, as shown in FIG. 13, the reflective film 106 may be formed on the outer circumferential end surface in addition to the back surface of the substrate 108. That is, the mounting substrate may include a reflective film (second reflective film) 116 that is formed on the end surface of the substrate 108, is formed of the metal oxide microparticles and the glass frit, and reflects the light, which is emitted from the LED chips 102 and transmitted through the substrate 108, toward the front surface of the substrate 108. In this case, as shown in FIG. 13, it is preferred that the substrate 108 has an inclined surface on the outer circumferential end surface, which is inclined so as to expand from the back surface toward the front surface, so that light reflected by the reflective film 106 formed on the outer circumferential end surface is emitted from the surface of the substrate 108 (mounting surface of the mounting substrate 101a) toward the globe 1.

Figure 14:
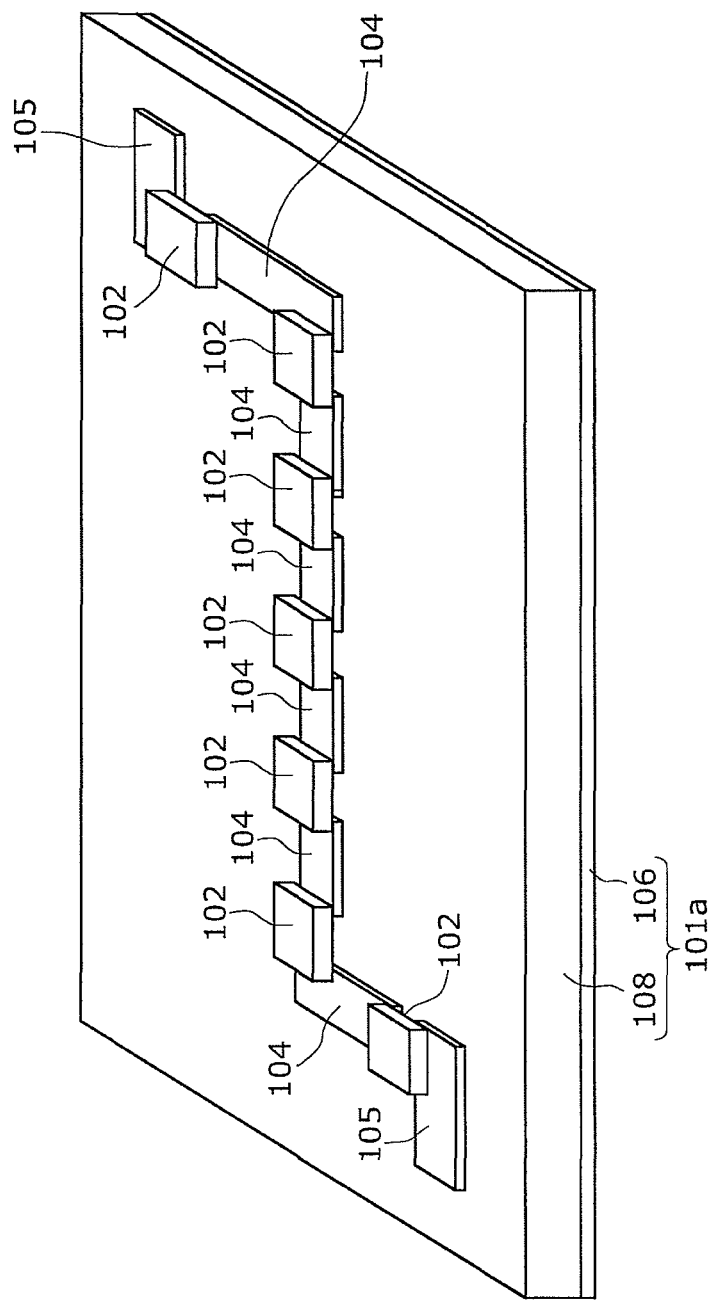
FIG. 14 is a perspective view of the modification example of the LED module in accordance with Embodiment 2.

Although the plurality of LED chip 102 is connected to the electrode 104 or the terminal 105 by wire bonding in this embodiment, as shown in FIG. 14, each of the LED chips 102 may be flip-chip mounted on the mounting substrate 101a and directly connected to the electrode 104 or the terminal 105.

In this embodiment, the reflective film 106 is formed of the metal oxide microparticles and the glass frit. However, the reflective film 106 may be made of any material as long as it is formed of glass and metal oxide microparticles bound to glass, and may be formed of metal oxide microparticles and glass manufactured by the sol-gel process. In this case, a metal alkoxide in place of the glass powders is added to the reflective paste.

Embodiment 3

Next, an overall configuration of an LED lamp 10b in accordance with Embodiment 3 of the present invention will be described.

In the LED lamp 10a in accordance with Embodiment 2, the light reflecting microparticles (metal oxide microparticles) such as titanium oxide and the glass frit are used as the reflective material, and the back surface of the substrate (the surface on the opposite side of the surface on which the LED chips are mounted) is coated with the reflective material to form the reflective film.

However, when the reflective film formed of the light reflecting microparticles and the glass frit is actually formed on the back surface of the ceramic substrate, there may be cases where the reflective film is peeled from the ceramic substrate, for example, the light reflecting microparticles are peeled. The reason will be described below.

An Ag electrode made of Ag (silver) is formed on the surface (mounting surface) of the ceramic substrate, on which the LED chips are mounted, in a predetermined pattern to supply a current to the LED chips. To prevent deterioration of the Ag electrode, the Ag electrode is plated with Ni (nickel)/Au (gold).

In such mounting substrate, an Ag electrode forming step, a reflective film forming step and a plating step are performed in this order. That is, first, an Ag paste is printed on the LED chip mounting surface of the ceramic substrate in a predetermined pattern, and is burnt in a temperature range of 700° C. to 800° C. Thereby, the Ag electrode having the predetermined pattern is formed. Next, a paste obtained by kneading powdered light reflecting microparticles, glass powders, a binder and a solvent is applied to the back surface of the ceramic substrate, and is burnt in a temperature range of 700° C. to 800° C. The reflective film formed of the light reflecting microparticles and the glass frit can be formed in this manner. Next, the Ag electrode is plated with Ni/Au. In the plating with Ni/Au, first, the ceramic substrate mounting the Ag electrode and the reflective film thereon is immersed in a predetermined acid solution and then, is sequentially immersed in an Ni plating solution and an Au plating solution. Thereby, an Ni layer and an Au layer are formed on the surface of the Ag electrode.

As a result, the glass frit in the reflective film may be corroded by the acid solution at plating, causing peeling of the light reflecting microparticles from the ceramic substrate.

According to a possible solution to resolve this problem, the reflective film forming step is performed after the plating step. However, since thermal treatment in the temperature range of 700° C. to 800° C. is performed in the reflective film forming step as described above, when the plating step is performed before the reflective film forming step, the Ni layer formed by plating becomes oxidized by heat treatment in the reflective film forming step. This causes peeling of the Ni/Au layer. For this reason, it is undesirable to perform the reflective film forming step after the plating step.

As described above, when the reflective film made of the light reflecting microparticles and the glass frit is used, the light reflecting microparticles may be peeled by plating of the Ag electrode. Accordingly, the LED lamp 10b in this embodiment has a configuration capable of preventing peeling of the light reflecting microparticles in the reflective film.

Figure 15:
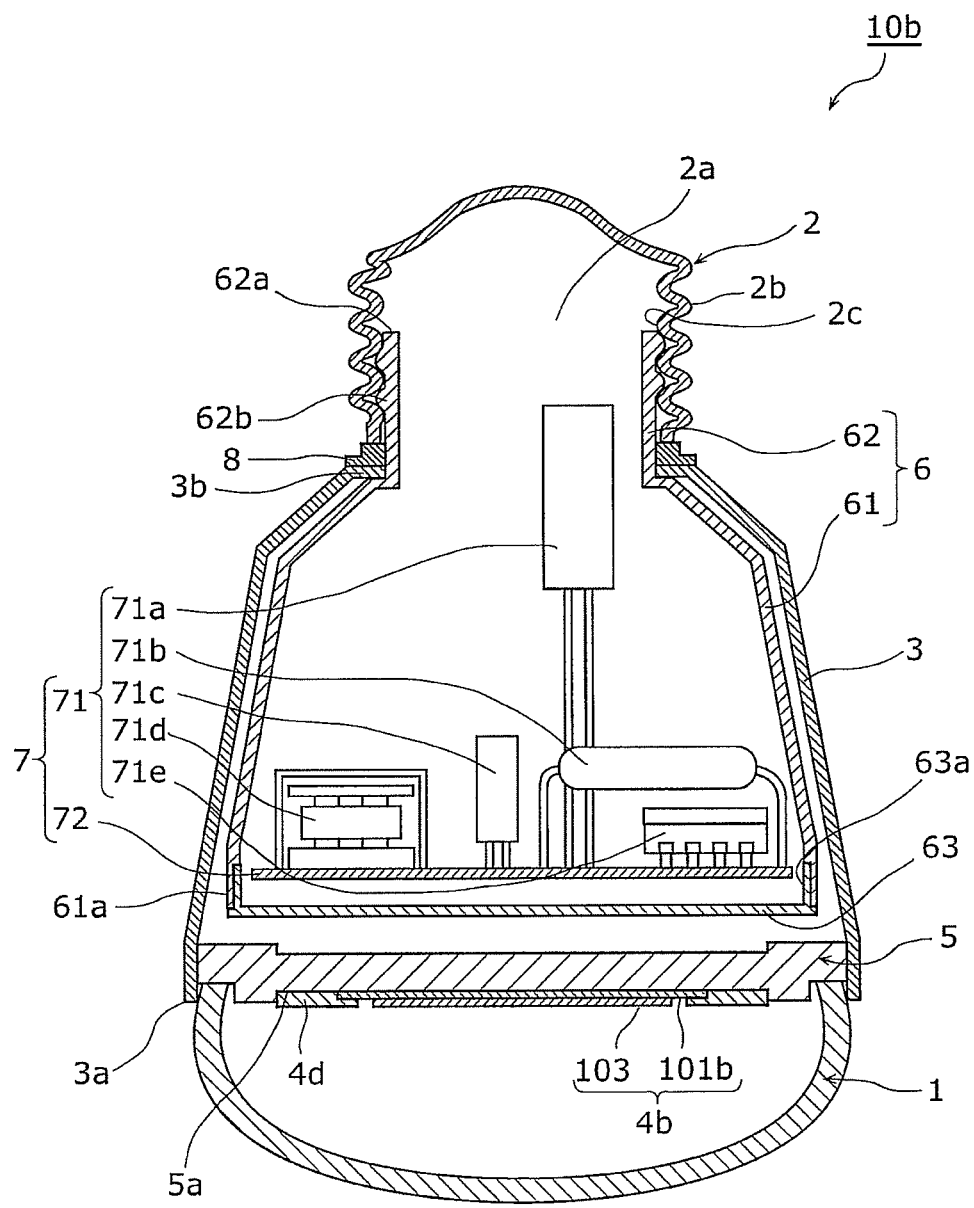
FIG. 15 is a sectional view of an LED lamp in accordance with Embodiment 3 of the present invention.
Figure 16:
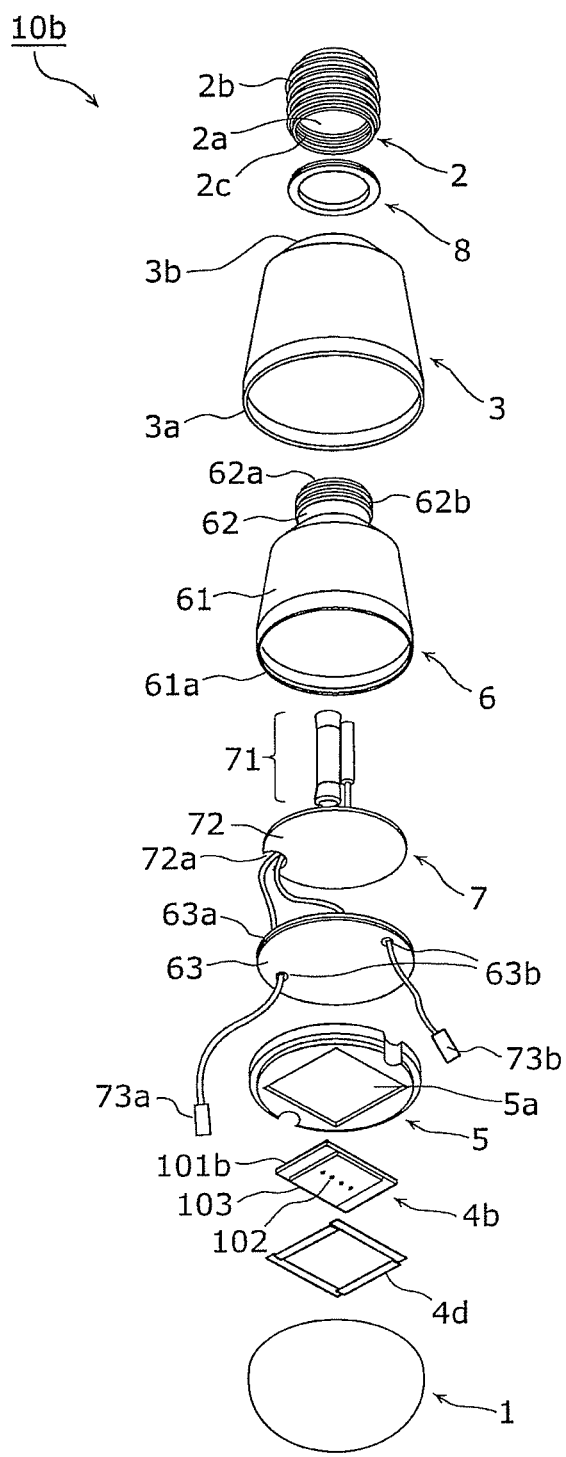
FIG. 16 is an exploded perspective view of the LED lamp in accordance with Embodiment 3.

FIG. 15 is a sectional view of the LED lamp 10b in accordance with this embodiment. FIG. 16 is an exploded perspective view of the LED lamp 10b in accordance with this embodiment.

The LED lamp 10b includes the globe 1, the base 2, the heat sink 3, an LED module 4b, the light source attaching member 5, the resin case 6, the power source circuit 7 and the insulating ring 8. The LED lamp 10b is different from the LED lamp 10a in accordance with Embodiment 2 shown in FIG. 8 and FIG. 9 in that the LED module 4a is replaced with the LED module 4b having a mounting substrate 101b. Specifically, the LED lamp 10b is different from the LED lamp 10a in accordance with Embodiment 2 in that the reflective film of the mounting substrate 101b is formed of a multilayer reflective film 412.

Figure 17:
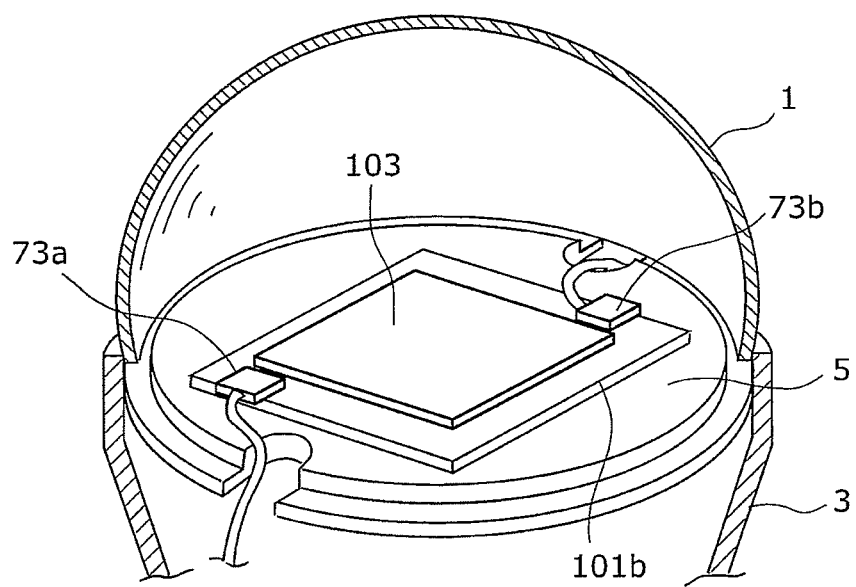
FIG. 17 is a partial cutaway perspective view of the LED lamp in accordance with Embodiment 3.

FIG. 17 is a partial cutaway perspective view of the LED lamp 10b in accordance with this embodiment, which shows a state where the LED module 4b is arranged on the light source attaching member 5.

As shown in FIG. 17, the LED module 4b is arranged on the light source attaching member 5. The two electrodes 73a, 73b connected to the lead wires extending from the power output unit of the power source circuit 7 are connected to terminal electrodes of the LED module 4b. The two electrodes 73a, 73b supply DC power to the LED module 4b, thereby causing the LED chips of the LED module 4b to emit light. Thereby, illumination light is emitted from the LED module 4b.

Figure 18A:
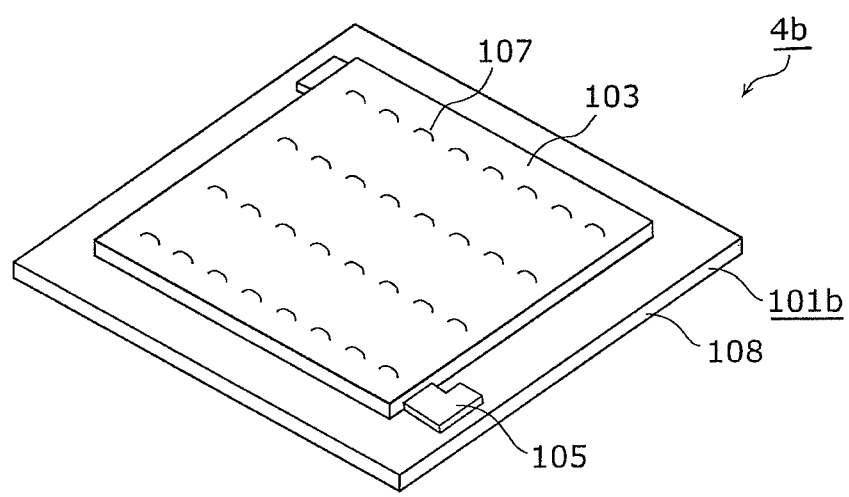
FIG. 18A is a perspective view of an appearance of an LED module in accordance with Embodiment 3.
Figure 18B:
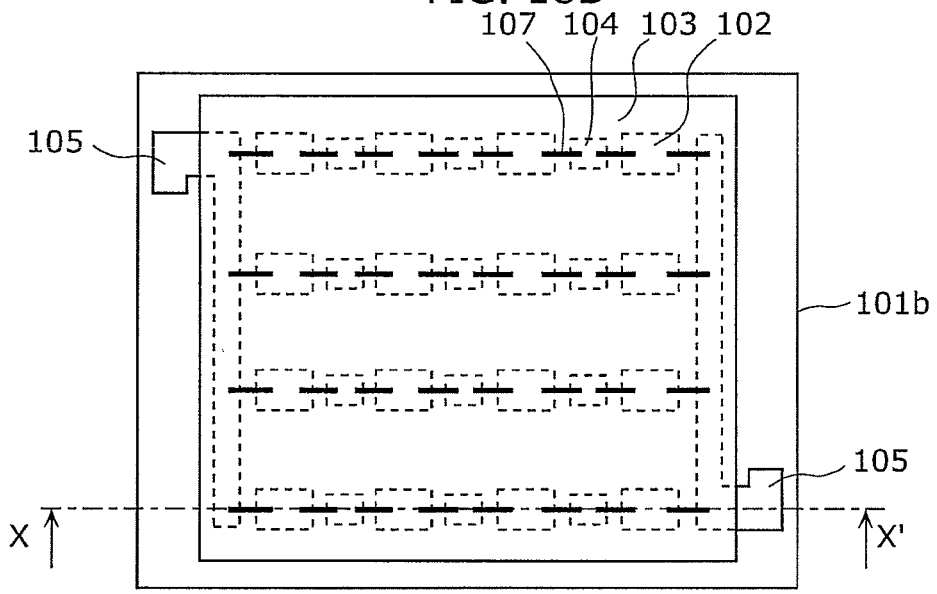
FIG. 18B is a plan view of the LED module in accordance with Embodiment 3.

Next, the LED module 4b provided in the LED lamp 10b will be described with reference to FIG. 18A to FIG. 18C. FIG. 18A is a perspective view showing an appearance of the LED module 4b in accordance with this embodiment. FIG. 18B is a plan view of the LED module 4b in accordance with this embodiment, and FIG. 18C is a sectional view of the LED module 4b cut along a line X-X' in FIG. 18B.

Figure 18C:
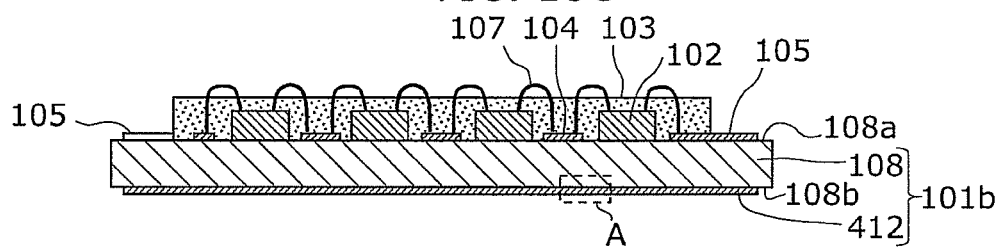
FIG. 18C is a sectional view of the LED module in accordance with Embodiment 3.

As shown in FIG. 18A to FIG. 18C, the LED module 4b in this embodiment is a surface-mount light-emitting module (luminous unit) emitting predetermined illumination light, which includes the mounting substrate 101b, the plurality of LED chips 102 mounted on the mounting substrate 101b, the sealing member 103 coating the LED chips 102, the electrodes (wiring electrodes) 104 formed on the mounting substrate 101b in a predetermined pattern, the terminals (terminal electrodes) 105 that receive predetermined DC power from the power source circuit 7 and supply the DC power to the LED chips 102 via the electrodes 104 and the wires 107, and the wires 107 electrically connecting the LED chips 102 to the respective electrodes 104.

As shown in FIG. 18C, the mounting substrate 101b in accordance with this embodiment of the present invention is a substrate on which the LED chip 102 are to be mounted, and is constituted of the substrate 108 and the multilayer reflective film (first reflective film) 412.

The substrate 108 has one principal surface (front surface) 108a as the mounting surface on which the LED chips 102 are to be mounted and the other principal surface (back surface) 108b as the surface on the opposite side of the front surface 108a. The substrate 108 is a translucent substrate having the translucency to light emitted from the LED chips 102 to allow the light emitted from the LED chip 102 to transmit. The substrate 108 may be any substrate having a transmittance for the light emitted from the LED chips 102 of 1% or higher. The substrate 108 is preferably, a substrate having an excellent heat radiating property and a high thermal conductivity so as to efficiently radiate heat of the LED chips 102. In this embodiment, a ceramic substrate having a transmittance of 2% and a thermal conductivity of 25 (W/m·K) is used.

The multilayer reflective film 412 is a multilayer film according to the present invention, and has a first reflective film (first film) 413 formed on the side of the substrate 108, and a second reflective film (first film) 414 formed on the opposite side to the substrate 108 across the first reflective film 413. A configuration of the multilayer reflective film 412 will be described in detail later.

The LED chips 102 each are a semiconductor light-emitting element according to the present invention, and in this embodiment, a bare chip that emits monochromic visible light. The LED chips 102 are mounted on the front surface 108a of the mounting substrate 101b. The LED chips 102 emit light to all directions, that is, sideways, upward and downward, and for example, emit 20% of light sideways, 60% of light upward and 20% of light downward in light amount.

The sealing member (phosphor-containing resin) 103 is made of resin containing predetermined phosphor particles, coats the LED chips 102 to seal the LED chips 102 and the electrodes 104 as well as converts color of light emitted from the LED chips 102 to radiate illumination light of desired color. The sealing member 103 is configured by dispersing the predetermined phosphor particles in a translucent material such as silicone resin, and the phosphor particles converts color of light emitted from the LED chip 102 into desired color.

The electrodes 104 is a predetermined wiring pattern formed on the front surface of the substrate 108 (the front surface 108a of the mounting substrate 101b) and is electrically connected to the LED chip 102 via the wire 107. In this embodiment, the Ag electrode made of Ag is used as the electrode 104. The electrode 104 is plated with Ni/Au, such that the Ni layer and the Au layer are stacked on the front surface of the electrode 104.

The terminal 105 is an electrode pad provided on the outer circumferential front surface of the substrate 108, and receives DC power from the power source circuit 7. The terminal 105 is also plated with Ni/Au, such that the Ni layer and the Au layer are stacked on the front surface of the terminal 105.

Each of the wires 107 is, for example, a gold wire, and the LED chip 102 and the electrode 104 are electrically connected to each other by wire bonding.

In this embodiment, as shown in FIG. 18B, the 16 LED chips 102 are mounted on the mounting substrate 101b, and four LED chips 102 arranged in a line are serially connected to one another. The lines of the LED chips 102 are connected to one another in parallel.

In the LED module 4b in accordance with this embodiment, emitted illumination light is set to have white color. Thus, first, blue LEDs emitting blue light having a central wavelength of 450 to 470 nm are used as the LED chips 102. Semiconductor light-emitting elements configured by forming GaN compound semiconductor layer on a translucent substrate can be used as the blue LEDs.

Next, yellow phosphor particles exciting yellow light by light emitted from the LED chips 102 are used as the phosphor particles included in the sealing member 103. A YAG (yttrium aluminum garnet) phosphor material can be used for the yellow phosphor particles.

As described above, in the LED module 4b in accordance with this embodiment, the blue LEDs emitting blue light are used as the LED chips 102, and the yellow phosphor particles are used as the phosphor particles of the sealing member 103. Thereby, the yellow phosphor is excited by blue light emitted from the blue LEDs to discharge yellow light. Then, combination of the yellow light from the yellow phosphor and the blue light from the blue LEDs generate white light, and the white light is radiated from the LED module 4b.

The material for the LED chips 102 or the phosphor, or combination of the LED chips 102 and the phosphor is not limited to the above-mentioned one.

Figure 19:
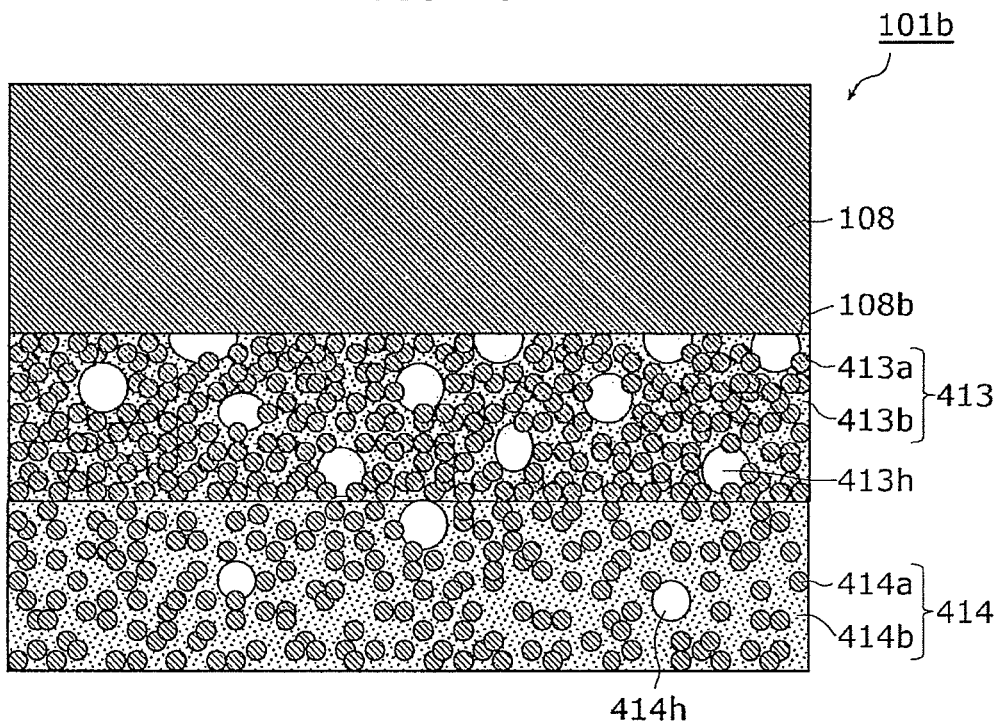
FIG. 19 is a partial enlarged sectional view of a mounting substrate in accordance with Embodiment 3.

Next, a detailed configuration of the multilayer reflective film 412 in accordance with this embodiment will be described with reference to FIG. 19. FIG. 19 is an enlarged view of a region A surrounded by a broken line in FIG. 18C and a partial enlarged sectional view of the mounting substrate 101b in accordance with this embodiment of the present invention.

As shown in FIG. 19, the first reflective film 413 in the multilayer reflective film 412 is the first film according to the present invention, and is formed on the back surface 108b of the substrate. The first reflective film 413 is mainly configured of light reflecting microparticles (metal oxide microparticles) 413a and a glass frit 413b, and is a highly reflective film reflecting light, which is emitted from the LED chips 102, is transmitted through the substrate 108 and reaches the back surface 108b of the substrate, toward the front surface 108a of the substrate.

The light reflecting microparticles 413a of the first reflective film 413 is made of a material that reflects light from the LED chips 102 and has a high reflectivity for visible light. For example, metal oxide microparticles of rutile-type or anatase-type titanium oxide, magnesium oxide, zirconium oxide, aluminum oxide or zinc oxide can be used as the light reflecting microparticles 413a. It is noted that the microparticles of the light reflecting microparticles refer to particles having a particle size of a few μm or smaller. In this embodiment, the rutile-type titanium oxide ($TiO_2$) having a particle size of 0.20 μm is used as the light reflecting microparticles 413a.

The glass frit 413b of the first reflective film 413 is a binding material binding the light reflecting microparticles 413a to the substrate 108, and is made of a material having a high transmittance for visible light. The glass frit 413b is made of a material having oxide silicon ($SiO_2$) as a main ingredient. The glass frit 413b can be formed by heating and melting glass powders. In this embodiment, $SiO_2$-$B_2O_3$-$R_2O$ (where, $R_2O$ is $Li_2O$, $Na_2O$, or $K_2O$) can be used as the glass powders of the glass frit 413b.

In this embodiment, the first reflective film 413 is configured such that a volume concentration of the glass frit 413b in the first reflective film 413 is less that 20% (vol %). In other words, the volume concentration of the light reflecting microparticles 413a in the first reflective film 413 is configured to exceed 80%. Thereby, the reflectivity of the first reflective film 413 for visible light can be made 90% or higher, realizing the reflective film having a high reflectivity as in the case where a reflective plate made of elemental metals is used. As the volume concentration of the light reflecting microparticles 413a in the first reflective film 413 is larger, the reflectivity is higher and thus, light that is transmitted through the first reflective film 413 and is incident on the second reflective film 414 decreases. Accordingly, it is preferred that a volume concentration of the glass frit 413b in the first reflective film 413 is smaller than 20%. In this embodiment, the volume concentration of the glass frit 413b in the first reflective film 413 is set to 10%.

Next, the second reflective film 414 constituting the multilayer reflective film 412 will be described. As shown in FIG. 19, the second reflective film 414 is the second film according to the present invention, and is stacked on the first reflective film 413. The second reflective film 414 is made of mainly the light reflecting microparticles 414a and a glass frit 414b, and like the first reflective film 413, the second reflective film 414 includes the light reflecting microparticles 414a. Thereby, light that is emitted from the LED chips 102, is transmitted through the substrate 108 and the first reflective film 413 and reaches the second reflective film 414 can be reflected by the second reflective film 414 toward the front surface 108a of the substrate.

As described above, like the light reflecting microparticles 413a in the first reflective film 413, the light reflecting microparticles 414a in the second reflective film 414 is made of a material that reflects light from the LED chips 102. For example, metal oxide microparticles of rutile-type or anatase-type titanium oxide, magnesium oxide, zirconium oxide, aluminum oxide and zinc oxide can be used as the light reflecting microparticles 414a. Rutile-type titanium oxide ($TiO_2$) having a particles size of 0.20 μm is used for the light reflecting microparticles 414a like the light reflecting microparticles 413a in the first reflective film 413.

Like the glass frit 413b in the first reflective film 413, the glass frit 414b in the second reflective film 414 is a bonding material for bonding the light reflecting microparticles 414a to the substrate 108, has a high transmittance for visible light. The glass frit 414b is made of a material having oxide silicon ($SiO_2$) as a main ingredient, and can use $SiO_2$-$B_2O_3$-$R_2O$ (where, $R_2O$ is $Li_2O$, $Na_2O$, or $K_2O$).

A volume concentration of the glass frit 414b in the second reflective film 414 is set to be higher than a volume concentration of the glass frit 413b in the first reflective film 413, that is, 20% (vol %) or higher. In this embodiment, the volume concentration of the glass frit 414b in the second reflective film 414 is set to 30%.

As described above, in the multilayer reflective film 412 of the mounting substrate 101b in accordance with this embodiment of the present invention, the volume concentration of the glass frit 414b in the second reflective film 414 is set to be higher than the volume concentration of the glass frit 413b in the first reflective film 413. That is, the volume concentration (contents) of the light reflecting microparticles 413a in the first reflective film 413 is higher than the volume concentration (contents) of the light reflecting microparticles 414a in the second reflective film 414.

Thus, the first reflective film 413 on the side of the substrate 108 can function as a highly reflective film, while the second reflective film 414 coating the first reflective film 413 can function as a protective film for the first reflective film 413.

Accordingly, in the first reflective film 413, the amount of the glass frit 413b is reduced to the extent that the light reflecting microparticles 413a can be bonded to the substrate 108, thereby increasing the volume concentration (contents) of the light reflecting microparticles 413a as much as possible. As a result, the first reflective film 413 can become a highly reflective film having a reflectivity for visible light of 90%.

The second reflective film 414 serves to prevent peeling of the light reflecting microparticles 413a in the first reflective film 413. Even when the mounting substrate 101b is immersed in the acid solution at plating, the light reflecting microparticles 414a in the second reflective film 414 itself are not peeled. To prevent peeling of the light reflecting microparticles 414a in the second reflective film 414, it is preferred that the volume concentration of the glass frit 414b in the second reflective film 414 is 20% (vol %) or higher.

In this embodiment, the second reflective film 414 includes the light reflecting microparticles 414a. Accordingly, the second reflective film 414 also functions as a reflective film. Thus, even when light that is emitted from the LED chips 102, is transmitted through the substrate 108 and the first reflective film 413, and reaches the second reflective film 414 exists, the light from the LED chips 102 can be reflected by the second reflective film 414 toward the front surface 108a of the substrate.

Next, a reason why peeling of the second reflective film 414 is prevented by setting the volume concentration of the glass frit 414b in the second reflective film 414 to 20% (vol %) or higher will be described.

As shown in FIG. 19, holes 413h and holes 414h are generated in the first reflective film 413 and the second reflective film 414, respectively, which include the light reflecting microparticles and the glass frit. These holes are generated when the solvent and the binder are vaporized at burning of the paste of the material for the reflective film, which is applied to the substrate 108, or when air enters between the paste of the material for the reflective film and the substrate 108 at application of the paste to the substrate 108.

It is found that, as in the first reflective film 413, when the volume concentration of the glass frit 413b in the first reflective film 413 is small, the number of generated holes 413h increases. In the state where many holes 413h are generated, when the first reflective film 413 is plated without being coated with the second reflective film 414, the glass frit 413b in the vicinity of the front surface of the first reflective film 413 is corroded by the acid solution at plating, resulting in that the bonding force of the light reflecting microparticles 413a in the vicinity of the holes 413h lowers and thus, the light reflecting microparticles 413a are peeled. Further, since the bonding force between the holes 413h is naturally small due to the existence of the lot of holes 413h, when the glass frit 413b is corroded at plating in this state, a crack occurs between the holes 413h and the light reflecting microparticles are peeled.

However, by coating the first reflective film 413 with the second reflective film 414, and setting the volume concentration of the glass frit 414b in the second reflective film 414 to 20% or higher, the number of holes occurring in the second reflective film 414 can be reduced. Thus, even when the glass frit 414b in the second reflective film 414 is corroded by the acid solution at plating, peeling of the light reflecting microparticles 414a never occurs.

Since the number of the holes 414h existing in an interface between the first reflective film 413 and the second reflective film 414 can be also reduced by setting the volume concentration of the glass frit 414b in the second reflective film 414 to 20% or higher, adhesiveness between the first reflective film 413 and the second reflective film 414 can be improved.

By setting the volume concentration of the glass frit 414b in the second reflective film 414 to 20% (vol %) or higher, the reflective film 414 can function as a reflective film and the peeling of the second reflective film 414 itself can be prevented.

In the mounting substrate 101b in accordance with this embodiment of the present invention, since the second reflective film 414 is formed on the first reflective film 413 on the opposite side to the substrate 108, peeling of the first reflective film 413 from the substrate 108 can be prevented.

The LED module 4b using the mounting substrate 101b in accordance with this embodiment of the present invention can reflect light that is transmitted through the mounting substrate 101b and reaches the back surface 108b of the mounting substrate 101b, out of the light emitted from the LED chips 102, toward the front surface 108a of the mounting substrate 101b by the multilayer reflective film 412

That is, most of light emitted from each LED chip 102 travels from the light-emitting surface of each LED chip 102 to be away from the mounting substrate 101b by a predetermined beam angle, while a part of the light is radiated to the surface of the front surface 108a of the mounting substrate 101b and the electrode 104. Light is also radiated from the front surface 108a immediately below the LED chip 102, on which the LED chip 102 is to be mounted. Since the mounting substrate 101b is formed of a white ceramic substrate (alumina substrate), a part of light radiated to the front surface 108a is reflected, but remaining light passes through the front surface 108a and enters into the mounting substrate 101b.

In this embodiment, since the mounting substrate 101b has a thickness as thin as 1.0 mm and is translucent, the light incident on the mounting substrate 101b is transmitted through the mounting substrate 101b. However, since the multilayer reflective film 412 is formed on the back surface 108b of the mounting substrate 101b, the light transmitted through the mounting substrate 101b is reflected by the multilayer reflective film 412, and is emitted from a region of the front surface 108a of the mounting substrate 101b, in which the LED chip 102 and the electrode 104 are not formed. Thereby, the amount of the light reflected by the front surface 108a of the mounting substrate 101b is added to the amount of the light that is reflected by the multilayer reflective film 412 and is emitted from the front surface 108a of the mounting substrate 101b to increase the amount of light radiated from the front surface 108a.

Therefore, light can be efficiently extracted from the LED chips 102, thereby improving the light extraction efficiency of the LED module 4b. As a result, the amount of light radiated from the LED module 4b can be increased without increasing the amount of electricity supplied to the LED chips 102.

Further, since the LED lamp 10b in accordance with this embodiment is provided with the LED module 4b having a high light extraction efficiency, light from the LED chips 102 can be efficiently extracted to the outside of the lamp, thereby improving the luminous efficiency of the LED lamp 10b.

Next, a manufacturing method of the mounting substrate 101b in accordance with the embodiment of the present invention will be described with reference to FIG. 20.

Figure 20:
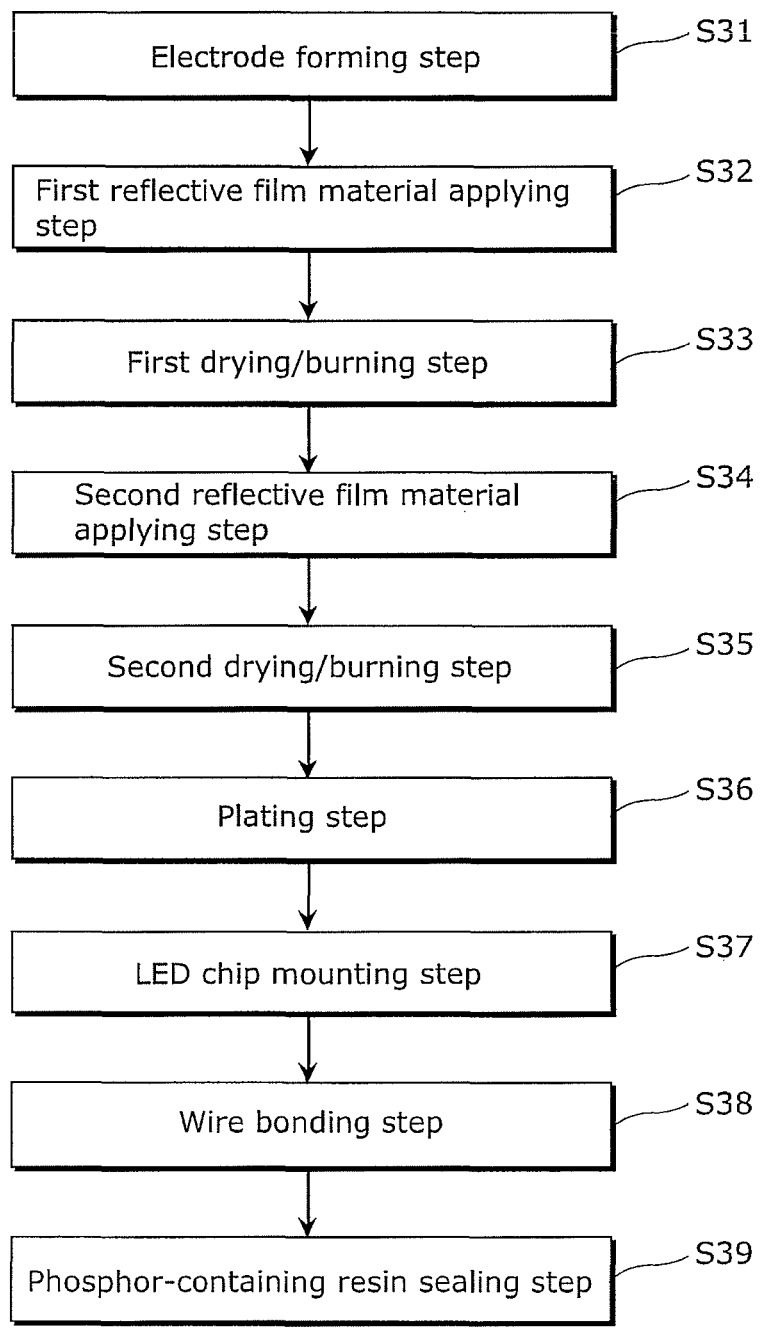
FIG. 20 is a flow chart of a manufacturing method of the mounting substrate and the LED module in accordance with Embodiment 3.

FIG. 20 is a flow chart of the manufacturing method of the LED module 4b in accordance with this embodiment, which includes the manufacturing method of the mounting substrate 101b in accordance with this embodiment. Reference numerals of constituents are the same as those in the above figures.

First, the electrodes 104 and the terminals 105 of predetermined shape are formed on the front surface 108a of the substrate as a ceramic substrate (Step S31). The electrodes 104 and the terminal 105 can be formed by applying a conductive paste in a predetermined pattern and burning them in a temperature range of 700° C. to 800° C. for 10 minutes. In this embodiment, the electrodes 104 and the terminals 105 are patterned using a silver paste including Ag as a main ingredient.

Next, powdered light reflecting microparticles 413a, glass powders, a binder, a solvent and a dispersant are prepared as materials for the first reflective film 413, a paste for forming the first reflective film 413 is made by kneading these materials, and this paste is applied to the back surface 108b of the substrate (Step S32).

Next, the substrate 108, to which the paste for the first reflective film 413 is applied, is dried at a temperature of 150° C. for 30 minutes, and then, is burnt in the range of 700° C. to 800° C., for example (Step S33). This burning softens the glass powders, resulting in that the powders of the light reflecting microparticles 413a, and the powders of the light reflecting microparticles 413a and the substrate 108 are bound (bonded) to each other via the glass frit 413b to form the first reflective film 413. This burning can be performed through heating at a highest temperature of 800° C. for 10 minutes, for example.

Next, a paste for forming the second reflective film 414 is made by kneading powdered light reflecting microparticles 414a, glass powders, a binder, a solvent and a dispersant as materials for the second reflective film 414, and the paste is applied to the surface of the first reflective film 413 (Step S34). At this time, the above-mentioned materials for the second reflective film 414 are kneaded (mixed) into the paste, for example, by means of a three-roll kneader. It is preferred that this paste is made by sufficient kneading. Such sufficient kneading of the paste can decrease the number of holes generated in the second reflective film 414 after burning.

Next, the substrate 108, to which the paste for the second reflective film 414 is applied, is dried at a temperature of 150° C. for 30 minutes and then, is burnt in the range of 700° C. to 800° C., for example (Step S35). This burning softens the glass powders, resulting in that the powders of the light reflecting microparticles 414a, and the powders of the light reflecting microparticles 414a and the first reflective film 413 are bound (bonded) to each other via the glass frit 414b to form the second reflective film 414. This burning can be performed through heating at a highest temperature of 800° C. for 10 minutes, for example.

Through Steps S32 to S35, it is possible to manufacture the mounting substrate 101b including the multilayer reflective film 412 in which the first reflective film 413 and the second reflective film 414 are stacked on the back surface 108b of the substrate.

Next, to prevent deterioration of the electrodes 104 and the terminals 105, the electrodes 104 and the terminals 105 are plated with Ni/Au (Step S36). In plating with Ni/Au, first, the mounting substrate 101b, on which the electrodes 104, the terminals 105 and the multilayer reflective film 412 are formed, is immersed in a pH4 acid solution to remove oxide and the like adhered to the surfaces of the electrodes 104 and the terminals 105. After that, the mounting substrate 101b is immersed in an Ni plating solution to be plated with Ni, forming an Ni layer (Ni coating) on the electrodes 104 and the terminals 105. Then, the mounting substrate 101b is immersed in an Au plating solution to form an Au layer (Au coating) on the Ni layer. The mounting substrate 101b may be immersed in a desired catalyst solution before immersion in the Ni plating solution. A desired reducing agent may be used at immersion in the Ni plating solution.

Next, the LED chips 102 are mounted in a predetermined region of the front surface 108a of the mounting substrate 101b (Step S37). The LED chips 102 are mounted by die-bonding to the mounting substrate 101b with a die-attachment agent or the like.

Next, to achieve desirable electrical connection between the LED chip 102 and the electrode 104, a p-side electrode (or an n-side electrode) of the LED chip 102 is bonded to the electrode 104 with the wire 107 (Step S38).

Finally, by applying the sealing member 103 onto the mounting substrate 101b, all of the LED chips 102 and the electrodes 104 on the front surface 108a of the mounting substrate 101b can be sealed with the sealing member 103 (Step S39).

In this manner, the LED module 4b in accordance with this embodiment of the present invention can be manufactured.

Modification Example 1

Figure 21:
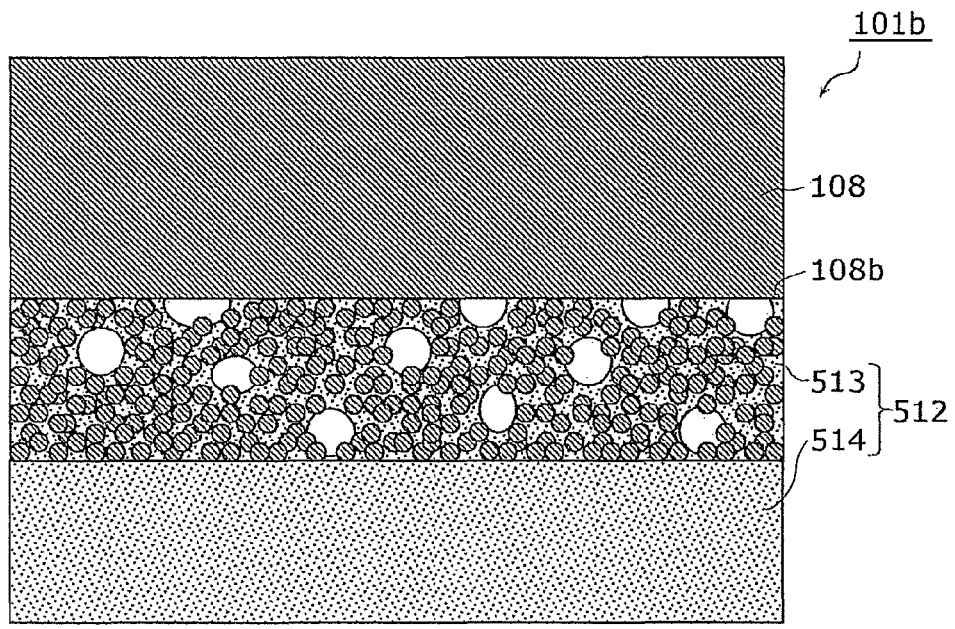
FIG. 21 is a partial enlarged sectional view of a mounting substrate in accordance with Modification example 1 of Embodiment 3.

Next, a mounting substrate 101b in accordance with Modification example 1 of this embodiment will be described with reference to FIG. 21. FIG. 21 is a partial enlarged sectional view of the mounting substrate 101b in accordance with Modification example 1. FIG. 21 corresponds to FIG. 19, and the same constituents as those in FIG. 18A to FIG. 19 are given the same reference numerals and description thereof is omitted. The constituents except for the constituents in FIG. 21 are the same as those in FIG. 15 to FIG. 18C.

The mounting substrate 101b in accordance with Modification example 1 in FIG. 21 is different from the mounting substrate 101b in accordance with this embodiment in FIG. 19 in a configuration of a multilayer reflective film. The other configuration is the same as that of the mounting substrate 101b in accordance with this embodiment.

As shown in FIG. 21, a multilayer reflective film 512 of the mounting substrate 101b in accordance with Modification example 1 is constituted of a reflective film (first film) 513 formed on the side of the substrate 108, and a protective film (second film) 514 formed on the reflective film 513 on the opposite side of the to the substrate 108.

The reflective film 513 is a first film according to the present invention, and has the same configuration as that of the first reflective film 413 in FIG. 19. Therefore, detailed description of the reflective film 513 is omitted.

The protective film 514 is the second film according to the present invention, and coats the reflective film 513. Unlike the second reflective film 414 shown in FIG. 19, the protective film 514 is made of only the glass frit. That is, the protective film 514 includes no light reflecting microparticle.

Thus, in the mounting substrate 101b in accordance with Modification example 1, even when the mounting substrate 101b is plated and is immersed in the acid solution, since the protective film 514 is formed on the reflective film 513 on the opposite side to the substrate 108, peeling of the reflective film 513 can be prevented. Further, since the protective film 514 is made of only the glass frit and does not include the light reflecting microparticles, even when plating is made, peeling of the light reflecting microparticles never occurs.

Since the glass frit is corroded by the acid solution in the plating step by 2 μm to 3 μm, it is preferred to set the thickness of the protective film 514 to 10 μm to 20 μm.

Modification Example 2

Figure 22:
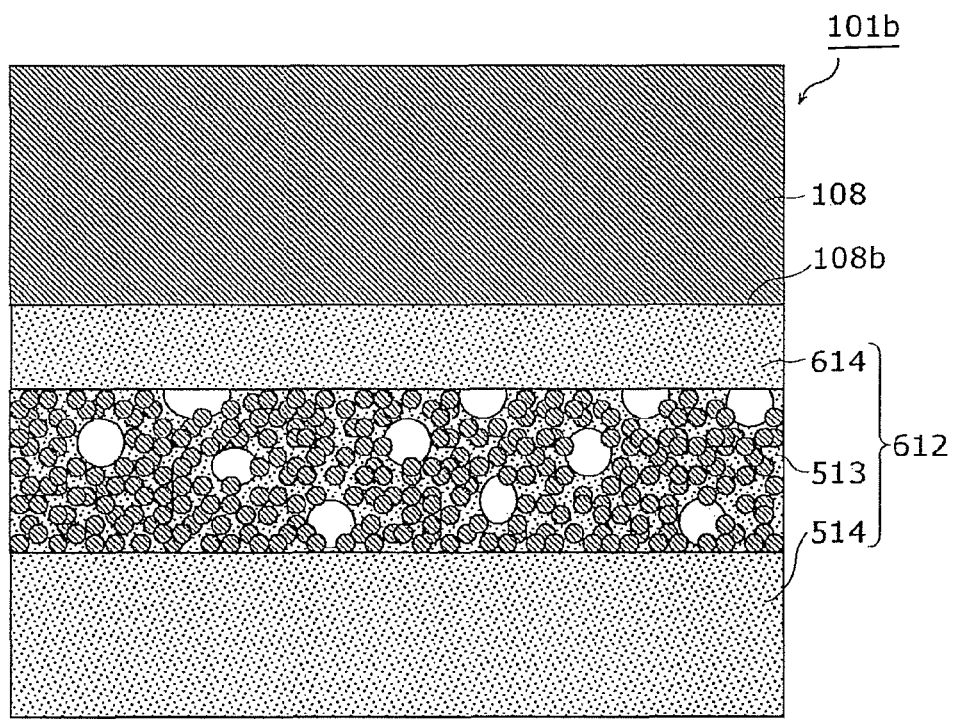
FIG. 22 is a partial enlarged sectional view of a mounting substrate in accordance with Modification example 2 of Embodiment 3.

Next, a mounting substrate 101b in accordance with Modification example 2 of this embodiment will be described with reference to FIG. 22. FIG. 22 is a partial enlarged sectional view of the mounting substrate 101b in accordance with Modification example 2. In FIG. 22, the same constituents as those in FIG. 21 are given the same reference numerals and description thereof is omitted.

The mounting substrate 101b in accordance with Modification example 2 in FIG. 22 is different from the mounting substrate 101b in accordance with Modification example 1 of this embodiment in FIG. 21 in a configuration of a multilayer reflective film. The other configuration is the same as that of the mounting substrate 101b in accordance with Modification example 1 of this embodiment.

As shown in FIG. 22, a multilayer reflective film 612 of the mounting substrate 101b in accordance with Modification example 2 is constituted of an indirect layer (third film) 614 formed between the substrate 108 and the reflective film 513, the reflective film 513, and the protective film 514.

The indirect layer 614 is a third film according to the present invention, and is made of only the glass frit. In the Modification example, the substrate 108 is adhered to the reflective film 513 with the indirect layer 614.

The mounting substrate 101b in accordance with Modification example 2 can obtain the same effect as the mounting substrate 101b in accordance with Modification example 1. Further, in the mounting substrate 101b in accordance with this modification example, since the indirect layer 614 made of only the glass frit bonds the substrate 108 to the reflective film 513, adhesiveness between the substrate 108 and the reflective film 513 can be improved.

The indirect layer 614 may be applied to the mounting substrate 101b in accordance with this embodiment in FIG. 19. That is, in the mounting substrate 101b shown in FIG. 19, the indirect layer 614 may be formed between the substrate 108 and the first reflective film 413. The indirect layer 614 may be applied to a below-mentioned mounting substrate 101b in accordance with Modification example 3.

Modification Example 3

Figure 23:
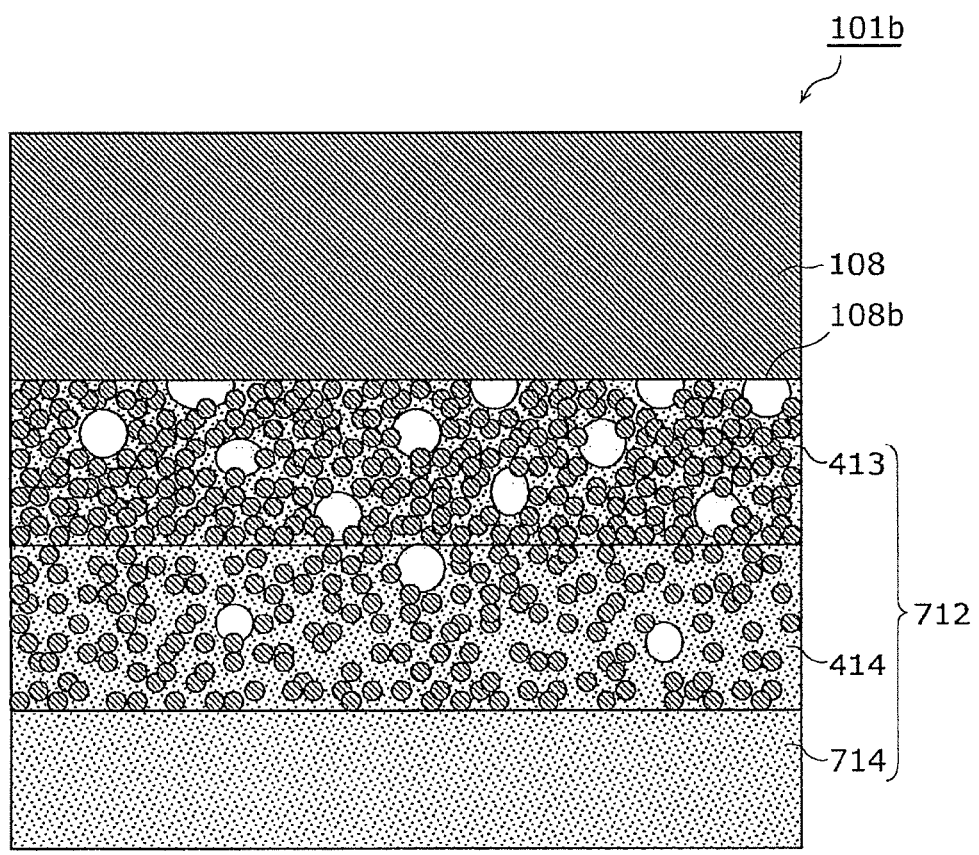
FIG. 23 is a partial enlarged sectional view of a mounting substrate in accordance with Modification example 3 of Embodiment 3.

Next, the mounting substrate 101b in accordance with Modification example 3 of this embodiment of the present invention will be described with reference to FIG. 23. FIG. 23 is a partial enlarged sectional view of the mounting substrate 101b in accordance with Modification example 3. In FIG. 23, the same constituents as those in FIG. 19 are given the same reference numerals and description thereof is omitted.

The mounting substrate 101b in accordance with Modification example 3 in FIG. 23 is different from the mounting substrate 101b in this embodiment in FIG. 19 in a configuration of a multilayer reflective film. The other configuration is the same as that of the mounting substrate 101b in accordance with this embodiment.

As shown in FIG. 23, a multilayer reflective film 712 of the mounting substrate 101b in accordance with Modification example 3 is constituted of the first reflective film 413, the second reflective film 414, and a protective film (third film) 714 formed on the opposite side of the second reflective film 414 to the first reflective film 413.

The protective film 714 is a third film according to the present invention and is formed so as to coat the second reflective film 414. The protective film 714 is made of the same film as the protective film 514 on the mounting substrate 101b in accordance with Modification example 1 in FIG. 21, and is made of only the glass frit. That is, the protective film 714 does not contain the light reflecting microparticle.

As described above, in the mounting substrate 101b in accordance with Modification example 3, even when the mounting substrate 101b is plated and immersed in an acid solution, since the protective film 714 is formed on the opposite side of the second reflective film 414 to the substrate 108, peeling of the second reflective film 414 can be prevented. Further, since the protective film 714 is made of only the glass frit and does not contain the light reflecting microparticle, even when plating is made, peeling of the light reflecting microparticles never occurs.

Since the glass frit is corroded by the acid solution in the plating step by 2 μm to 3 μm, as in Modification example 1, it is preferable to set the thickness of the protective film 714 to 10 μm to 20 μm.

Although the multilayer reflective films 412, 512, 612, 712 in this embodiment and Modification examples each are formed as two-layered film, the present invention is not limited to this and the multilayer reflective films may include other film.

Although the reflective film of the multilayer reflective film is made of the grass frit using the glass powders, the present invention is not limited to this. For example, the reflective film may be made of glass obtained by dispersing light reflecting microparticles in sol-gel glass and hardening them.

Although the LED chip 102 is connected to the electrode 104 by wire bonding in this embodiment, the present invention is not limited to this. For example, the LED chip 102 may be connected to the electrode 104 by flip-chip mounting of providing a bump between the LED chip 102 and the electrode 104.

In this embodiment, a ceramic substrate (alumina substrate) having a thickness of 1.0 mm is used as the substrate 108 of the mounting substrate 101b. However, material and thickness of the substrate 108 are not specifically limited as long as the substrate 108 has translucency to light emitted from the LED chips 102. For example, the ceramic substrate used as the substrate 108 only needs to have a thickness of 0.1 to 1.0 mm. The light from the blue LEDs can be transmitted through the ceramic substrate of such thickness. The material for the substrate 108 of the mounting substrate 101b is not limited to the ceramic substrate, and may be any translucent substrate such as a glass substrate or a film substrate. However, in the case of forming the multilayer reflective film 412 of the substrate 108 by burning under the temperature of 700° C. to 800° C., it is needed to use a substrate having a high heat-resisting property.

Although the LED module 4b in accordance with this embodiment is used as a light source for a bulb-type lamp, the present invention is not limited to this. In the case where the LED module according to the present invention is used as a light source for the bulb-type lamp, the bulb-type lamp can be applied to an illumination fixture including a lighting fixture and a lamp cover to constitute the illumination fixture including the bulb-type LED lamp.

Embodiment 4

Next, an overall configuration of an LED lamp 10c in accordance with Embodiment 4 of the present invention will be described.

Like the LED lamp 10b in accordance with Embodiment 3, the LED lamp 10c in accordance with this embodiment can prevent peeling of the light reflecting microparticles of the reflective film.

Figure 24:
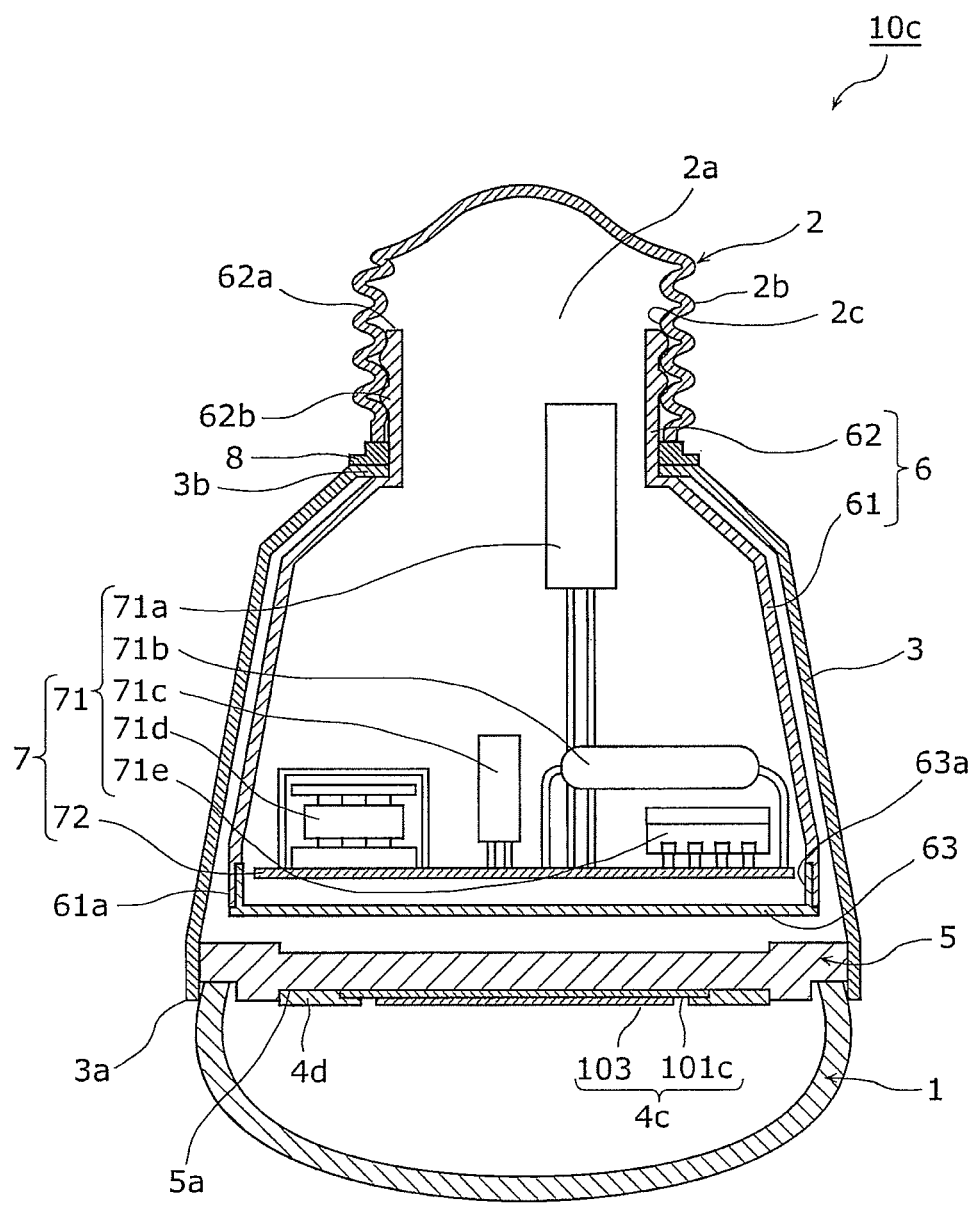
FIG. 24 is a sectional view of an LED lamp in accordance with Embodiment 4 of the present invention.
Figure 25:
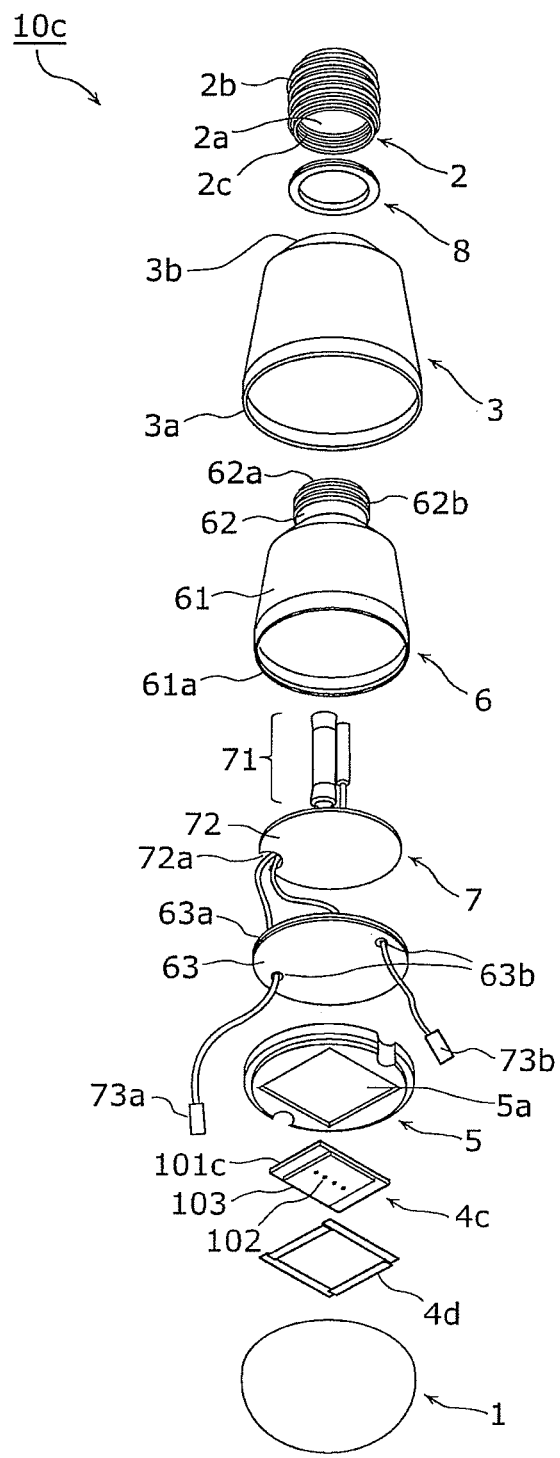
FIG. 25 is an exploded perspective view of the LED lamp in accordance with Embodiment 4.

FIG. 24 is a sectional view of the LED lamp 10c in accordance with this embodiment. FIG. 25 is an exploded perspective view of the LED lamp 10c in accordance with this embodiment.

The LED lamp 10c includes the globe 1, the base 2, the heat sink 3, an LED module 4c, the light source attaching member 5, the resin case 6, the power source circuit 7 and the insulating ring 8. The LED lamp 10c is different from the LED lamp 10a in accordance with Embodiment 2 shown in FIG. 8 and FIG. 9 in that the LED module 4a is replaced with the LED module 4c having a mounting substrate 101c. Specifically, the LED lamp 10c is different from the LED lamp 10a in accordance with Embodiment 2 in that the volume concentration of the glass frit in a reflective film (first reflective film) 812 of the mounting substrate 101c is set to be 20% or higher.

Figure 26:
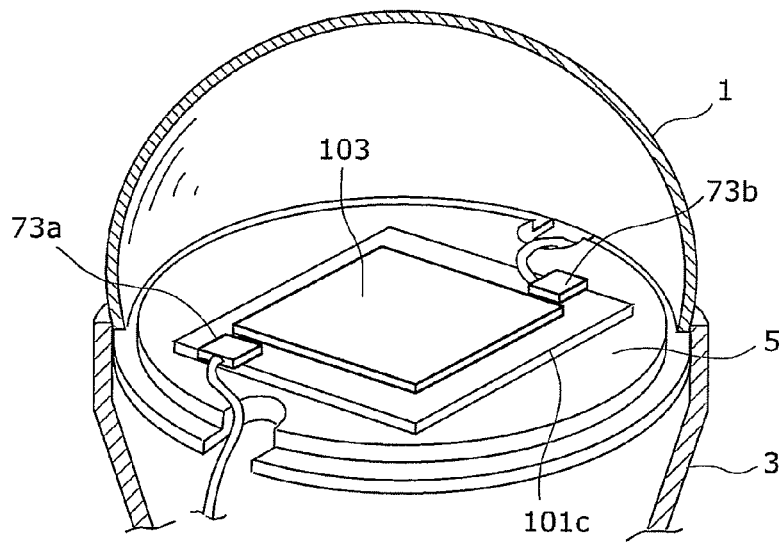
FIG. 26 is a partial cutaway perspective view of the LED lamp in accordance with Embodiment 4.

FIG. 26 is a partial cutaway perspective view of the LED lamp 10c in accordance with this embodiment, which shows a state where the LED module 4c is arranged on the light source attaching member 5.

As shown in FIG. 26, the LED module 4c is arranged on the light source attaching member 5. The two electrodes 73a, 73b connected to the lead wires extending from the power output unit of the power source circuit 7 are connected to terminal electrodes of the LED module 4c. The two electrodes 73a, 73b supply DC power to the LED module 4c, thereby causing the LED chips of the LED module 4c to emit light. Thereby, illumination light is emitted from the LED module 4c.

Figure 27A:
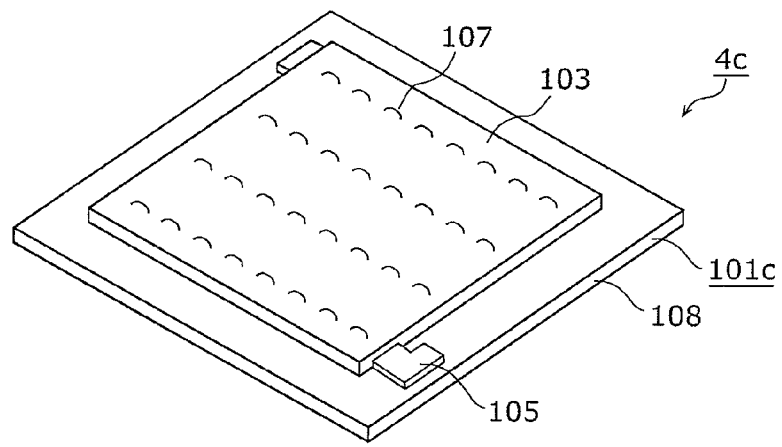
FIG. 27A is a perspective view of an appearance of the LED lamp in accordance with Embodiment 4.
Figure 27B:
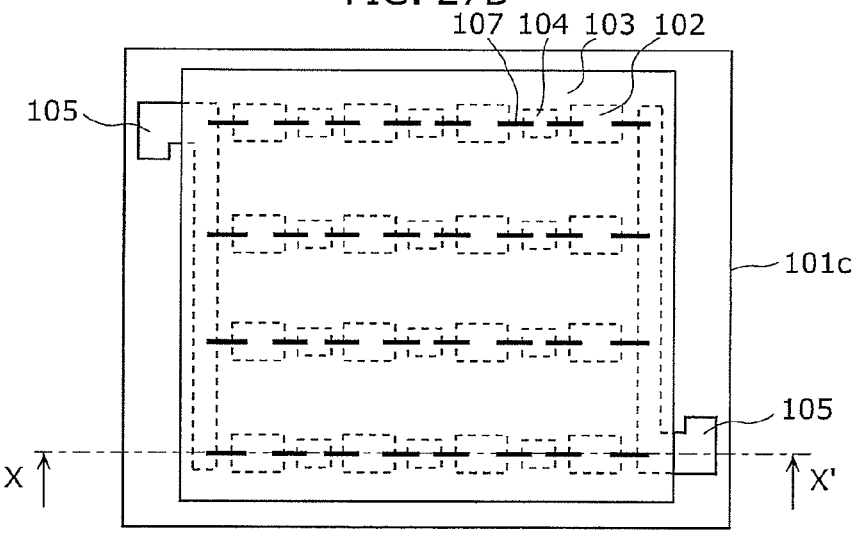
FIG. 27B is a plan view of an LED module in accordance with Embodiment 4.

Next, the LED module 4c provided in the LED lamp 10c will be described with reference to FIG. 27A to FIG. 27C. FIG. 27A is a perspective view showing an appearance of the LED module 4c in accordance with this embodiment. FIG. 27B is a plan view of the LED module 4c in accordance with this embodiment. FIG. 27C is a sectional view of the LED module 4c cut along a line X-X' in FIG. 27B.

As shown in FIG. 27A to FIG. 27C, the LED module 4c in this embodiment is a surface-mount light-emitting module (luminous unit) emitting predetermined illumination light, which includes the mounting substrate 101c, the plurality of LED chips 102 mounted on the mounting substrate 101c, the sealing member 103 coating the LED chips 102, the electrodes (wiring electrodes) 104 formed on the mounting substrate 101b in a predetermined pattern, the terminals (terminal electrodes) 105 that receive predetermined DC power from the power source circuit 7 and supply the DDC power to the LED chips 102 via the electrodes 104 and the wires 107, and the wires 107 electrically connecting the LED chips 102 to the respective electrodes 104.

As shown in FIG. 27C, the mounting substrate 101c is a substrate on which the LED chips 102 are to be mounted, and is formed of the substrate 108 and the reflective film (first reflective film) 812.

The substrate 108 has one principal surface (front surface) 108a as the mounting surface on which the LED chips 102 are mounted and the other principal surface (back surface) 108b as the surface on the opposite side to the front surface 108a. The substrate 108 is a translucent substrate having the translucency to light emitted from the LED chips 102 to allow the light emitted from the LED chip 102 to transmit. The substrate 108 may be any substrate having a transmittance to the light emitted from the LED chip 102 of 1% or higher. The substrate 108 is preferably, a substrate having an excellent heat radiating property and a high thermal conductivity so as to efficiently radiate heat of the LED chips 102. In this embodiment, a ceramic substrate having a transmittance of 2% and a thermal conductivity of 25 (W/m·K) is used.

The reflective film 812 mainly consists of the light reflecting microparticles and the glass frit and as shown in FIG. 27C, coats the back surface 108b of the substrate. The reflective film 812 is a highly reflective film capable of reflecting light that is emitted from the LED chips 102, is transmitted through the substrate 108 and reaches the back surface 108b of the substrate toward the front surface 108a of the substrate.

The light reflecting microparticles (metal oxide microparticles) included in the reflective film 812 are made of a material that reflects light from the LED chips, and has a high reflectivity for visible light. Examples of the light reflecting microparticles include metal oxide microparticles of rutile-type or anatase-type titanium oxide, magnesium oxide, zirconium oxide, aluminum oxide and zinc oxide. It is noted that microparticles of the light reflecting microparticles refer to particles having a particle size of a few μm or smaller. In this embodiment, rutile-type titanium oxide ($TiO_2$) having a particle size of 0.20 μm is used as the light reflecting microparticles.

The glass frit is a binding material that serves to bind the light reflecting microparticles to the substrate 108, and has a high transmittance to visible light. The glass frit is made of a material including oxide silicon ($SiO_2$) as a main ingredient. The glass frit can be formed by heating and melting glass powders. In this embodiment, glass powders for the glass frit may be $SiO_2$-$B_2O_3$-$R_2O$ (where, $R_2O$ is $Li_2O$, $Na_2O$, or $K_2O$).

The reflective film 812 of the mounting substrate 101c is configured such that the volume concentration of the glass frit in the reflective film 812 is 20% (vol %) or higher. With such configuration, peeling of the light reflecting microparticles from the substrate 108 can be prevented. Further, it is preferred to set the volume concentration of the glass frit to 60% or lower. Furthermore, it is preferred that the thickness of the reflective film 812 is 20 μm or larger. Thereby, the reflectivity of the reflective film 812 for visible light can be made 90% or higher to realize a highly reflective film having the same reflectivity as the film using the reflective plate made of elemental metals.

The LED chips 102 each are a semiconductor light-emitting element according to the present invention, and in this embodiment, a bare chip that emits monochromic visible light. The LED chips 102 are mounted on the front surface 108a of the mounting substrate 101c. The LED chips 102 emit light to all directions, that is, sideways, upward and downward, and for example, emit 20% of light sideways, 60% of light upward and 20% of light downward in light amount.

The sealing member (phosphor-containing resin) 103 is made of resin containing predetermined phosphor particles, coats the LED chips 102 to seal the LED chips 102 and the electrodes 104 as well as converts color of light emitted from the LED chips 102 to radiate illumination light of desired color. The sealing member 103 is configured by dispersing predetermined phosphor particles converting color of light from the LED chips 102 in a translucent material such as silicone resin, and the phosphor particles convert the light emitted from the LED chips 102 into illumination light of desired color.

The electrodes 104 is a predetermined wiring pattern formed on the front surface of the substrate 108 (the front surface 108a of the mounting substrate 101b) and is electrically connected to the LED chip 102 via the wire 107. In this embodiment, the Ag electrode made of Ag is used as the electrode 104. The electrode 104 is plated with Ni/Au, such that the Ni layer and the Au layer are stacked on the front surface of the electrode 104.

The terminal 105 is an electrode pad provided on the outer circumferential front surface of the substrate 108, and receives DC power from the power source circuit 7. The terminal 105 is also plated with Ni/Au, such that the Ni layer and the Au layer are stacked on the front surface of the terminal 105.

Each of the wires 107 is, for example, a gold wire, and the LED chip 102 and the electrode 104 are electrically connected to each other by wire bonding.

In this embodiment, as shown in FIG. 27B, the 16 LED chips 102 are mounted on the mounting substrate 101c, and the four LED chips arranged in a line are serially connected to one another. The lines of the LED chips 102 are connected to one another in parallel.

In the LED module 4c in accordance with this embodiment, emitted illumination light is set to have white color. Thus, first, blue LEDs emitting blue light having a central wavelength of 450 to 470 nm are used as the LED chips 102. Semiconductor light-emitting elements configured by forming GaN compound semiconductor layer on a translucent substrate can be used as the blue LEDs.

Next, yellow phosphor particles exciting yellow light by light emitted from the LED chips 102 are used as the phosphor particles included in the sealing member 103. A YAG (yttrium aluminum garnet) phosphor material can be used for the yellow phosphor particles.

As described above, in the LED module 4c in accordance with this embodiment, blue LEDs emitting blue light are used as the LED chips 102, and the yellow phosphor particles are used as the phosphor particles of the sealing member 103. As a result, the yellow phosphor is excited by the blue light emitted from the blue LEDs to radiate yellow light. Then, yellow light from the yellow phosphor is combined with the blue light from the blue LEDs to generate white light, and the white light radiated from the LED module 4c.

The material for the LED chips 102 or the phosphor, or combination of the LED chips 102 and the phosphor is not limited to the above-mentioned one.

Next, effects of the mounting substrate 101c in accordance with the embodiment of the present invention will be described with reference to FIG. 28 to FIG. 30B. FIG. 28 is a table showing relationship between the volume concentration of the glass frit in the reflective film and peeling of the light reflecting microparticles in the mounting substrate on which the reflective film including the light reflecting microparticles and the glass frit is formed. The ratio of the kneaded titanium oxide (titania powders) and the glass powders was adjusted such that the volume concentration of the glass frit becomes each predetermined value shown in FIG. 28 to form the reflective film. After the Ag electrode formed on the ceramic substrate was plated with Ni/Au, the peeling state of the reflective film was examined. The peeling state of the reflective film was determined by sticking an adhesive tape to the plated reflective film, removing the adhesive tape and then, checking whether or not the reflective film remains on the adhesive tape remains. In FIG. 28, "0" represents the state where no reflective film remains on the adhesive sheet, and "X" represents the state where the reflective film, if only a little, remains on the adhesive sheet. For this experiment, a dozen or so reflective films having each volume concentration of the glass frit were produced, and the reflective films having the same volume concentration of the glass frit achieved the same result.

As shown in FIG. 28, when the volume concentration of the glass frit in the reflective film 812 was 10%, the reflective film 812 (titanium oxide) was peeled. and when the volume concentration of the glass frit was 20% or higher, the reflective film 812 was not peeled.

As described above, even when the mounting substrate 101c is plated, by setting the volume concentration of the glass frit in the reflective film 812 to 20% or higher, peeling of the reflective film 812 can be prevented.

Figure 29B:
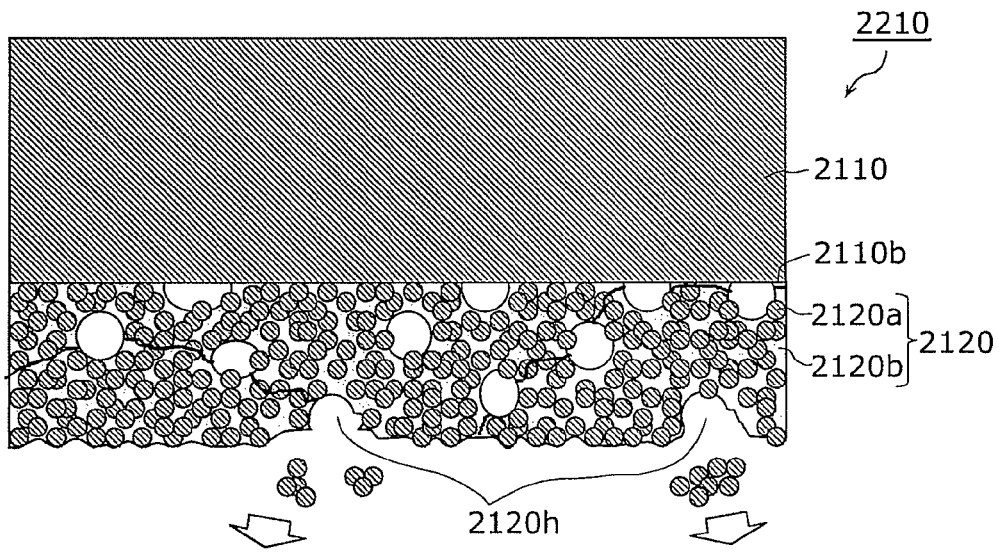
FIG. 29B is a partial enlarged sectional view of the mounting substrate in accordance with Comparative example after plating.
Figure 30A:
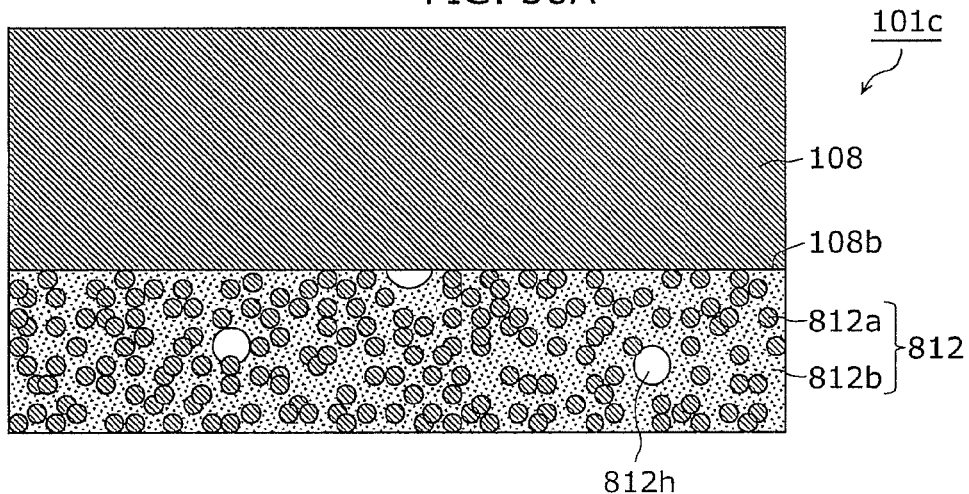
FIG. 30A is a partial enlarged sectional view of a mounting substrate in accordance with Embodiment 4 before plating.
Figure 30B:
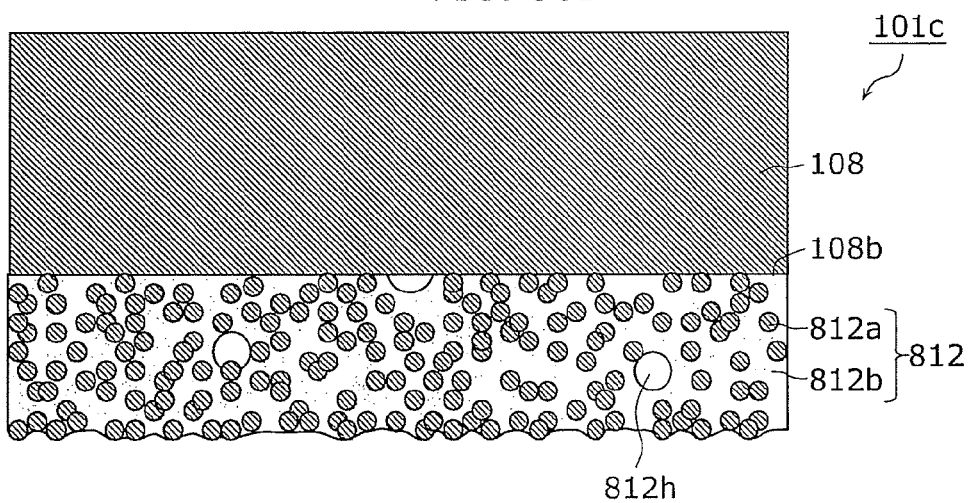
FIG. 30B is a partial enlarged sectional view of the mounting substrate in accordance with Embodiment 4 after plating.

Next, a state where the reflective film 812 is peeled will be described with reference to FIG. 29A to FIG. 30B. FIG. 29A to FIG. 30B are views showing a detailed configuration of the reflective film, FIG. 29A and FIG. 29B are partial enlarged sectional views of a mounting substrate in accordance with Comparative example, and FIG. 30A and FIG. 30B are enlarged view of a region A surrounded by a broken line in FIG. 27C and partial enlarged sectional views of the mounting substrate 101c in accordance with this embodiment. In these figures, FIG. 29A is a partial enlarged sectional view of the mounting substrate in accordance with Comparative example before plating, and FIG. 29B is a partial enlarged sectional view of the mounting substrate in accordance with Comparative example after plating. FIG. 30A is a partial enlarged sectional view of the mounting substrate 101c in accordance with this embodiment before plating, and FIG. 30B is a partial enlarged sectional view of the mounting substrate 101c in accordance with this embodiment after plating.

In the mounting substrate 2210 in accordance with Comparative example shown in FIG. 29A and FIG. 29B, a reflective film 2120 made of light reflecting microparticles 2120a of titanium oxide and a glass frit 2120b is formed on a back surface 2110b of a substrate 2110, and the volume concentration of the glass frit 2120b in the reflective film 2120 is set to 10%. In the mounting substrate 101c in accordance with this embodiment shown in FIG. 30A and FIG. 30B, the reflective film 812 is made of light reflecting microparticles 812a of titanium oxide and a glass frit 812b, and the volume concentration of the glass frit 812b in the reflective film 812 is set to 30%.

As shown in FIG. 29A, in the mounting substrate 2210 in accordance with Comparative example, a lot of holes 2120h are generated in the reflective film 2120. The holes 2120h are generated when the solvent and the binder are vaporized at burning of the paste of the material for the reflective film, which is applied to the substrate 2120, or when air enters between the paste of the material for the reflective film and the substrate 2110 at application of the paste to the substrate 2110.

When the substrate 2110 is plated in this state, as shown in FIG. 29B, the glass frit 2120b is corroded by the acid solution at plating, resulting in that the bonding force of the light reflecting microparticles 2120a in the vicinity of the holes 2120h lowers and thus, the light reflecting microparticles 2120a are peeled. Further, since the bonding force between the light reflecting microparticles 2120a is naturally small due to the existence of the lot of holes 2120h, when the glass frit 2120b is corroded at plating in this state, a crack occurs between the holes 2120h as shown in a thick curved line in FIG. 29B, and the light reflecting microparticles 2120a may be peeled.

On the contrary, in the mounting substrate 101c in accordance with this embodiment shown in FIG. 30A, as compared to the mounting substrate 2210 in accordance with Comparative example shown in FIG. 29A, the number of holes 812h generated in the reflective film 812 is decreased. The holes 812h decrease especially in the vicinity of an exposed surface of the reflective film 812 corroded by the acid solution. Thus, even when the glass frit 812b is corroded by the acid solution at plating, as shown in FIG. 30B, the light reflecting microparticles 812a are not peeled. Further, as shown in FIG. 30A and FIG. 30B, since the holes 812h existing in an interface between the substrate 108 and the reflective film 812 also decrease, adhesiveness between the substrate 108 and the reflective film 812 can be improved.

Figure 31:
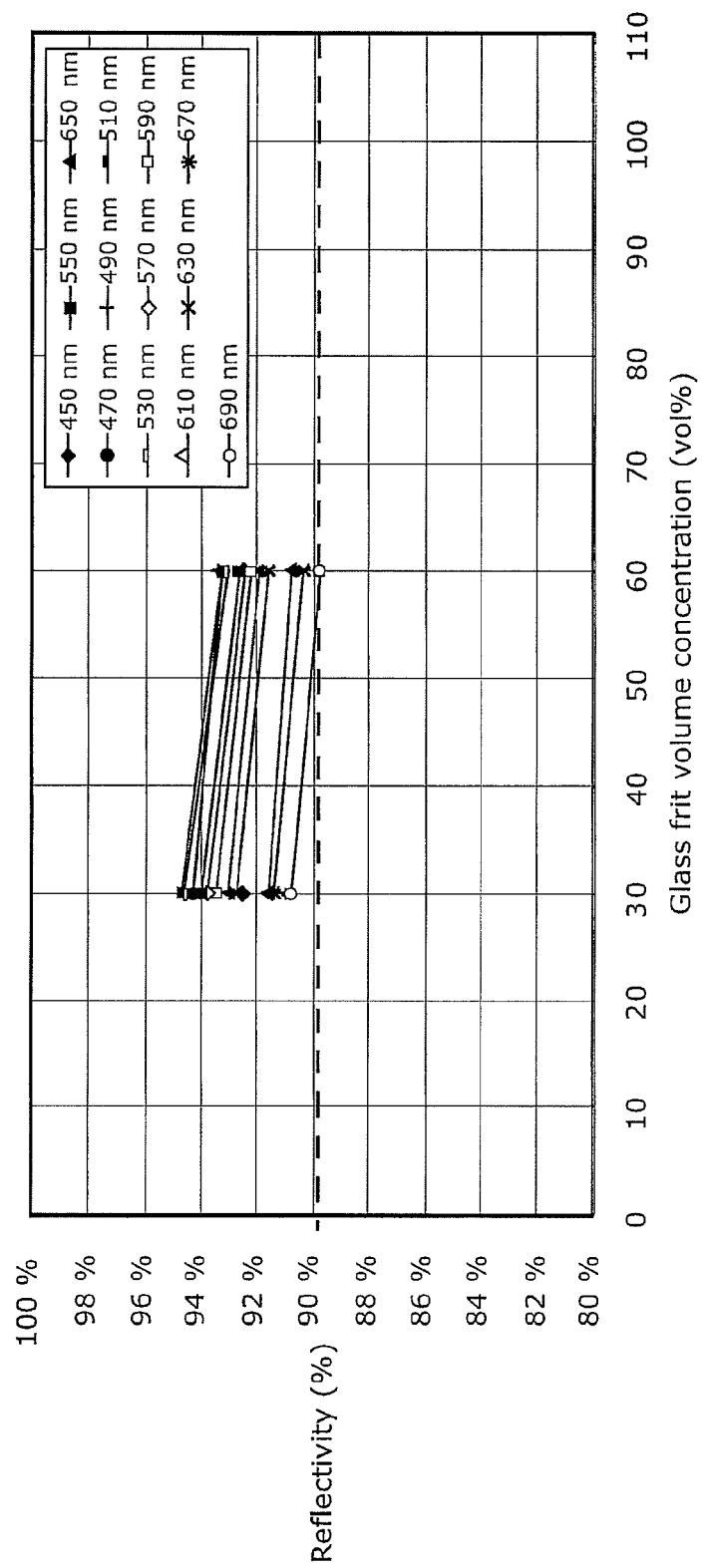
FIG. 31 is a graph showing relationship between the volume concentration of the glass frit and reflectivity in the case of varying the volume concentration of the glass frit.

Next, an experiment on relationship between the volume concentration of the glass frit 812b in the reflective film 812 and reflectivity in accordance with this embodiment was conducted. Experiment results will be described below with reference to FIG. 31. FIG. 31 is a graph showing the relationship between the volume concentration of the glass frit 812b and the reflectivity in the case of varying the volume concentration of the glass frit 812b. In measurement shown in FIG. 31, the mounting substrate 101c, in which the reflective film 812 having a thickness of 30 μm was formed on the ceramic substrate having an alumina purity of 96% and a thickness of 1.0 mm, was used. The reflectivity was measured by irradiating the mounting substrate 101c with visible light having a wavelength domain of 450 to 690 nm by means of a spectrometer.

It is preferred that the reflectivity of the reflective film 812 on the mounting substrate 101c in accordance with this embodiment is the same as the reflectivity of metals, that is, 90% or higher. Considering that the wavelength domain up to about 700 nm using a wavelength of 550 nm of green light as a central wavelength is enough for the wavelengths contained reflected light, as shown in FIG. 31, it is preferred that the volume concentration of the glass frit 812b in the reflective film 812 is about 60% or smaller. By making the volume concentration of the glass frit 812b about 60% or smaller, the reflectivity of the reflective film 812 for visible light can be made 90% or higher, realizing the reflective film having the same reflectivity as the reflective film made of elemental metals.

Figure 32:
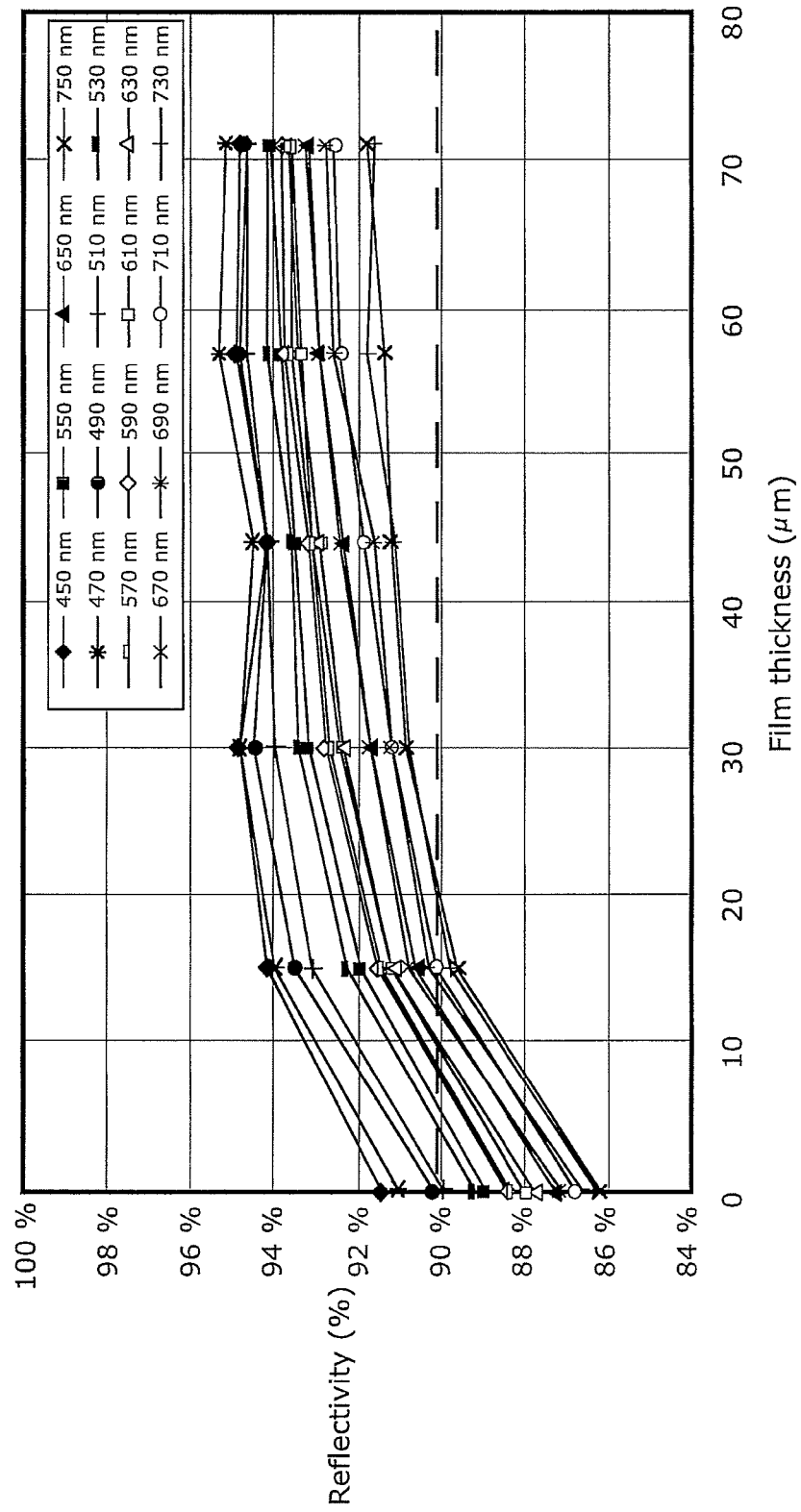
FIG. 32 is a graph showing relationship between thickness of the reflective film and reflectivity in the case of varying the thickness of the reflective film.

Next, an experiment on relationship between the thickness of the reflective film 812 and the reflectivity in accordance with this embodiment was conducted. Experiment results will be described below with reference to FIG. 32. FIG. 32 is a graph showing the relationship between the thickness of the reflective film 812 and the reflectivity in the case of varying the thickness of the reflective film 812. The volume concentration of the glass frit in the reflective film in FIG. 32 is 30%.

As described above, it is preferred that the reflectivity necessary for the reflective film 812 is 90% or higher. Similarly, considering that about 700 nm at maximum is enough for the wavelengths contained in reflected light, as shown in FIG. 32, it is preferred that the thickness of the reflective film 812 is 20 μm or larger. When the thickness of the reflective film 812 exceeds 30 μm, the reflectivity is saturated and is not further improved. That is, the thickness of the reflective film 812 is desirably, 30 μm or smaller.

The mounting substrate 101c in accordance with this embodiment can prevent the reflective film 812 made of the light reflecting microparticles 812a and the glass frit 812b from being peeled from the substrate 108, and adhesiveness of the reflective film 812 to the substrate 108 can be improved. As described above, by setting the volume concentration of the glass frit 812b in the reflective film 812 and the thickness of the reflective film 812 to desired values, the reflective film 812 having a high reflectivity can be realized. Thereby, the mounting substrate 101c having the high-reliability and high-performance reflective film 812 can be provided.

The LED module 4c using the mounting substrate 101c in accordance with this embodiment can light that is emitted from the LED chips 102, is transmitted through the mounting substrate 101c and reaches the back surface 108b of the mounting substrate 101c, out of the light emitted from the LED chips 102, on the reflective film 812 toward the front surface 108a of the mounting substrate 101c.

That is, most of light emitted from each LED chip 102 travels from the light-emitting surface of each LED chip 102 to be away from the mounting substrate 101c by a predetermined beam angle, while a part of the light is radiated to the surface of the front surface 108a of the mounting substrate 101b and the electrode 104. Light is also radiated from the front surface 108a immediately below the LED chip 102, on which the LED chip 102 is to be mounted. Since the mounting substrate 101c is formed of a white ceramic substrate (alumina substrate), a part of light radiated to the front surface 108a is reflected, but remaining light passes through the front surface 108a and enters into the mounting substrate 101c.

In this embodiment, since the mounting substrate 101c has a thickness as thin as 1.0 mm and is translucent, the light incident on the mounting substrate 101b is transmitted through the mounting substrate 101c. However, since the multilayer reflective film 412 is formed on the back surface 108b of the mounting substrate 101c, the light transmitted through the mounting substrate 101b is reflected by the multilayer reflective film 412, and is emitted from a region in the front surface 108a of the mounting substrate 101c, in which the LED chip 102 and the electrode 104 are not formed. Thereby, the amount of the light reflected by the front surface 108a of the mounting substrate 101c is added to the amount of the light that is reflected by the multilayer reflective film 412 and is emitted from the front surface 108a of the mounting substrate 101c to increase the amount of light radiated from the front surface 108a.

Therefore, light can be efficiently extracted from the LED chips 102, thereby improving the light extraction efficiency of the LED module 4c. As a result, the amount of light radiated from the LED module 4c can be increased without increasing the amount of electricity supplied to each of the LED chips 102.

Further, since the LED lamp 10c in accordance with this embodiment is provided with the LED module 4c having a high light extraction efficiency, light from the LED chips 102 can be efficiently extracted to the outside of the lamp, thereby improving the luminous efficiency of the LED lamp 10c.

Next, a manufacturing method of the mounting substrate in accordance with the embodiment of the present invention will be described with reference to FIG. 33.

Figure 33:
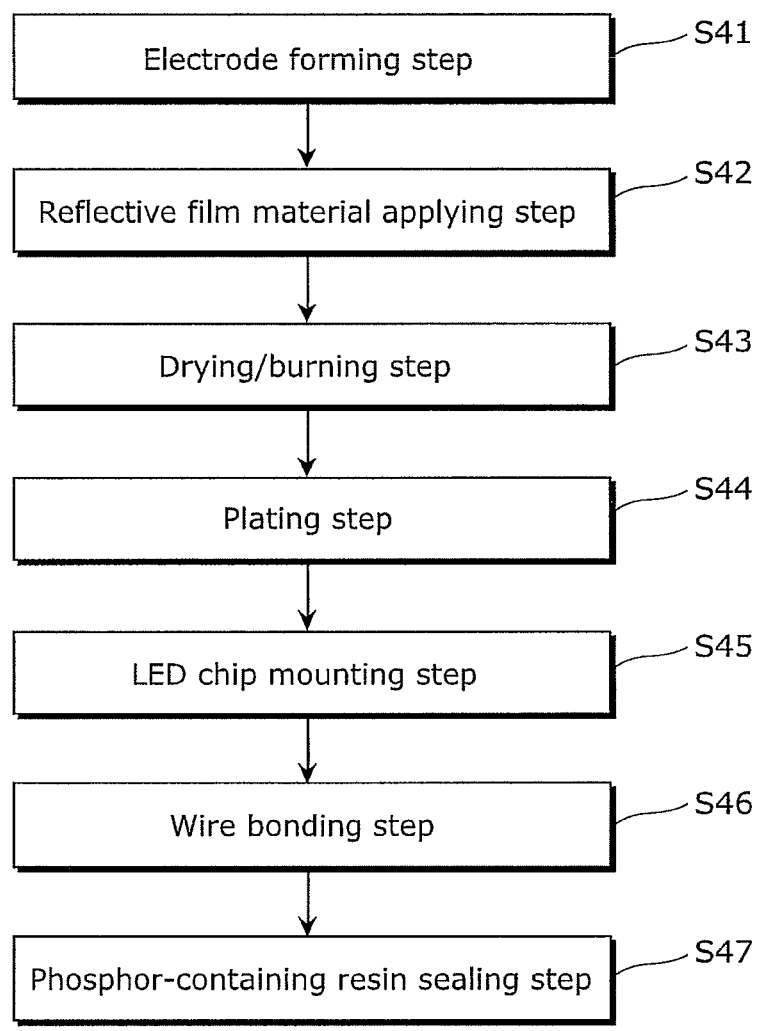
FIG. 33 is a flow chart showing a manufacturing method of the mounting substrate and an LED module in accordance with Embodiment 4.

FIG. 33 is a flow chart of the manufacturing method of the LED module 4c in accordance with this embodiment, which includes the manufacturing method of the mounting substrate in accordance with this embodiment. Reference numerals of constituents are the same as those in the above figures.

First, the electrodes 104 and the terminals 105 of predetermined shape are formed on the front surface of the substrate 108a as a ceramic substrate (Step S41). The electrodes 104 and the terminals 105 can be formed by applying a conductive paste in a predetermined pattern and burning them in the temperature range of 700° C. to 800° C. for 10 minutes. In this embodiment, the electrodes 104 and the terminals 105 are patterned using a silver paste containing Ag as a main ingredient.

Next, a paste for forming the reflective film is made by kneading powdered light reflecting microparticles 812a, glass powders, a binder, a solvent and a dispersant, and the paste is applied to the back surface 108b of the substrate (Step S42). At this time, the above-mentioned materials for the reflective film 812 are kneaded (mixed) into the paste, for example, by means of a three-roll kneader. It is preferred that this paste is made by sufficient kneading. Such sufficient kneading of the paste can decrease the number of holes 812h occurring in the reflective film 812 after burning.

Next, the substrate 108 to which the paste of the materials for the reflective film is applied is dried at a temperature of 150° C. for 30 minutes and then, is burnt in the range of 700° C. to 800° C., for example (Step S43). This burning softens the glass powders, resulting in that the powders of the light reflecting microparticles 812a, and the powders of the light reflecting microparticles 812a and the substrate 108 are bound (bonded) to each other via the glass frit 812b to form the reflective film 812. This burning can be performed through heating at a highest temperature of 800° C. for 10 minutes, for example.

In Step S42 to S43, the mounting substrate 101c in which the reflective film 812 is formed on the back surface 108b of the substrate can be manufactured Next, to prevent deterioration of the electrodes 104 and the terminals 105, the electrodes 104 and the terminals 105 are plated with Ni/Au (Step S44). In plating with Ni/Au, first, the mounting substrate 101c, on which the electrodes 104, the terminals 105 and the reflective film 812 are formed, is immersed in a pH4 acid solution to remove oxide and the like adhered to the surfaces of the electrodes 104 and the terminals 105. After that, the mounting substrate 101c is immersed in an Ni plating solution to be plated with Ni, forming an Ni layer (Ni coating) on the electrodes 104 and the terminals 105. Then, the mounting substrate 101c is immersed in an Au plating solution to form an Au layer (Au coating) on the Ni layer. The mounting substrate 101c may be immersed in a desired catalyst solution before immersion in the Ni plating solution. A desired reducing agent may be used at immersion in the Ni plating solution.

Next, the LED chips 102 are mounted in a predetermined region of the front surface 108a of the mounting substrate 101c (Step S45). The LED chip 102 is mounted by die-bonding to the mounting substrate 101c with a die-attachment agent or the like.

Next, to achieve desirable electrical connection between the LED chip 102 and the electrode 104, a p-side electrode (or an n-side electrode) of the LED chip 102 is bonded to the electrode 104 with the wire 107 (Step S46).

Finally, by applying the sealing member 103 onto the mounting substrate 101c, all of the LED chips 102 and the electrodes 104 on the front surface 108a of the mounting substrate 101c are sealed with the sealing member 103 (Step S47).

In this manner, the LED module 4c in accordance with this embodiment can be manufactured.

Although the mounting substrate, the manufacturing method thereof, the light-emitting module and the lamp according to the present invention have been described based on the embodiments, the present invention is not limited to the above-mentioned embodiments.

For example, in this embodiment, the reflective film 812 made of the glass frit using the glass powders. However, the reflective film may be made of glass obtained by dispersing light reflecting microparticles in sol-gel glass and hardening them.

Although the LED chip 102 is connected to the electrode 104 by wire bonding in this embodiment, the present invention is not limited to this. For example, the LED chip 102 may be connected to the electrode 104 by flip-chip mounting of providing a bump between the LED chip 102 and the electrode 104.

Although the ceramic substrate (alumina substrate) having a thickness of 1.0 mm is used as the substrate 108 of the mounting substrate 101c in this embodiment, the material and thickness of the substrate 108 are not specifically limited as long as the substrate 108 is translucent to light from the LED chips 102. For example, when the ceramic substrate is used as the substrate 108, the substrate only needs to have a thickness of 0.1 to 1.0 mm. Light from blue LEDs can be transmitted through the ceramic substrate of this thickness. The substrate 108 of the mounting substrate 101c is not limited to the ceramic substrate, and may be any translucent substrate such as a glass substrate or a film substrate. However, when the reflective film 812 of the substrate 108 is formed by burning at 700° C. to 800° C., it is need to use a substrate having a high heat-resisting property.

Although the LED module 4c in accordance with this embodiment is used as a light source for the bulb-type lamp, the present invention is not limited to this. When the LED module according to the present invention is used as the light source for the bulb-type lamp, the bulb-type lamp can be applied to an illumination fixture including a lighting fixture and a lamp cover to constitute the illumination fixture including the bulb-type LED lamp.

Embodiment 5

An overall configuration of an illumination fixture 3200 in accordance with Embodiment 5 of the present invention will be described below.

Figure 34:
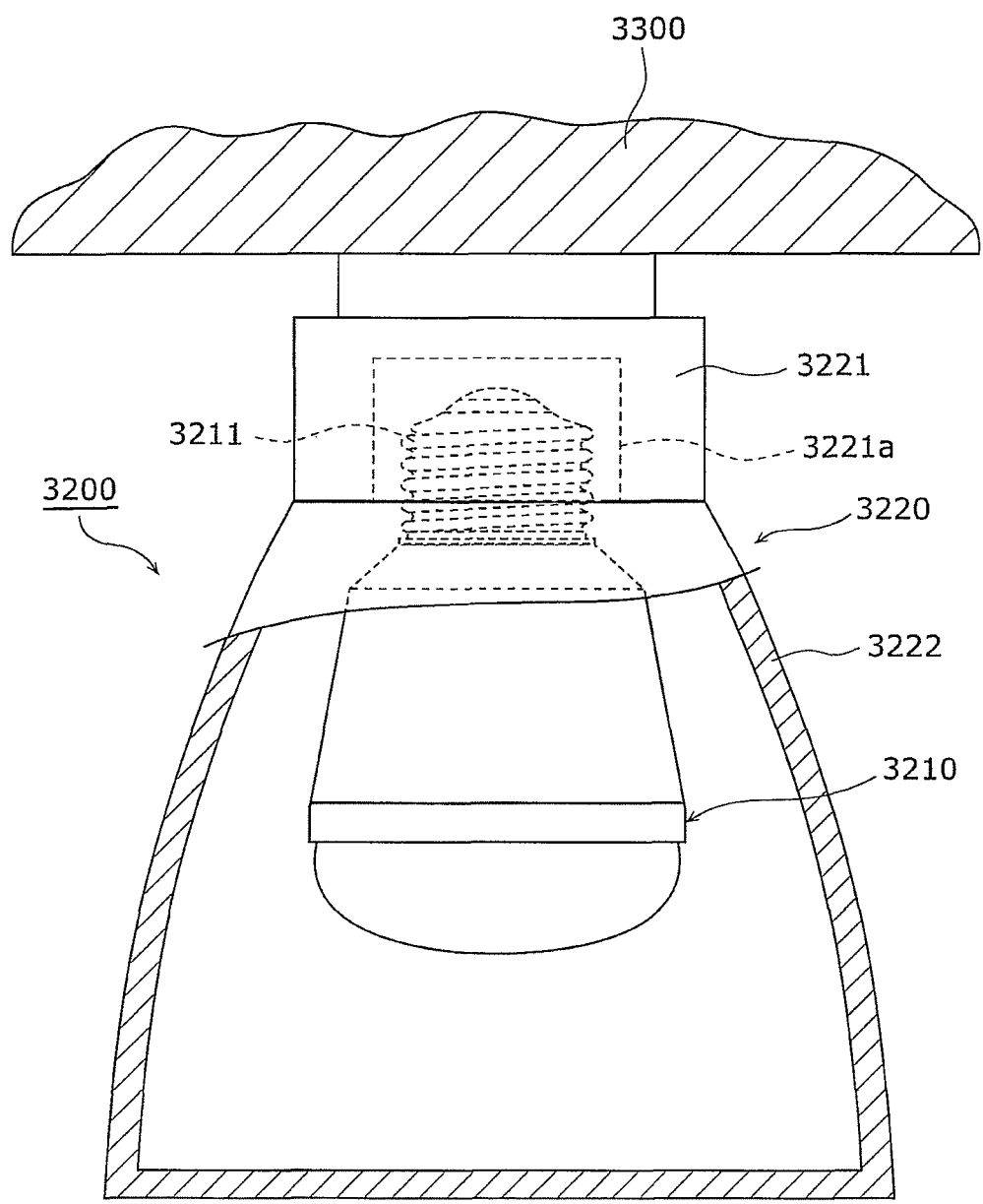
FIG. 34 is a schematic sectional view of an illumination fixture in accordance with Embodiment 5 of the present invention.

FIG. 34 is a schematic sectional view of the illumination fixture 3200 in accordance with Embodiment 5.

The illumination fixture 3200 is attached to, for example, an indoor ceiling 3300 in use, and as shown in FIG. 34, includes an LED lamp 3210 and a lighting fixture 3220. The LED lamps according to Embodiments 1 to 4 can be used as the LED lamp 3210.

The lighting fixture 3220 turns on or off the LED lamp 3210, and includes a fixture body 3221 attached to the ceiling 3300 and a lamp cover 3222 covering the LED lamp 3210.

The fixture body 3221 has a socket 3221a into which a base 3211 of the LED lamp 3210 is screwed, and predetermined power is supplied to the LED lamp 3210 via the socket 3221a.

The illumination fixture 3200 is merely an example, and any illumination fixture provided with the socket 3221a, into which a base 3211 of the LED lamp 3210 is screwed, may be adopted. Although the illumination fixture 3200 includes one lamp, an illumination fixture including a plurality of, for example, two lamps may be adopted.

As described above, since the illumination fixture 3200 in this embodiment includes the LED lamp according to any one of Embodiments 1 to 4, the luminous efficiency can be sufficiently improved.

Although the mounting substrate, the manufacturing method thereof, the light-emitting module and the illumination device according to the present invention have been described based on the embodiments, the present invention is not limited to these embodiments. Various modification that could be devised by those skilled in the art so as not to deviate from the subject matter of the present invention fall within the scope of the present invention. In addition, the constituents of the plurality of embodiments may be combined with each other so as not to deviate from the subject matter of the present invention.

INDUSTRIAL APPLICABILITY

The present invention can be applied to the mounting substrate for the semiconductor light-emitting element such as the LED, the manufacturing method thereof, the module, and the illumination device.

[Reference Signs List]

| | |
|---|---|
| 1: | globe |
| 2, 3211: | base |
| 2a: | hollow part |
| 2b, 2c, 62b: | threaded part |
| 3: | heat sink |
| 3a: | first opening |
| 3b: | second opening |
| 4, 4a, 4b, 4c: | LED module |
| 4d: | fastener |
| 5: | light source attaching member |
| 5a: | recess |
| 6: | resin case |
| 7: | power source circuit |
| 8: | insulating ring |
| 10, 10a, 10b, 10c, 3210: | LED lamp |
| 61: | first case |
| 61a, 62a: | opening |
| 62: | second case |
| 63: | resin cap |
| 63a: | protrusion |
| 63b: | through hole |
| 71: | circuit element group |
| 71a: | first capacitative element |
| 71b: | second capacitative element |
| 71c: | resistive element |
| 71d: | voltage converting element |
| 71e: | semiconductor element |
| 72: | circuit substrate |
| 72a: | notch |
| 73a, 73b, 104: | electrode |
| 101, 101a, 101b, 101c, 2210: | mounting substrate |
| 102: | LED chip |
| 102a: | first electrode |
| 102b: | second electrode |
| 103: | sealing member |
| 105: | terminal |
| 106, 116, 812, 2120: | reflective film |
| 107: | wire |
| 108, 2110: | substrate |
| 108a: | front surface |
| 108b, 2110b: | back surface |
| 412, 512, 612, 712: | multilayer reflective film |
| 413, 513: | first reflective film |
| 413a, 414a, 2120a, 812a: | light reflecting microparticle |
| 413b, 414b, 2120b, 812b: | glass frit |
| 413h, 414h, 812h, 2120h: | hole |
| 414: | second reflective film |
| 514, 714: | protective film |
| 614: | indirect layer |
| 3200: | illumination fixture |
| 3220: | lighting fixture |
| 3221: | fixture body |
| 3221a: | socket |
| 3222: | lamp cover |
| 3300: | ceiling |

The invention claimed is:

1. A mounting substrate on which a semiconductor light-emitting element is to be mounted, the mounting substrate comprising:
   a substrate that has a front surface on which the semiconductor light-emitting element is to be mounted and transmits light from the semiconductor light-emitting element;
   a wiring pattern on the front surface of the substrate; and
   a first reflective film on a back surface of the substrate,
   wherein the first reflective film is a multilayer film,
   the multilayer film includes a first film and a second film, the first film reflecting the light, which is emitted from the semiconductor light-emitting element and is transmitted through the substrate, toward the front surface of the substrate and the second film being on the first film on an opposite side to the substrate,
   the first film includes metal oxide microparticles that reflect the light from the semiconductor light-emitting element and a first glass frit,
   the second film includes a second glass frit, and
   a second volume concentration of the second glass frit in the second film is larger than a first volume concentration of the first glass frit in the first film.

2. The mounting substrate according to claim 1, wherein the first reflective film has a thickness in a range of 10 μm to 100 μm.

3. The mounting substrate according to claim 1, wherein the substrate has a transmittance for the light from the semiconductor light-emitting element of at least 1%.

4. The mounting substrate according to claim 1, further comprising:
   a second reflective film on an end surface of the substrate, the second reflective film reflecting the light, which is emitted from the semiconductor light-emitting element and is transmitted through the substrate, toward the front surface of the substrate,
   wherein the second reflective film includes the metal oxide microparticles and the first glass frit.

5. The mounting substrate according to claim 4, wherein the substrate includes an inclined surface on the end surface, the inclined surface being inclined so as to expand from the back surface toward the front surface.

6. The mounting substrate according to claim 1, wherein the substrate has irregularities on the front surface except for regions where the semiconductor light-emitting element is to be mounted and where an electrode is disposed.

7. The mounting substrate according to claim 1, wherein the first reflective film is on an entirety of the back surface of the substrate.

8. The mounting substrate according to claim 1, wherein the substrate is one of a resin substrate, a glass substrate, and a ceramic substrate.

9. The mounting substrate according to claim 1, wherein the second film further includes the metal oxide microparticles, and
   the second volume concentration of the second glass frit in the second film is at least 20%.

10. The mounting substrate according to claim 1, wherein the first volume concentration of the first glass frit in the first film is less than 20%.

11. The mounting substrate according to claim 1, wherein the second film consists of only the second glass frit.

12. The mounting substrate according to claim 1, wherein the multilayer film further includes a third film consisting of only a third glass frit, and
    the third film is between the substrate and the first film.

13. The mounting substrate according to claim 1, wherein the multilayer film further includes a third film consisting of only a third glass frit, and
    the third film is on an opposite side of the second film to the first film.

14. The mounting substrate according to claim 1, wherein the front surface of the substrate includes a plated electrode.

15. The mounting substrate according to claim 1, wherein the first glass frit includes $SiO_2$-$B_2O_3$-$R_2O$, and $R_2O$ is one of $Li_2O$, $Na_2O$, and $K_2O$.

16. The mounting substrate according to claim 1, wherein the substrate is a ceramic substrate.

17. The mounting substrate according to claim 1,
wherein the metal oxide microparticles include one of titanium oxide, aluminum oxide, zinc oxide, zirconium oxide, and magnesium oxide.

18. A manufacturing method of a mounting substrate on which a semiconductor light-emitting element is to be mounted, the method comprising:
forming a reflective film on a back surface of a substrate that includes a front surface on which the semiconductor light-emitting element is to be mounted and transmits light from the semiconductor light-emitting element; and
forming an electrode on the front surface of the substrate,
wherein the forming of the reflective film includes:
forming a first film that includes metal oxide microparticles and a glass frit and reflects the light, which is emitted from the semiconductor light-emitting element and is transmitted through the substrate, toward the front surface of the substrate, by applying a first paste obtained by kneading first materials containing the metal oxide microparticles that reflect the light from the semiconductor light-emitting element and glass powders to the back surface of the substrate and then, heating the first paste; and
forming a second film including the glass frit by applying a second paste obtained by kneading second materials containing the glass powders to a surface of the first film on an opposite side to the substrate and then, heating the second paste, and
a second volume concentration of the glass frit in the second film is larger than a first volume concentration of the glass frit in the first film.

19. The mounting substrate manufacturing method according to claim 18, further comprising:
plating the electrode.

20. A light-emitting module, comprising:
a mounting substrate including a substrate and a reflective film on a back surface of the substrate;
a wiring pattern on the front surface of the substrate; and
a semiconductor light-emitting element on a front surface of the substrate,
wherein the substrate transmits light from the semiconductor light-emitting element,
the reflective film is a multilayer film,
the multilayer film includes a first film that reflects the light, which is emitted from the semiconductor light-emitting element and is transmitted through the substrate, toward the front surface of the substrate and a second film on the first film on an opposite side to the substrate,
the first film includes metal oxide microparticles that reflect the light from the semiconductor light-emitting element and a first glass frit,
the second film includes a second glass frit, and
a second volume concentration of the second glass frit in the second film is larger than a first volume concentration of the first glass frit in the first film.

21. The light-emitting module according to claim 20, further comprising:
a sealing member on the front surface of the substrate, the sealing member sealing the semiconductor light-emitting element,
wherein the sealing member and the substrate have a substantially same refraction index.

22. The light-emitting module according to claim 20, further comprising:
an electrode on the front surface of the substrate, the electrode being electrically connected to the semiconductor light-emitting element,
wherein the electrode is a transparent conductive film.

23. An illumination device comprising the light-emitting according to claim 20.

* * * * *